United States Patent
Yamazaki et al.

(10) Patent No.: US 10,930,792 B2
(45) Date of Patent: Feb. 23, 2021

(54) SEMICONDUCTOR DEVICE AND MANUFACTURING METHOD THEREOF

(71) Applicant: Semiconductor Energy Laboratory Co., Ltd., Atsugi (JP)

(72) Inventors: Shunpei Yamazaki, Setagaya (JP); Hidekazu Miyairi, Isehara (JP); Akiharu Miyanaga, Hadano (JP); Kengo Akimoto, Atsugi (JP); Kojiro Shiraishi, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/783,577

(22) Filed: Feb. 6, 2020

(65) Prior Publication Data

US 2020/0176606 A1    Jun. 4, 2020

Related U.S. Application Data

(63) Continuation of application No. 15/584,264, filed on May 2, 2017, now Pat. No. 10,559,695, which is a (Continued)

(30) Foreign Application Priority Data

Jul. 31, 2008    (JP) ................. 2008-197137

(51) Int. Cl.
*H01L 29/786* (2006.01)
*H01L 29/423* (2006.01)
(Continued)

(52) U.S. Cl.
CPC .... *H01L 29/7869* (2013.01); *H01L 29/42384* (2013.01); *H01L 29/66969* (2013.01); *H01L 29/78618* (2013.01); *H01L 27/1225* (2013.01)

(58) Field of Classification Search
None
See application file for complete search history.

(56) References Cited

U.S. PATENT DOCUMENTS 5,313,075 A * 5/1994 Zhang ................. H01L 27/1214
257/57
5,468,521 A   11/1995 Kanai et al.
(Continued)

FOREIGN PATENT DOCUMENTS

CN    001525542 A    9/2004
CN    001703772 A    11/2005
(Continued)

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

(Continued)

*Primary Examiner* — Stephen W Smoot
*Assistant Examiner* — Sun Mi Kim King
(74) *Attorney, Agent, or Firm* — Robinson Intellectual Property Law Office; Eric J. Robinson

(57) ABSTRACT

To offer a semiconductor device including a thin film transistor having excellent characteristics and high reliability and a method for manufacturing the semiconductor device without variation. The summary is to include an inverted-staggered (bottom-gate structure) thin film transistor in which an oxide semiconductor film containing In, Ga, and Zn is used for a semiconductor layer and a buffer layer is provided between the semiconductor layer and source and drain electrode layers. An ohmic contact is formed by intentionally providing a buffer layer containing In, Ga, and Zn and having a higher carrier concentration than the (Continued)

semiconductor layer between the semiconductor layer and the source and drain electrode layers.

15 Claims, 29 Drawing Sheets

Related U.S. Application Data continuation of application No. 12/511,252, filed on Jul. 29, 2009, now Pat. No. 9,666,719.

(51) Int. Cl.
*H01L 29/66* (2006.01)
*H01L 27/12* (2006.01)

(56) References Cited

U.S. PATENT DOCUMENTS

| | | |
|---|---|---|
| 5,470,768 A | 11/1995 | Yanai et al. |
| 5,731,856 A | 3/1998 | Kim et al. |
| 5,744,864 A | 4/1998 | Cillessen et al. |
| 5,847,410 A | 12/1998 | Nakajima |
| 6,255,706 B1 | 7/2001 | Watanabe et al. |
| 6,294,274 B1 | 9/2001 | Kawazoe et al. |
| 6,323,917 B1 | 11/2001 | Fujikawa et al. |
| 6,445,428 B1 | 9/2002 | Fujikawa et al. |
| 6,529,397 B2 | 3/2003 | Takeda et al. |
| 6,563,174 B2 | 5/2003 | Kawasaki et al. |
| 6,576,061 B1 | 6/2003 | Moriyama et al. |
| 6,586,346 B1 | 7/2003 | Yamazaki et al. |
| 6,680,242 B2 | 1/2004 | Ohtsu et al. |
| 6,704,069 B2 | 3/2004 | Misaki |
| 6,727,522 B1 | 4/2004 | Kawasaki et al. |
| 6,744,479 B2 | 6/2004 | Hasegawa |
| 6,794,682 B2 | 9/2004 | Watanabe et al. |
| 6,858,308 B2 | 2/2005 | Kondo et al. |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,067,843 B2 | 6/2006 | Carcia et al. |
| 7,105,868 B2 | 9/2006 | Nause et al. |
| 7,145,174 B2 | 12/2006 | Chiang et al. |
| 7,211,825 B2 | 5/2007 | Shih et al. |
| 7,227,224 B2 | 6/2007 | Ko et al. |
| 7,253,041 B2 | 8/2007 | Gan et al. |
| 7,262,463 B2 | 8/2007 | Hoffman |
| 7,282,782 B2 | 10/2007 | Hoffman et al. |
| 7,297,977 B2 | 11/2007 | Hoffman et al. |
| 7,298,084 B2 | 11/2007 | Baude et al. |
| 7,301,211 B2 | 11/2007 | Yamazaki et al. |
| 7,323,356 B2 | 1/2008 | Hosono et al. |
| 7,339,187 B2 | 3/2008 | Wager, III et al. |
| 7,359,009 B2 | 4/2008 | Lai |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,470,607 B2 | 12/2008 | Carcia et al. |
| 7,501,293 B2 | 3/2009 | Ito et al. |
| 7,501,305 B2 | 3/2009 | Takai et al. |
| 7,507,618 B2 | 3/2009 | Dunbar |
| 7,544,967 B2 | 6/2009 | Kim et al. |
| 7,566,904 B2 | 7/2009 | Ishii |
| 7,569,456 B2 | 8/2009 | Ko et al. |
| 7,575,966 B2 | 8/2009 | Lai et al. |
| 7,576,394 B2 | 8/2009 | Furuta et al. |
| 7,592,207 B2 | 9/2009 | Nakamura et al. |
| 7,601,984 B2 | 10/2009 | Sano et al. |
| 7,608,531 B2 | 10/2009 | Isa et al. |
| 7,622,371 B2 | 11/2009 | Pan et al. |
| 7,629,208 B2 | 12/2009 | Arai et al. |
| 7,635,889 B2 | 12/2009 | Isa et al. |
| 7,645,478 B2 | 1/2010 | Thelss et al. |
| 7,663,302 B2 | 2/2010 | Shin et al. |
| 7,674,650 B2 | 3/2010 | Akimoto et al. |
| 7,691,666 B2 | 4/2010 | Levy et al. |
| 7,691,715 B2 | 4/2010 | Kaji et al. |
| 7,732,251 B2 | 6/2010 | Hoffman et al. |
| 7,732,819 B2 | 6/2010 | Akimoto et al. |
| 7,733,015 B2 | 6/2010 | Saito |
| 7,767,106 B2 | 8/2010 | Chang |
| 7,772,021 B2 | 8/2010 | Lee et al. |
| 7,791,072 B2 | 9/2010 | Kumomi et al. |
| 7,791,082 B2 | 9/2010 | Iwasaki |
| 7,795,613 B2 | 9/2010 | Ito et al. |
| 7,829,444 B2 | 11/2010 | Yabuta et al. |
| 7,863,611 B2 | 1/2011 | Abe et al. |
| 7,867,636 B2 | 1/2011 | Nakagawara et al. |
| 7,868,326 B2 | 1/2011 | Sano et al. |
| 7,872,259 B2 | 1/2011 | Den et al. |
| 7,883,934 B2 | 2/2011 | Kaji et al. |
| 7,884,360 B2 | 2/2011 | Takechi et al. |
| 7,893,431 B2 | 2/2011 | Kim et al. |
| 7,906,777 B2 | 3/2011 | Yano et al. |
| 7,910,920 B2 | 3/2011 | Park et al. |
| 7,923,723 B2 | 4/2011 | Hayashi et al. |
| 7,947,539 B2 | 5/2011 | You |
| 8,063,421 B2 | 11/2011 | Kang et al. |
| 8,101,467 B2 | 1/2012 | Yamazaki et al. |
| 8,143,115 B2 | 3/2012 | Omura et al. |
| 8,148,721 B2 | 4/2012 | Hayashi et al. |
| 8,237,166 B2 | 8/2012 | Kumomi et al. |
| 8,324,018 B2 | 12/2012 | Isa et al. |
| 8,384,077 B2 | 2/2013 | Yano et al. |
| 8,421,070 B2 | 4/2013 | Kim et al. |
| 8,497,507 B2 | 7/2013 | Yang |
| 8,629,442 B2 | 1/2014 | Yamazaki et al. |
| 8,735,229 B2 | 5/2014 | Son et al. |
| 8,735,882 B2 | 5/2014 | Kim et al. |
| 8,981,369 B2 | 3/2015 | Yano et al. |
| 8,987,068 B2 | 3/2015 | Yamazaki et al. |
| 9,130,049 B2 | 9/2015 | Sano et al. |
| 9,583,637 B2 | 2/2017 | Sano et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0146871 A1 | 10/2002 | Watanabe et al. |
| 2002/0160554 A1 | 10/2002 | Isobe et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0263757 A1 | 12/2004 | Kwon |
| 2005/0017302 A1 | 1/2005 | Hoffman |
| 2005/0020006 A1 | 1/2005 | Zhang et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0043447 A1 | 3/2006 | Ishii et al. |
| 2006/0091793 A1 | 5/2006 | Baude et al. |
| 2006/0108529 A1 | 5/2006 | Saito et al. |
| 2006/0108636 A1* | 5/2006 | Sano ............... H01L 21/428 257/347 |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0183274 A1 | 8/2006 | Carcia et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |

(56) References Cited

U.S. PATENT DOCUMENTS

| | | |
|---|---|---|
| 2007/0024187 A1 | 2/2007 | Shin et al. |
| 2007/0046191 A1 | 3/2007 | Saito |
| 2007/0051952 A1* | 3/2007 | Yamazaki ............ G02F 1/1368 257/59 |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0164354 A1 | 7/2007 | Ko et al. |
| 2007/0164373 A1 | 7/2007 | Ko et al. |
| 2007/0170434 A1 | 7/2007 | Inoue et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252147 A1 | 11/2007 | Kim et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0044982 A1 | 2/2008 | You |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0099853 A1 | 5/2008 | Yang et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0251785 A1 | 10/2008 | Noh et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1* | 10/2008 | Park .................. H01L 29/78618 257/43 |
| 2008/0258143 A1 | 10/2008 | Kim et al. |
| 2008/0283831 A1 | 11/2008 | Ryu et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2009/0294808 A1 | 12/2009 | Ito |
| 2010/0025675 A1 | 2/2010 | Yamazaki et al. |
| 2010/0025677 A1 | 2/2010 | Yamazaki et al. |
| 2010/0025678 A1 | 2/2010 | Yamazaki et al. |
| 2010/0025679 A1 | 2/2010 | Yamazaki et al. |
| 2010/0051936 A1 | 3/2010 | Hayashi et al. |
| 2010/0065837 A1 | 3/2010 | Omura et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0115763 A1 | 5/2011 | Yamazaki et al. |
| 2012/0168750 A1 | 7/2012 | Hayashi et al. |

FOREIGN PATENT DOCUMENTS

| | | |
|---|---|---|
| CN | 001875488 A | 12/2006 |
| CN | 001941299 A | 4/2007 |
| EP | 1158529 A | 11/2001 |
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2453480 A | 5/2012 |
| EP | 2453481 A | 5/2012 |
| EP | 2455975 A | 5/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-091467 A | 4/1989 |
| JP | 02-164042 A | 6/1990 |
| JP | 03-231472 A | 10/1991 |
| JP | 05-251705 A | 9/1993 |
| JP | 08-264794 A | 10/1996 |
| JP | 09-270517 A | 10/1997 |
| JP | 11-505377 | 5/1999 |
| JP | 11-340462 A | 12/1999 |
| JP | 2000-044236 A | 2/2000 |
| JP | 2000-150900 A | 5/2000 |
| JP | 2002-076356 A | 3/2002 |
| JP | 2002-158218 A | 5/2002 |
| JP | 2002-289859 A | 10/2002 |
| JP | 2002-368229 A | 12/2002 |
| JP | 2003-037268 A | 2/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-285890 A | 10/2005 |
| JP | 2006-165528 A | 6/2006 |
| JP | 2006-165529 A | 6/2006 |
| JP | 2006-237586 A | 9/2006 |
| JP | 2007-073699 A | 3/2007 |
| JP | 2007-073976 A | 3/2007 |
| JP | 2007-096055 A | 4/2007 |
| JP | 2007-123861 A | 5/2007 |
| JP | 2007-142196 A | 6/2007 |
| JP | 2007-150158 A | 6/2007 |
| JP | 2007-250982 A | 9/2007 |
| JP | 2007-250983 A | 9/2007 |
| JP | 2007-258223 A | 10/2007 |
| JP | 2007-294951 A | 11/2007 |
| JP | 2008-060419 A | 3/2008 |
| JP | 2008-098447 A | 4/2008 |
| JP | 2008-166716 A | 7/2008 |
| JP | 2008-166789 A | 7/2008 |
| JP | 2008-219008 A | 9/2008 |
| JP | 2009-135380 A | 6/2009 |
| JP | 2009-533884 | 9/2009 |
| KR | 93-005546 | 6/1993 |
| KR | 10-0449849 | 9/2004 |
| KR | 10-0704252 | 4/2007 |
| KR | 2008-0023475 A | 3/2008 |
| KR | 2008-0064342 A | 7/2008 |
| WO | WO-2004/034449 | 4/2004 |
| WO | WO-2004/114391 | 12/2004 |
| WO | WO-2005/041311 | 5/2005 |
| WO | WO-2006/051993 | 5/2006 |
| WO | WO-2007/108293 | 9/2007 |
| WO | WO-2007/119386 | 10/2007 |
| WO | WO-2007/120010 | 10/2007 |
| WO | WO-2008/069056 | 6/2008 |

(56) References Cited

FOREIGN PATENT DOCUMENTS

| WO | WO-2008/069255 | 6/2008 |
|---|---|---|
| WO | WO-2009/075281 | 6/2009 |

OTHER PUBLICATIONS

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-in. AMOLED Display With Driver Circuit Using Amorphous In—Ga—Zn-Oxide TFTS", IDW '09 : Proceedings of the 16th International Display Workshops, 2009, pp. 689-692.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 in. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kimizuka.N et al., "SPINEL, YBFe2O4, and YB2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

(56) References Cited

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters), 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Korean Office Action (Application No. 2011-0012691) dated Sep. 26, 2011.
Na.J et al., "High field-effect mobility amorphous InGaZnO transistors with aluminum electrodes", Appl. Phys. Lett. (Applied Physics Letters), 2008, vol. 93, No. 6, pp. 063501-1-063501-3.
Chinese Office Action (Application No. 200910160557.0) dated Nov. 13, 2012.
Chinese Office Action (Application No. 201410105088.3) dated Dec. 22, 2015.

\* cited by examiner

FIG. 3A1
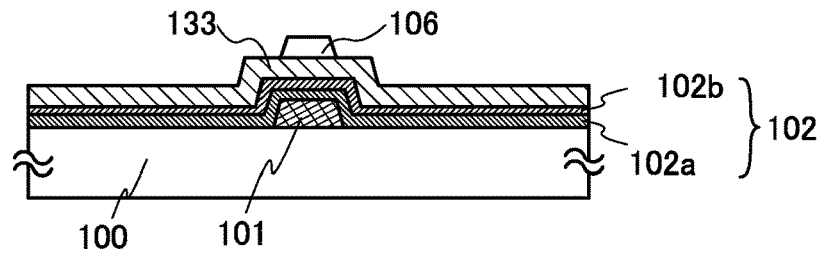
FIG. 3A2
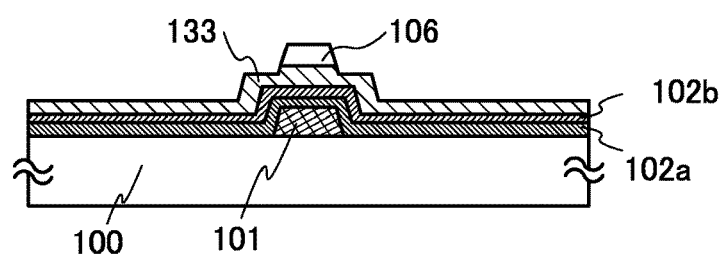
FIG. 3B
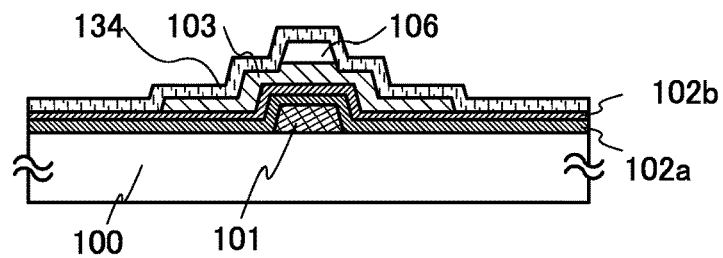
FIG. 3C
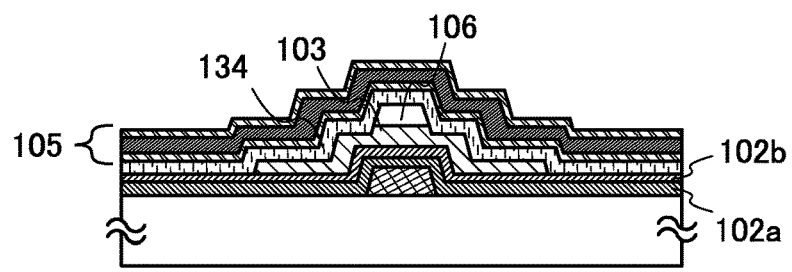
FIG. 3D
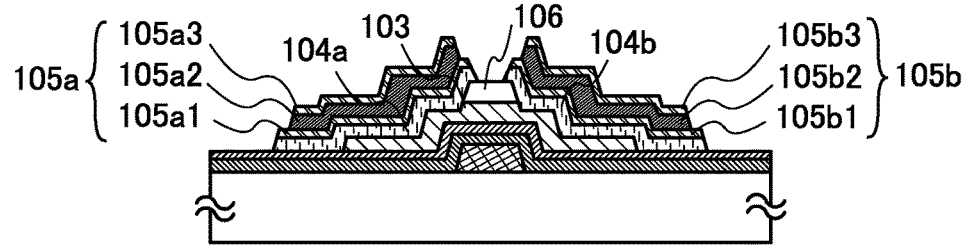

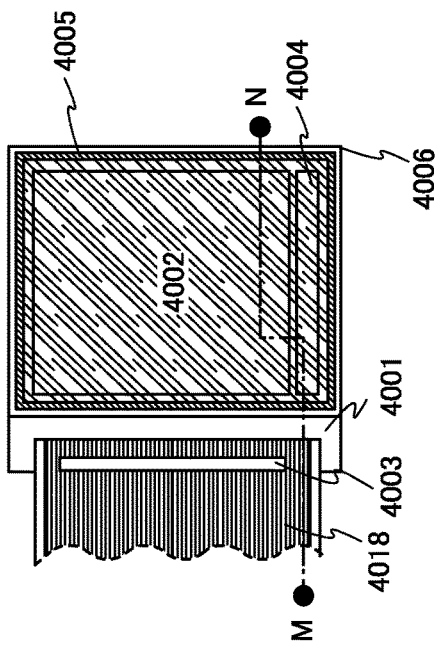
FIG. 22A1
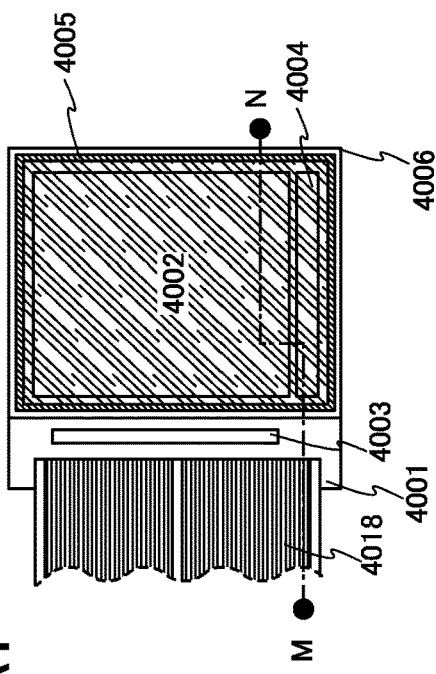
FIG. 22A2
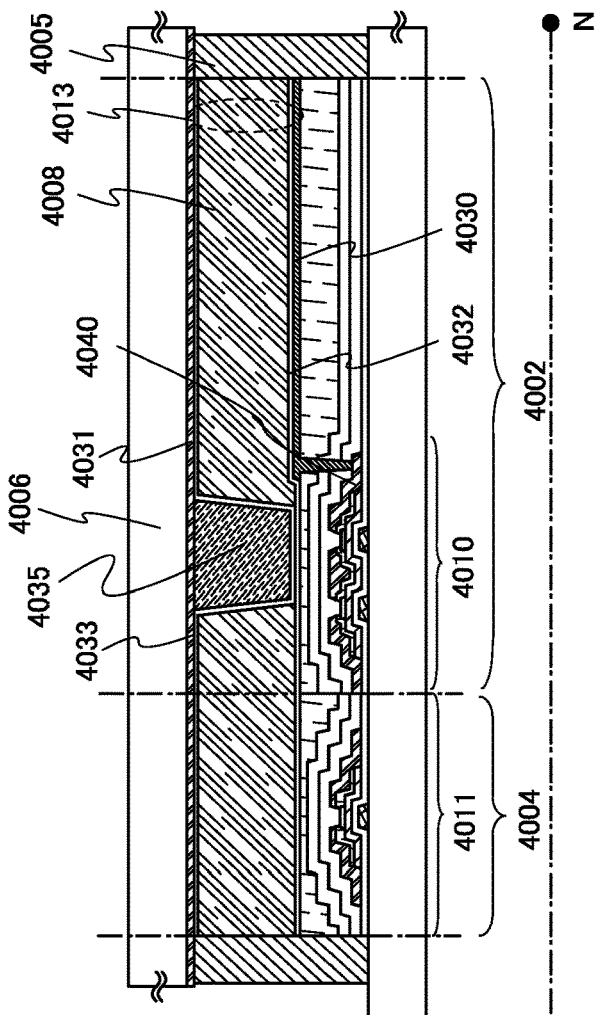
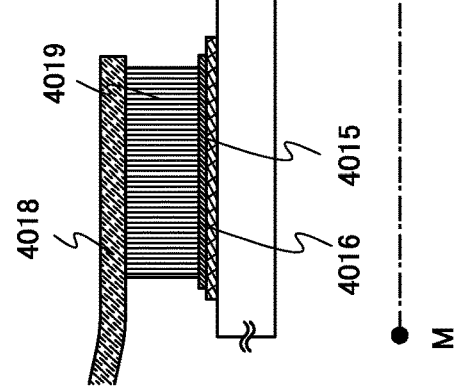
FIG. 22B

SEMICONDUCTOR DEVICE AND MANUFACTURING METHOD THEREOF

BACKGROUND OF THE INVENTION

1. Field of the Invention

The present invention relates to a semiconductor device having a circuit including a thin film transistor (hereinafter referred to as a TFT) using an oxide semiconductor film for a channel formation region and a method for manufacturing the semiconductor device. For example, the present invention relates to an electronic appliance mounted with an electro-optic device typified by a liquid crystal display panel or a light-emitting display device having an organic light-emitting element as a component.

Note that the semiconductor devices in this specification refer to all the devices which can operate by using semiconductor characteristics, and an electro-optic device, a semiconductor circuit, and an electronic appliance are all included in the semiconductor devices.

2. Description of the Related Art

In recent years, active matrix display devices (such as liquid crystal display devices, light-emitting display devices, and electrophoretic display devices) in each of which a switching element including a thin film transistor (TFT) is provided in each of display pixels arranged in matrix have been actively developed. An active matrix display device is advantageous because a switching element is provided in each pixel (or each dot) and thus lower voltage driving is possible as compared to a passive matrix display device in the case where pixel density is increased.

In addition, a technique applied to an electronic device or an optical device, in which a thin film transistor (TFT) or the like is formed using an oxide semiconductor film for a channel formation region, has attracted attention. As an oxide semiconductor film, a TFT using ZnO and a TFT using $InGaO_3(ZnO)_m$ are given for example. Patent Documents 1 and 2 and the like disclose a technique applied to a switching element or the like of an image display device, in which a TFT formed using such an oxide semiconductor film is formed over a substrate having a light-transmitting property.

REFERENCES

[Patent Document 1] Japanese Published Patent Application No. 2007-123861
[Patent Document 2] Japanese Published Patent Application No. 2007-96055

SUMMARY OF THE INVENTION

A thin film transistor using an oxide semiconductor film for a channel formation region is required to operate rapidly, be manufactured through a relatively simple process, and be sufficiently reliable.

In forming a thin film transistor, a metal material having low resistance is used for source and drain electrode layers. In particular, in the case of manufacturing display devices performing large-area display, the problem of signal delay due to wiring resistance becomes significant. Therefore, a metal material having low electric resistance is desirably used as a material of a wiring or an electrode. On the other hand, in the case of the thin film transistor structure in which an oxide semiconductor film is directly in contact with source and drain electrode layers formed using a metal material having low electric resistance, contact resistance might be high. As one of factors causing high contact resistance, the following condition is given: Schottky junction is formed at the interface between the oxide semiconductor film and the source and drain electrode layers.

In addition, capacitance is caused in a portion where the oxide semiconductor film and the source and drain electrode layers are directly in contact with each other, and frequency characteristics (referred to as f characteristics) are low, which might hinder rapid operation of the thin film transistor.

An object of an embodiment of the present invention is to provide a thin film transistor using an oxide semiconductor film containing indium (In), gallium (Ga), and zinc (Zn), in which contact resistance between an oxide semiconductor layer and source and drain electrode layers is reduced, and a method for manufacturing the thin film transistor.

An object is to improve operation characteristics and reliability of a thin film transistor using an oxide semiconductor film containing In, Ga, and Zn.

An object is to reduce variations in electric characteristics of thin film transistors each using an oxide semiconductor film containing In, Ga, and Zn. In particular, in a liquid crystal display device, in the case where there are large variations between elements, display unevenness due to variations in TFT characteristics might be caused.

Also in a display device having a light-emitting element, in the case where variations in on current (Ion) of TFTs (TFTs each provided in a driver circuit or TFTs each provided in a pixel and supplying a current to a light-emitting element) arranged so that a certain current flows to pixel electrodes are large, luminance of a display screen might be varied. As described above, an object of an embodiment of the present invention is to achieve at least one of the above objects.

The summary of an embodiment of the present invention is that an inverted-staggered (bottom-gate) thin film transistor is included in which an oxide semiconductor layer containing In, Ga, and Zn is used as a semiconductor layer and a buffer layer is provided between the semiconductor layer and source and drain electrode layers.

In this specification, a semiconductor layer formed using an oxide semiconductor film containing In, Ga, and Zn is also referred to as an "IGZO semiconductor layer".

An ohmic contact of an IGZO semiconductor layer and source electrode layers is necessary and the contact resistance therebetween is desirably as low as possible. Similarly, an ohmic contact of the IGZO semiconductor layer and a drain electrode layer is necessary and the contact resistance therebetween is desirably as low as possible.

Therefore, an ohmic contact is formed by intentionally providing a buffer layer having a higher carrier concentration than the IGZO semiconductor layer between the IGZO semiconductor layer and the source and drain electrode layers.

For the buffer layer, an oxide semiconductor film having n-type conductivity and containing In, Ga, and Zn is used. An impurity element imparting n-type conductivity may be included in the buffer layer. As the impurity element, for example, magnesium, aluminum, titanium, scandium, yttrium, zirconium, hafnium, boron, thallium, germanium, tin, lead, or the like can be used. In the case where magnesium, aluminum, titanium, or the like is contained in the buffer layer, there is an effect of blocking oxygen, and the like, so that the oxygen concentration of a semiconductor layer can be maintained within an optimal range by heat treatment or the like after film formation.

The buffer layer functions as an n$^+$ layer and can also be referred to as a drain region or a source region.

A semiconductor device according to an embodiment of the present invention includes a thin film transistor including a gate electrode; a gate insulating film covering the gate electrode; an IGZO semiconductor layer over the gate electrode with the gate insulating film interposed therebetween; a channel protective layer in a region overlapping with a channel formation region of the IGZO semiconductor layer; source and drain electrode layers over the IGZO semiconductor layer; and a buffer layer between the semiconductor layer and the source and drain electrode layers. The carrier concentration of the buffer layer is higher than that of the IGZO semiconductor layer. The IGZO semiconductor layer is electrically connected to the source and drain electrode layers through the buffer layer.

In the above structure, a second buffer layer having a carrier concentration higher than that of the semiconductor layer and lower than that of the buffer layer may be provided between the semiconductor layer and the buffer layer. The second buffer layer functions as an n$^-$ layer.

The oxide semiconductor film (IGZO film) containing In, Ga, and Zn has such a characteristic that the increase in carrier concentration leads to increase in hole mobility. Thus, the relation between a carrier concentration and hole mobility of the oxide semiconductor film containing In, Ga, and Zn is as shown in FIG. 29. In an embodiment of the present invention, the carrier concentration of the IGZO film suitable for a channel of the semiconductor layer is preferably less than $1 \times 10^{17}$ atoms/cm$^3$ (more preferably $1 \times 10^{11}$ atoms/cm$^3$ or more) (channel concentration range 1), and the carrier concentration of the IGZO film suitable for the buffer layer is preferably $1 \times 10^{18}$ atoms/cm$^3$ or more (more preferably $1 \times 10^{22}$ atoms/cm$^3$ or less) (buffer layer concentration range 2). The above carrier concentration of the IGZO film is a value in the state where the temperature is room temperature and source, drain, and gate voltages are not applied, in the case where the IGZO film is used for the semiconductor layer.

When the carrier concentration of the IGZO film for the channel exceeds the above range (the channel concentration range 1), the thin film transistor might be normally on.

Note that the carrier concentration and the hole mobility of the IGZO film can be measured by Hall effect measurement. As an example of an equipment used for Hall effect measurement, the specific resistance/Hall measuring system ResiTest 8310 (manufactured by TOYO Corporation) can be given. With the specific resistance/Hall measuring system ResiTest 8310, the direction and strength of a magnetic field are changed in a certain cycle and in synchronization therewith, only a Hall electromotive voltage caused in a sample is detected, so that AC (alternate current) Hall measurement can be performed. Even in the case of a material with low mobility and high resistivity, a Hall electromotive voltage can be detected.

In the above structure, the source and drain electrode layers preferably contain titanium. For example, a multilayer film of a titanium film, an aluminum film, and a titanium film has low resistance and hillocks are unlikely to be generated in the aluminum film.

The thin film transistor according to an embodiment of the present invention is provided with a channel protective layer; therefore, a region on a side reverse of the side of a surface of an IGZO semiconductor layer in contact with a gate insulating film, a so-called back channel, can be protected from damages (such as reduction in film thickness due to plasma or an etchant at the time of etching and oxidation) in the process. Thus, reliability of a semiconductor device can be improved.

A method for manufacturing a semiconductor device, according to an embodiment of the present invention, includes a step of forming a gate electrode layer over a substrate; a step of forming a gate insulating film over the gate electrode layer; a step of forming an IGZO semiconductor layer over the gate insulating film; a step of forming a channel protective layer over the IGZO semiconductor layer and in a region overlapping with a channel formation region; a step of forming a pair of buffer layers having n-type conductivity over the IGZO semiconductor layer; and a step of forming source and drain electrode layers over the buffer layers. The pair of buffer layers having n-type conductivity are formed using an oxide semiconductor layer containing In, Ga, and Zn. The carrier concentration of the buffer layers is higher than that of the IGZO semiconductor layer. The IGZO semiconductor layer and the source and drain electrode layers are electrically connected to each other through the buffer layers.

Further, by successively forming the gate insulating film, the semiconductor film, and the channel protective layer without exposing them to the air, productivity can be increased and in addition, interfaces of the stacked films can be formed without being contaminated by an atmospheric component such as water vapor and impurity elements and dusts floating in the air. Thus, variations in thin film transistor characteristics can be reduced.

In other words, by successively forming the gate insulating film, the oxide semiconductor film containing In, Ga, and Zn to be the semiconductor film, and the insulating film to be the channel protective layer without exposing them to the air, productivity can be increased and in addition, interfaces of the stacked films can be formed without being contaminated by an atmospheric component such as water vapor and impurity elements and dusts floating in the air. Thus, variations in thin film transistor characteristics can be reduced.

Successive film formation in this specification means that a series of steps from a first film formation step by a sputtering method to a second film formation step by a sputtering method are performed by controlling an atmosphere in which a process substrate is provided so that it is constantly in vacuum or an inert gas atmosphere (a nitrogen atmosphere or a rare gas atmosphere) without being exposed to a contaminated atmosphere such as the air. By the successive film formation, film formation can be performed without reattachment of moisture or the like to the process substrate, which has been cleaned.

Performing the series of steps from the first film formation step to the second film formation step in the same chamber is in the range of the successive film formation in this specification.

Further, performing the series of steps from the first film formation step to the second film formation step in different chambers, in which after the first film formation step is completed, a substrate is transferred between the chambers without being exposed to the air and the second film formation is performed, is also in the range of the successive film formation in this specification.

Note that the case where there is a substrate transfer step, an alignment step, a slow cooling step, a step of heating or cooling a substrate so that the temperature of the substrate is suitable to the second film formation step, or the like between the first film formation step and the second film formation step is also in the range of the successive film formation in this specification.

However, the case where there is a step in which liquid is used, such as a cleaning step, wet etching, or resist formation, between the first film formation step and the second film formation step is not in the range of the successive film formation in this specification.

Further, by forming the gate insulating film, the semiconductor layer, and the channel protective layer in an oxygen atmosphere (or an atmosphere containing oxygen at 90% or more and a rare gas (such as argon) at 10% or less), reduction in reliability due to deterioration, a shift of thin film transistor characteristics to the normally-on side, and the like can be suppressed. Further, the buffer layer having n-type conductivity is preferably formed in a rare gas (such as argon) atmosphere.

A method for manufacturing a semiconductor device, according to an embodiment of the present invention, includes a step of forming a gate electrode layer over a substrate; a step of forming a gate insulating film over the gate electrode layer; a step of forming an IGZO semiconductor layer over the gate insulating film; a step of forming a channel protective layer over the IGZO semiconductor layer and in a region overlapping with a channel formation region; a step of forming a pair of buffer layers having n-type conductivity over the IGZO semiconductor layer; and a step of forming source and drain electrode layers over the buffer layers. The pair of buffer layers having n-type conductivity are formed using an oxide semiconductor layer containing In, Ga, and Zn. The carrier concentration of the buffer layers is higher than that of the IGZO semiconductor layer. The IGZO semiconductor layer and the source and drain electrode layers are electrically connected to each other through the buffer layers. The gate insulating film, the semiconductor layer, and the channel protective layer are successively formed without being exposed to the air.

A semiconductor device according to an embodiment of the present invention is a thin film transistor including a gate electrode; a gate insulating film covering the gate electrode; a semiconductor layer over the gate electrode with the gate insulating film interposed therebetween; a channel protective layer in a region overlapping with a channel formation region of the semiconductor layer; source and drain electrode layers over the semiconductor layer; and a buffer layer between the semiconductor layer and the source and drain electrode layers. The semiconductor layer and the buffer layer are formed using an oxide semiconductor containing indium, gallium, and zinc. The carrier concentration of the buffer layer is higher than that of the semiconductor layer. The semiconductor layer is electrically connected to the source and drain electrode layers through the buffer layer.

In the semiconductor device, the buffer layer may include n-type impurity.

In the semiconductor device, the carrier concentration of the semiconductor layer may be less than $1 \times 10^{17}$ atoms/cm$^3$, and the carrier concentration of the buffer layer may be $1 \times 10^{18}$ atoms/cm$^3$ or more.

In the semiconductor device, a second buffer layer having a carrier concentration higher than that of the semiconductor layer and lower than that of the buffer layer may be provided between the semiconductor layer and the buffer layer.

In the semiconductor device, the source and drain electrode layers may contain titanium.

A method for manufacturing a semiconductor device, according to an embodiment of the present invention, includes a step of forming a gate electrode layer over a substrate; a step of forming a gate insulating film over the gate electrode layer; a step of forming a semiconductor layer over the gate insulating film; a step of forming a channel protective layer over the semiconductor layer and in a region overlapping with a channel formation region; a step of forming a pair of buffer layers having n-type conductivity over the semiconductor layer; and a step of forming source and drain electrode layers over the buffer layers. The semiconductor layer and the buffer layers having n-type conductivity are formed using an oxide semiconductor layer containing In, Ga, and Zn. The carrier concentration of the buffer layers is higher than that of the semiconductor layer. The semiconductor layer and the source and drain electrode layers are electrically connected to each other through the buffer layers.

A method for manufacturing a semiconductor device, according to an embodiment of the present invention, includes a step of forming a gate electrode layer over a substrate; a step of forming a gate insulating film over the gate electrode layer; a step of forming a semiconductor layer over the gate insulating film; a step of forming a channel protective layer over the semiconductor layer and in a region overlapped with a channel formation region; a step of forming a pair of buffer layers having n-type conductivity over the semiconductor layer; and a step of forming source and drain electrode layers over the buffer layers. The semiconductor layer and the buffer layers are formed using an oxide semiconductor layer containing indium, gallium, and zinc. The carrier concentration of the buffer layers is higher than that of the semiconductor layer. The semiconductor layer and the source and drain electrode layers are electrically connected to each other through the buffer layers. The gate insulating film, the semiconductor layer, and the channel protective layer are successively formed without being exposed to the air.

In the method for manufacturing a semiconductor device, the gate insulating film, the semiconductor layer, and the channel protective layer may be formed by a sputtering method.

In the method for manufacturing a semiconductor device, the gate insulating film, the semiconductor layer, and the channel protective layer may be formed in an oxygen atmosphere.

In the method for manufacturing a semiconductor device, the buffer layer may be formed in a rare gas atmosphere.

In the method for manufacturing a semiconductor device, the carrier concentration of the semiconductor layer may be less than $1 \times 10^{17}$ atoms/cm$^3$, and the carrier concentration of the buffer layer may be $1 \times 10^{18}$ atoms/cm$^3$ or more.

In the method for manufacturing a semiconductor device, the buffer layer may be formed containing magnesium, aluminum, or titanium.

According to an embodiment of the present invention, a thin film transistor having a small amount of photocurrent, low parasitic capacitance, a high on-off ratio, and favorable dynamic characteristics (f characteristics) can be manufactured. Accordingly, a semiconductor device including a thin film transistor having excellent electric characteristics and high reliability can be provided.

BRIEF DESCRIPTION OF THE DRAWINGS

In the accompanying drawings:

FIGS. 3A1-3A2, 3B to 3D are views illustrating a method for manufacturing a semiconductor device, according to an embodiment of the present invention;

FIGS. 22A1, 22A2, and 22B are views each illustrating a liquid crystal display device to which an embodiment of the present invention is applied;

DETAILED DESCRIPTION OF THE INVENTION

Figure 1A:
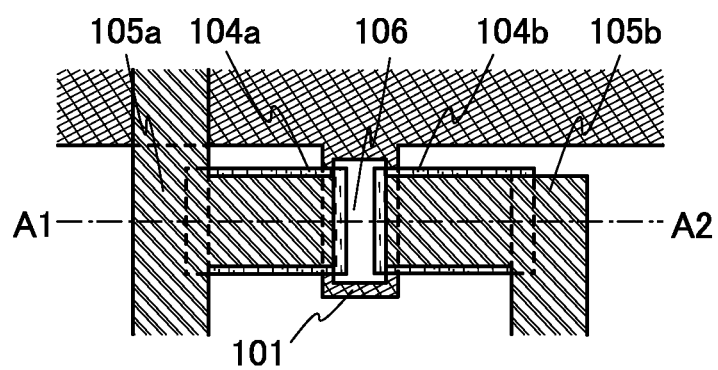
FIGS. 1A and 1B are views illustrating a semiconductor device according to an embodiment of the present invention.

The embodiments of the present invention will be described with reference to the accompanying drawings. However, the present invention is not limited to the following description, and it will be easily understood by those skilled in the art that various changes and modifications can be made to the modes and their details without departing from the spirit and scope of the present invention. Therefore, the present invention should not be construed as being limited to the description in the following embodiments. Note that a common reference numeral refers to the same part or a part having a similar function throughout the drawings in the structure of the present invention described below, and the description thereof is omitted.

Embodiment 1

In this embodiment, a thin film transistor and a manufacturing process thereof will be described with reference to FIGS. 1A and 1B and FIGS. 2A to 2D.

Figure 1B:
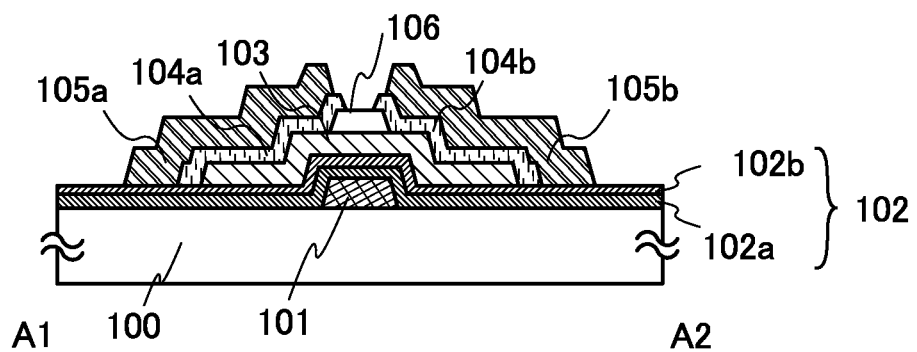

FIGS. 1A and 1B illustrate a thin film transistor having a bottom gate structure according to this embodiment. FIG. 1A is a plan view and FIG. 1B is a cross-sectional view taken along line A1-A2 in FIG. 1A. In the thin film transistor illustrated in FIGS. 1A and 1B, a gate electrode 101 is formed over a substrate 100; a gate insulating film 102 is formed over the gate electrode 101; an amorphous oxide semiconductor layer 103 functioning as a channel formation region is formed over the gate electrode 101 with the gate insulating film 102 interposed therebetween; a channel protective layer 106 is formed in a region overlapping with the channel formation region of the amorphous oxide semiconductor layer 103; buffer layers 104a and 104b are formed over the amorphous oxide semiconductor layer 103; and source and drain electrode layers 105a and 105b are formed in contact with the buffer layers 104a and 104b.

An oxide semiconductor containing In, Ga, and Zn is used for the semiconductor layer 103, and the buffer layers 104a and 104b having a higher carrier concentration than the semiconductor layer 103 are intentionally provided between the semiconductor layer 103 and the source and drain electrode layers 105a and 105b, whereby an ohmic contact is formed.

The buffer layers 104a and 104b are formed by using an oxide semiconductor having n-type conductivity and containing In, Ga, and Zn. An impurity element imparting n-type conductivity may be included in the buffer layer. As the impurity element, for example, magnesium, aluminum, titanium, scandium, yttrium, zirconium, hafnium, boron, thallium, germanium, tin, lead, or the like can be used. In the case where magnesium, aluminum, titanium, or the like is contained in the buffer layer, there is an effect of blocking oxygen and the like, so that the oxygen concentration of the semiconductor layer 103 can be maintained within an optimal range by heat treatment or the like after film formation.

The buffer layers 104a and 104b function as $n^+$ layers and can also be referred to as source and drain regions.

A method for manufacturing the thin film transistor illustrated in FIGS. 1A and 1B is described with reference to FIGS. 2A to 2D. First, the gate electrode 101, the gate insulating film 102, a semiconductor film 133, the channel protective layer 106 are formed over the substrate 100 (see FIG. 2A).

As the substrate 100, any of the following substrates can be used: non-alkaline glass substrates manufactured by a fusion method or a float method, such as a barium borosilicate glass substrate, an aluminoborosilicate glass substrate, an aluminosilicate glass substrate, and the like; ceramic substrates; plastic substrates having heat resistance high enough to withstand a process temperature of this manufacturing process; and the like. Alternatively, a metal substrate of a stainless alloy, which is provided with an insulating film over its surface, may be used. In the case where the substrate 100 is mother glass, the substrate may have any of the following sizes: the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like.

Further, an insulating film may be provided as a base film over the substrate 100. The base film can be formed to have a single-layer structure or a layered structure of a silicon oxide film, a silicon nitride film, a silicon oxynitride film, and/or a silicon nitride oxide film by a CVD method, a sputtering method, or the like.

The gate electrode 101 is formed using a metal material. As the metal material, aluminum, chromium, titanium, tantalum, molybdenum, copper, or the like is applied. A preferred example of the gate electrode is formed using aluminum or a stack of aluminum and barrier metal. As the barrier metal, refractory metal such as titanium, molybdenum, or chromium is applied. The barrier metal is preferably provided for preventing hillocks and oxidation of aluminum.

The gate electrode 101 is formed to a thickness of from 50 to 300 nm. By forming the gate electrode to a thickness of 300 nm or less, disconnection of a semiconductor film and wirings which are formed later can be prevented. Further, by forming the gate electrode to a thickness of 150 nm or more, resistance of the gate electrode can be reduced and thus the size of the substrate can be increased.

Note that since a semiconductor film and a wiring are to be formed over the gate electrode 101, it is desired that the gate electrode 101 be processed to have tapered end portions in order to prevent disconnection. In addition, although not illustrated, in this step, a wiring or a capacitor wiring connected to the gate electrode can also be formed at the same time.

The gate electrode 101 can be formed by using a sputtering method, a CVD method, a plating method, a printing method, or a conductive nanopaste of silver, gold, copper, or the like. Alternatively, the gate electrode 101 can be formed by discharging droplets containing conductive particles or the like by an ink-jet method and baking it.

Figure 2A:
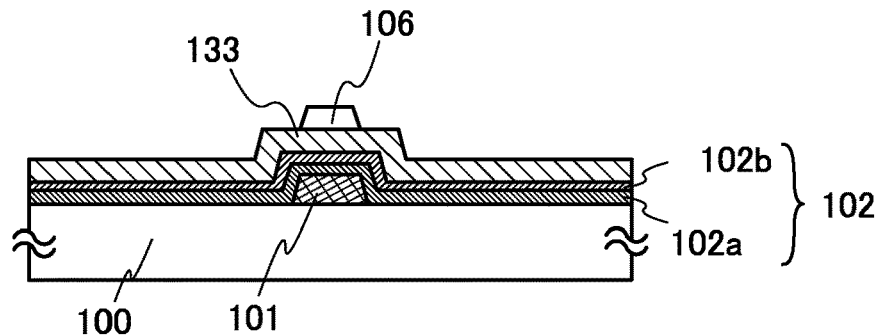
FIGS. 2A to 2D are views illustrating a method for manufacturing a semiconductor device, according to an embodiment of the present invention.

Note that here, an aluminum film and a molybdenum film are formed as a conductive film over the substrate by a sputtering method and is etched with the use of a resist mask formed using a first photomask of this embodiment, so that the gate electrode 101 is formed, as illustrated in FIG. 2A.

This embodiment describes an example in which a multilayer film including stacked two insulating films is used as the gate insulating film 102. The first and second gate insulating films 102a and 102b can each be formed using a silicon oxide film, a silicon nitride film, a silicon oxynitride film, or a silicon nitride oxide film with a thickness of from 50 to 150 nm. Here, a mode is described in which a silicon nitride film or a silicon nitride oxide film is formed as the first gate insulating film 102a and a silicon oxide film or a silicon oxynitride film is formed as the second gate insulating film 102b. Note that the gate insulating film can be formed to have a single layer structure of a silicon oxide film, a silicon nitride film, a silicon oxynitride film, or a silicon nitride oxide film, instead of such a two-layer structure. Alternatively, the gate insulating film may be formed to have a three-layer structure.

By forming the first gate insulating film 102a using a silicon nitride film or a silicon nitride oxide film, adhesiveness between the substrate and the first gate insulating film 102a is increased, and in the case where a glass substrate is used as the substrate, an impurity can be prevented from diffusing into an oxide semiconductor film from the substrate and further, the gate electrode 101 can be prevented from being oxidized. That is to say, film peeling can be prevented, and thus electric characteristics of a thin film transistor to be completed later can be improved. Further, the first gate insulating film 102a and the second gate insulating film 102b each preferably have a thickness of 50 nm or more so that they can cover unevenness of the gate electrode 101.

Here, a silicon oxynitride film refers to a film that contains oxygen and nitrogen such that the amount of oxygen is larger than that of nitrogen and contains oxygen, nitrogen, silicon, and hydrogen at concentrations of 55 to 65 at. %, 1 to 20 at. %, 25 to 35 at. %, and 0.1 to 10 at. %, respectively. Further, a silicon nitride oxide film refers to a film that contains oxygen and nitrogen such that the amount of nitrogen is larger than that of oxygen and includes oxygen, nitrogen, silicon, and hydrogen at concentrations of 15 to 30 at. %, 20 to 35 at. %, 25 to 35 at. %, and 15 to 25 at. %, respectively.

Further, for the second gate insulating film 102b in contact with the semiconductor layer 103, silicon oxide, aluminum oxide, magnesium oxide, aluminum nitride, yttrium oxide, hafnium oxide, or the like can be used.

The first gate insulating film 102a and the second gate insulating film 102b can each be formed by a CVD method, a sputtering method, or the like. Here, a silicon nitride film is formed by a plasma CVD method as the first gate insulating film 102a.

In particular, it is desirable to successively form the second gate insulating film 102b in contact with the semiconductor film 133, and the semiconductor film 133. By the successive film formation, an interface of the stacked films can be formed without being contaminated by an atmospheric component such as water vapor and impurity elements and dusts floating in the air. Thus, variations in thin film transistor characteristics can be reduced.

As for an active matrix display device, electric characteristics of a thin film transistor included in a circuit are significant and performance of the display device depends on the electric characteristics. The threshold voltage ($V_{th}$) is particularly significant among the electric characteristics of the thin film transistor. Even when field-effect mobility is high, if the value of the threshold voltage is high or below zero, it is difficult to control a circuit. A thin film transistor in which the value of the threshold voltage is high and the absolute value of the threshold voltage is large might not be able to achieve a switching function and might be a load in the state where the driving voltage is low. Further, in the case where the value of the threshold voltage is below zero, a thin film transistor is likely to be in a so-called normally-on state in which a current flows between a source electrode and a drain electrode even when a gate voltage is 0 V.

In the case of an n-channel thin film transistor, it is desirable that only after a positive voltage is applied as a gate voltage, a channel be formed and a drain current flows. A transistor in which a channel is not formed unless the driving voltage is high and a transistor in which even when a negative voltage is applied, a channel is formed and then a drain current flows are not suitable as a thin film transistor used for a circuit. Therefore, also in the case of a thin film transistor using an oxide semiconductor film containing In, Ga, and Zn, a channel is desirably formed at a threshold voltage of the gate voltage which is a positive and close to 0 V.

A threshold voltage of a thin film transistor is considered to significantly depend on the interface of a semiconductor layer, that is, the interface between a semiconductor layer and a gate insulating film. By forming the interface thereof so that it is clean, electric characteristics of a thin film transistor can be improved and a manufacturing process can be prevented from being complicated. Thus, both mass productivity and high performance of the thin film transistor can be achieved.

In particular, when moisture is at the interface between an oxide semiconductor layer and a gate insulating film, there occurs a problem such as degradation of electric characteristics of a thin film transistor, variations in threshold voltages, or normally-on. By successively forming the oxide semiconductor layer and the gate insulating film, such a hydrogen compound can be removed.

Thus, the gate insulating film and the oxide semiconductor film are successively formed under reduced pressure by a sputtering method without being exposed to the air, so that a thin film transistor having a favorable interface, a small leakage current, and high current driving capability can be achieved.

Further, it is preferable to form the gate insulating film and the oxide semiconductor film containing In, Ga, and Zn in an oxygen atmosphere (or an atmosphere containing oxygen at 90% or more and a rare gas (such as argon) at 10% or less).

By thus successively forming the films by a sputtering method, productivity and reliability of an interface of the thin films can be increased. Further, by forming the gate insulating film and the semiconductor layer in an oxygen atmosphere so that they contain a large mount of oxygen, reduction in reliability due to deterioration and normally-on of a thin film transistor can be suppressed.

Further, it is also desirable to form an insulating film to be a channel protective layer 106, following the formation of the semiconductor film. By the successive film formation, an interface of the stacked films can be formed in a region on a side reverse of the side of a surface of the semiconductor film in contact with a gate insulating film, a so-called back channel, without being contaminated by an atmospheric component such as water vapor and impurity elements and dusts floating in the air. Thus, variations in thin film transistor characteristics can be reduced.

For a method for successive film formation, a multi-chamber sputtering apparatus equipped with a plurality of film formation chambers, a sputtering apparatus provided with a plurality of targets, or a pulsed laser deposition (PLD) apparatus may be used.

In the case of depositing silicon oxide for the insulating film, the insulating film can be formed by a high frequency sputtering method or a reactive sputtering method using silicon oxide (artificial quartz) or single crystal silicon as a target.

Note that here, a semiconductor film and a silicon oxide film to be a channel protective layer are successively formed without being exposed to the air after formation of a silicon oxide film as the second gate insulating film 102b in contact with the semiconductor film by using a multi-chamber sputtering apparatus provided with a single crystal silicon target and a target for the semiconductor film.

The semiconductor layer 103 is formed using an amorphous oxide semiconductor film. For the amorphous oxide semiconductor film, a composite oxide of an element such as indium, gallium, aluminum, zinc, or tin can be used. For example, indium oxide containing zinc oxide (IZO), oxide containing In, Ga, and Zn (IGZO), and oxide containing zinc oxide and tin oxide (ZTO) are given as examples of the composite oxide.

In the case of oxide containing indium oxide, gallium oxide, and zinc oxide, the composition ratio of the metal elements is highly flexibly set and the oxide functions as a semiconductor layer at a wide range of mixture ratio. For example, indium oxide containing zinc oxide at 10 wt %, a material in which indium oxide, gallium oxide, and zinc oxide are mixed in an equimolar ratio, and oxide containing In, Ga, and Zn at a ratio of 2.2:2.2:1.0 can be given.

The oxide semiconductor film 133 used for the semiconductor layer 103 is preferably formed to a thickness of from 2 nm to 200 nm, more preferably from 20 to 150 nm. Further, when the oxygen vacancy rate in the film is increased, a carrier concentration is increased and thus thin film transistor characteristics are degraded. Therefore, the composition is determined so that oxygen vacancy is suppressed.

The amorphous oxide semiconductor film 133 can be formed by a reactive sputtering method, a pulsed laser deposition method (PLD method), or a sol-gel method. Among gas phase methods, a PLD method is suitable in terms of easiness in controlling the composition of materials and a sputtering method is suitable in terms of mass productivity as described above. Here, a method using oxide containing In, Ga and Zn (IGZO) is described as an example of a method for forming the semiconductor film 133.

A target with a diameter of 8 inch obtained by mixing indium oxide ($In_2O_3$), gallium oxide ($Ga_2O_3$), and zinc oxide (ZnO) in an equimolar ratio and performing sintering is used, a substrate is provided 170 mm apart from the target, and direct current (DC) sputtering is performed with an output of 500 W, so that the semiconductor film 133 is formed. The semiconductor film 133 is formed to a thickness of 50 nm under the conditions that the chamber pressure is 0.4 Pa and the gas composition ratio of Ar to $O_2$ is 10/5 sccm. It is desirable that an oxygen partial pressure in film formation be set higher than that in forming a transparent conductive film of indium tin oxide (ITO) or the like to control the oxygen concentration in a film formation atmosphere so that oxygen vacancy is suppressed. Further, it is preferable to use a pulsed direct current (DC) power supply because dusts can be reduced and the thickness distribution of the semiconductor layer can be uniform.

Note that the semiconductor layer 103 may be subjected to a plasma treatment. By the plasma treatment, damages of the semiconductor layer 103 due to etching can be repaired. The plasma treatment is preferably performed in an atmosphere of $O_2$ or $N_2O$, or preferably an atmosphere of $N_2$, He, or Ar containing oxygen. Alternatively, the plasma treatment may be performed in the above atmosphere to which $Cl_2$ or $CF_4$ is added. Note that the plasma treatment is preferably performed with non-bias.

Note that in this embodiment, a semiconductor film is formed over the second gate insulating film 102b formed in the former step without exposing the second gate insulating film 102b to the air by using a multi-chamber sputtering apparatus provided with a target for an oxide semiconductor film and a single crystal silicon target. In the following step, an insulating film to be the channel protective layer 106 is formed over the formed semiconductor film without exposing the semiconductor film to the air.

The channel protective layer 106 is formed using an insulating film in a region overlapping with a channel formation region of the semiconductor layer 103 as in FIG. 2A. The insulating film functioning as the channel protective layer 106 can be formed using an inorganic material (such as silicon oxide, silicon nitride, silicon oxynitride, or silicon nitride oxide). Further, a film formed using one or a plurality of kinds of photosensitive or nonphotosensitive organic materials (organic resin materials) (such as polyimide, acrylic, polyamide, polyimide amide, resist, and benzocyclobutene) or a stack of such films can be used. Further, siloxane may be used.

The insulating film to be the channel protective layer 106 can be formed by a vapor phase growth method such as a plasma CVD method or a thermal CVD method, or a sputtering method. Alternatively, an application method such as a spin coating method which is a wet process may be used. Alternatively, the insulating film may be selectively formed by a droplet discharge method, a printing method (a method for forming a pattern, such as screen printing or offset printing), or the like.

Note that here, a silicon oxide film to be the channel protective layer 106 is formed without exposing the oxide semiconductor film 133 formed in the former step to the air by using a multi-chamber sputtering apparatus provided with a single crystal silicon target and a target for the oxide semiconductor film.

Next, the silicon oxide film formed over the semiconductor film 133 is selectively etched by using a resist mask formed with the use of a second photomask of this embodiment, so that the channel protective layer 106 is formed as in FIG. 2A.

Next, the semiconductor film 133 formed over the gate insulating films is etched by using a resist mask formed with the use of a third photomask of this embodiment, so that the semiconductor layer 103 is formed.

Note that as a method for etching a film of oxide containing In, Ga, and Zn (IGZO), a wet etching method can be used. An organic acid such as a citric acid or an oxalic acid can be used for an etchant. For example, a film of oxide containing In, Ga, and Zn (IGZO) with a thickness of 50 nm can be etched in 150 seconds by using the ITO07N (manufactured by Kanto Chemical Co., Inc.).

The pair of buffer layers 104a and 104b over the amorphous oxide semiconductor film are formed by using an oxide semiconductor film having n-type conductivity and containing In, Ga, and Zn.

Alternatively, an oxide semiconductor film having n-type conductivity and containing In, Ga, and Zn may be doped with another metal. As the dopant, magnesium, aluminum, titanium, scandium, yttrium, zirconium, hafnium, boron, thallium, germanium, tin, lead, and the like can be given. In the case where magnesium, aluminum, titanium, or the like is contained in the buffer layers, there is an effect of blocking oxygen and the like, so that the oxygen concentration of the semiconductor layer can be maintained within an optimal range by heat treatment or the like after film formation.

In an embodiment of the present invention, the carrier concentration of the semiconductor layer is preferably less than $1 \times 10^{17}$ atoms/cm$^3$ (more preferably $1 \times 10^{11}$ atoms/cm$^3$ or more) (the channel concentration range 1), and the carrier concentration of the IGZO film suitable for the buffer layers is preferably $1 \times 10^{18}$ atoms/cm$^3$ or more (more preferably $1 \times 10^{22}$ atoms/cm$^3$ or less) (the buffer layer concentration range 2). Further, a second buffer layer functioning as an n$^-$ layer having a higher carrier concentration than the semiconductor layer and a lower carrier concentration than the buffer layers may be provided between the semiconductor layer and the buffer layers.

The buffer layers 104a and 104b have a higher carrier concentration than the semiconductor layer formed using oxide containing In, Ga, and Zn (IGZO) and thus has excellent conductivity. Therefore, in the case of providing the buffer layers 104a and 104b, contact resistance can be reduced as compared to the case where the semiconductor layer 103 and the source and drain electrode layers 105a and 105b are directly bonded to each other. Further, by providing the buffer layers 104a and 104b at the bonding interface between the semiconductor layer 103 and the source and drain electrode layers 105a and 105b, an electric field concentrated at the bonding interface can be reduced.

Figure 2B:
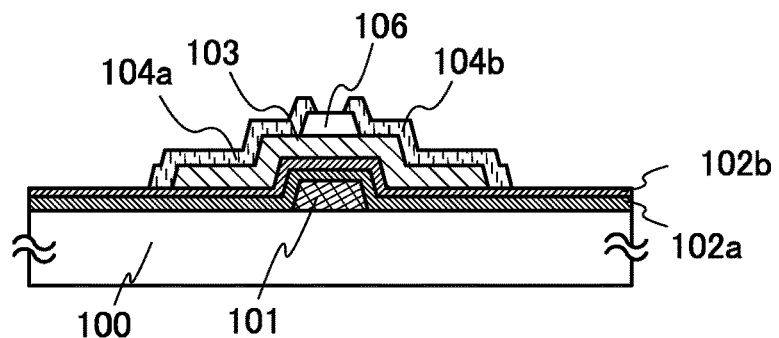

Note that in order that the buffer layers 104a and 104b may cover the semiconductor layer 103 reliably, patterning may be performed so that the buffer layers are also provided over part of the channel protective layer 106 as in FIG. 2B.

The oxide semiconductor film having n-type conductivity and containing In, Ga, and Zn, which is to be the buffer layers 104a and 104b, is preferably formed to a thickness of from 2 nm to 100 nm.

The oxide semiconductor film having n-type conductivity and containing In, Ga, and Zn, which is to be the buffer layers 104a and 104b, can be formed by a sputtering method or a pulsed laser deposition method (PLD method).

Note that here, the oxide semiconductor film having n-type conductivity and containing In, Ga, and Zn formed over the semiconductor layer 103 and the channel protective layer 106 is subjected to dry etching or wet etching using a resist mask formed with the use of a fourth photomask of this embodiment, so that the buffer layers 104a and 104b are formed.

The source and drain electrode layers 105a and 105b are formed using a conductive film, the same material as the gate electrode 101. In particular, a layer in contact with the buffer layers 104a and 104b is preferably a titanium film. As specific examples of the conductive film, a single titanium film, a layered film including a titanium film and an aluminum film, and a three-layer film in which a titanium film, an aluminum film, and a titanium film are sequentially stacked are given.

Figure 2C:
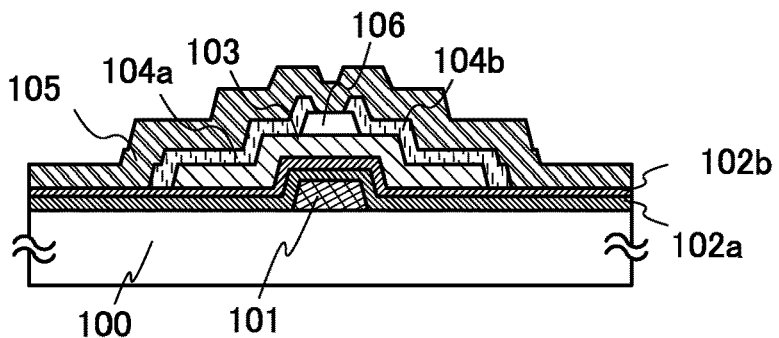
Figure 2D:
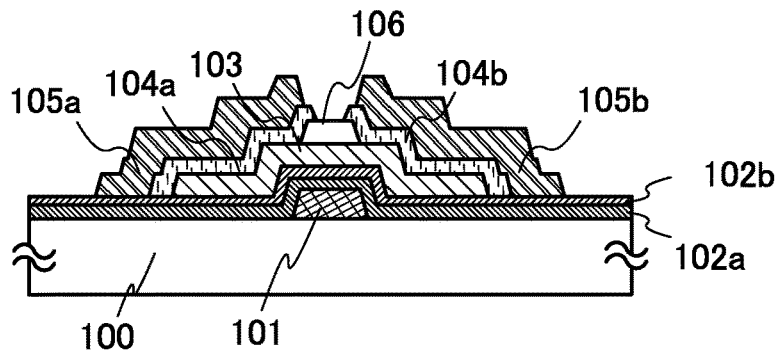

Here, a three-layer film including a titanium film, an aluminum film, and a titanium film is formed over the buffer layers 104a and 104b and the channel protective layer by a sputtering method as in FIG. 2C. Next, the conductive film formed over the channel protective layer 106 is etched to be divided by using a resist mask formed with the use of a fifth photomask of this embodiment, so that the source and drain electrode layers 105a and 105b are formed as in FIG. 2D. Note that the three-layer film in which a titanium film, an aluminum film, and a titanium film are sequentially stacked can be etched by using a hydrogen peroxide solution or a heated hydrochloric acid as an etchant.

Note that in this embodiment, formation of the buffer layers 104a and 104b and formation of the source and drain electrode layers 105a and 105b are performed separately, so that the lengths of a part where end portions of the buffer layer 104a and the source or drain electrode layer 105a overlap with each other and a part where end portions of the buffer layer 104b and the source or drain electrode layer 105b overlap with each other can be easily controlled.

The characteristics of the thin film transistor using oxide containing In, Ga, and Zn (IGZO) described in this embodiment for the semiconductor layer 103 can be improved by performing heat treatment on the semiconductor layer 103 formed. In specific, an on current is increased and variations in transistor characteristics are reduced.

The semiconductor layer 103 is heated at preferably 300° C. to 400° C. Here, the semiconductor layer 103 is heated at 350° C. for one hour. The heat treatment may be performed at any timing after formation of the semiconductor layer 103. For example, the heat treatment may be performed after the semiconductor layer 103 and the insulating film to be the channel protective layer 106 are successively formed, after the channel protective layer 106 is patterned, or after the oxide semiconductor film having n-type conductivity and containing In, Ga, and Zn, which is to be the buffer layers 104a and 104b, is formed. Alternatively, the heat treatment may be performed after the conductive film to be the source and drain electrode layers 105a and 105b is formed or after a sealing film of the thin film transistor is formed. Alternatively, the heat treatment of the semiconductor layer 103 may be performed also as a heat curing treatment of a planarization film formed over the thin film transistor.

According to the above description, the amorphous oxide semiconductor layer 103, the channel protective layer 106, the buffer layers 104a and 104b, and the source and drain electrode layers 105a and 105b which are illustrated in FIGS. 1A and 1B are formed.

The thin film transistor according to an embodiment of the present invention has a layered structure including the gate electrode, the gate insulating films, the semiconductor layer (the oxide semiconductor layer containing In, Ga, and Zn), the buffer layers, the channel protective layer, and the source and drain electrode layers. By using the buffer layers having a higher carrier concentration than the semiconductor layer, parasitic capacitance can be reduced with the thickness of the semiconductor layer kept small.

The thin film transistor according to an embodiment of the present invention is provided with the channel protective layer 106; therefore, a region on a side reverse of the side of a surface of an oxide semiconductor film in contact with the gate insulating film 102b, a so-called back channel, can be protected from damages (such as reduction in film thickness due to plasma or an etchant at the time of etching and oxidation) in the process. Thus, reliability of the thin film transistor can be improved.

Note that since the channel protective layer 106 functions as an etching stopper in the etching step for forming the semiconductor layer 103, it can also be referred to as a channel stopper layer.

Further, in this embodiment, the edges of the source and drain electrode layers 105a and 105b are on outer sides than the edges of the buffer layers 104a and 104b over the channel protective layer 106 so that they are apart from each other; therefore, a leakage current and a short circuit between the source and drain electrode layers 105a and 105b can be prevented.

Thus, by applying an embodiment of the present invention, a thin film transistor having a small amount of photocurrent, low parasitic capacitance, and a high on-off ratio can be obtained and thus a thin film transistor having favorable dynamic characteristics can be manufactured. Accordingly, a semiconductor device including a thin film transistor having excellent electric characteristics and high reliability can be provided.

Embodiment 2

In this embodiment, the structure of a thin film transistor in which a buffer layer contains formed using an oxide semiconductor having n-type conductivity and containing In, Ga, and Zn, which is different from the structure of Embodiment 1, will be described with reference to FIGS. 3A1 to 3D. In addition, in this embodiment, the same reference numerals are used for the same portions as those in Embodiment 1 and detailed description of the portions is omitted.

Through a similar process to that of Embodiment 1, a channel protective layer 106 is formed using an insulating film in a region that overlaps a channel formation region of a semiconductor layer 103 as illustrated in FIG. 3A1. Note that by the etching processing of the channel protective layer 106, the surface of the semiconductor layer 103 to which buffer layer 104 are to be bonded may be etched as illustrated in FIG. 3A2. By etching the surface of the oxide semiconductor layer to which the buffer layer 104 are to be bonded, the buffer layer 104 can be more favorably bonded to the oxide semiconductor layer.

In other words, through a process similar to that of Embodiment 1, the channel protective layer 106 is formed over a semiconductor film 133 and in a region overlapping with a gate electrode 101. Note that in a step of forming the channel protective layer 106, the surface of the semiconductor film 133 may be etched as illustrated in FIG. 3A2. The surface of the semiconductor film 133 in an opening portion of the channel protective layer 106 is etched; as a result, the surface can be favorably bonded to an oxide semiconductor film 134 having n-type conductivity and containing In, Ga, and Zn that is formed next and is to be buffer layers. Note that in this embodiment, description will be made based on the embodiment of FIG. 3A2.

In this embodiment, titanium oxide is deposited as the oxide semiconductor film 134 having n-type conductivity and containing In, Ga, and Zn to be buffer layers as illustrated in FIG. 3B. After the oxide semiconductor film 134 having n-type conductivity and containing In, Ga, and Zn to be buffer layers is formed by a method similar to that described in Embodiment 1, without patterning of the oxide semiconductor film 134 having n-type conductivity and containing In, Ga, and Zn, a conductive film 105 to be source and drain electrode layers 105a and 105b is stacked over the oxide semiconductor film 134 having n-type conductivity and containing In, Ga, and Zn as illustrated in FIG. 3C.

The conductive film 105 is formed by a method similar to that of Embodiment 1. Here, a three-layer film is formed by a sputtering method as the conductive film 105. For example, a titanium film, an aluminum film, and a titanium film can be used for source and drain electrode layers 105a1 and 105b1, source and drain electrode layers 105a2 and 105b2, and source and drain electrode layers 105a3 and 105b3, respectively.

In other words, the source and drain electrode layers (105a and 105b) in which the first conductive layers (105a1, 105b1) formed of titanium, the second conductive layers (105a2, 105b2) formed of aluminum, and the third conductive layers (105a3, 105b3) formed of titanium are stacked are formed using the conductive film 105 formed by stacking titanium for the first conductive film, aluminum for the second conductive film, and titanium for the third conductive film.

Next, the conductive film 105 is etched using a resist mask that is formed with the use of a fourth photomask of this embodiment.

The source and drain electrode layers 105a2, 105a3, 105b2, and 105b3 are etched by wet etching using the source and drain electrode layers 105a1 and 105b1 as etching stoppers. By using the same mask that is used in the above wet etching, the source and drain electrode layers 105a1 and 105b1, buffer layers 104a and 104b, and the semiconductor layer 103 are etched by dry etching. Accordingly, as illustrated in FIG. 3D, an edge portion of the source or drain electrode layer 105a1 is aligned with an edge portion of the buffer layer 104a, and an edge portion of the source or drain electrode layer 105b1 is aligned with an edge portion of the buffer layer 104b. In addition, edge portions of the source or drain electrode layers 105a2 and 105a3 and edge portions of the source or drain electrode layers 105b2 and 105b3 are on inner sides than the edge portion of the source or drain electrode layer 105a1 and the edge portion of the source or drain electrode layer 105b1, respectively.

In other words, first, the titanium film, which is the third conductive film, is etched to form the third conductive layers (105a3, 105b3), and next the aluminum film, which is the second conductive film, is etched using the titanium film, which is the first conductive film, as an etching stopper to form the second conductive layers (105a2, 105b2). Further, the titanium film, which is the first conductive film, and the oxide semiconductor film 134 having n-type conductivity and containing In, Ga, and Zn are dry-etched using the same resist mask that is used in the above wet etching, so that the third conductive layers (105a1, 105b1) and the buffer layers (104a, 104b) are formed. By formation of the source and drain electrode layers (105a, 105b) through this process, edge portions of the first conductive layers (105a1, 105b1) are aligned with edge portions of the buffer layers (104a, 104b), and edge portions of the second conductive layers (105a2, 105b2) and the third conductive layers (105a3, 105b3) are on inner sides than the edge portions of the first conductive layers (105a1, 105b1). Note that the cross-sectional view at this stage is illustrated in FIG. 3D.

Thus, when the etching selectivity of the conductive film used for the source and drain electrodes to the buffer layers and the semiconductor layer is low, it is preferable to perform an etching step plural times under different etching conditions by stacking a conductive film functioning as an etching stopper.

Further, heat treatment of the formed semiconductor layer 103 is performed in a manner similar to that of Embodiment 1.

According to this embodiment, since the buffer layers 104a and 104b and the source and drain electrode layers 105a and 105b are patterned using the resist mask formed with the same photomask, the number of photomasks used can be reduced compared to that of Embodiment 1. Thus, the number of steps can be reduced by combining plural steps, whereby yield can be improved and manufacturing time can be shortened.

Embodiment 3

In this embodiment, the structure of a thin film transistor including a buffer layer, which is different from the structures of Embodiments 1 and 2, will be described with reference to FIGS. 4A to 4D. In addition, in this embodiment, the same reference numerals are used for portions the same as those in Embodiment 1 and a detailed description of the portions is omitted.

Figure 4A:
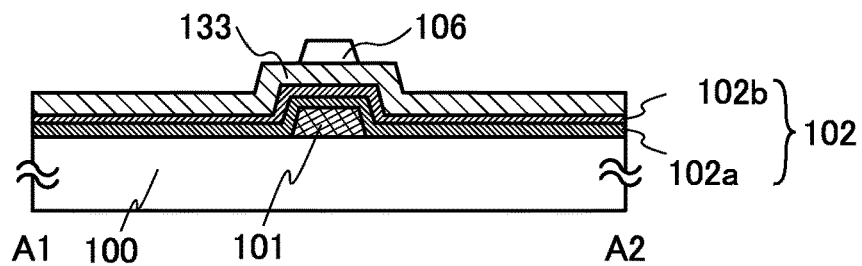
FIGS. 4A to 4D are views illustrating a method for manufacturing a semiconductor device, according to an embodiment of the present invention.

Through a process similar to that of Embodiment 2, a channel protective layer 106 is formed over a semiconductor film 133 of oxide containing In, Ga, and Zn (IGZO) to be a semiconductor layer 103 as illustrated in FIG. 4A.

Figure 4B:
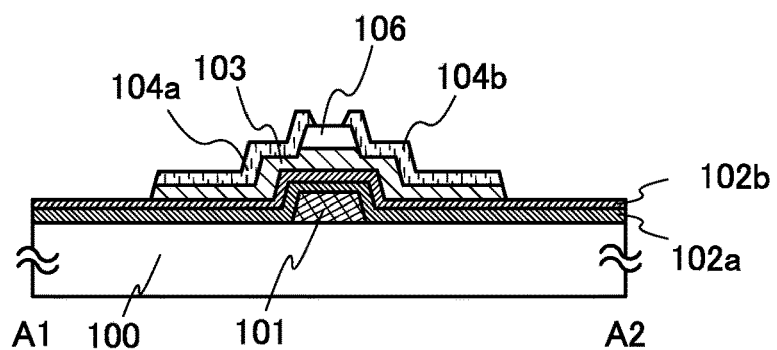

In this embodiment, without formation of the semiconductor layer 103 by selective etching of the semiconductor film 133, an oxide semiconductor film having n-type conductivity and containing In, Ga, and Zn to be buffer layers 104a and 104b is formed over the semiconductor film 133 by a method similar to that of Embodiment 2. Next, the buffer layers 104a and 104b and the semiconductor layer 103 are formed as illustrated in FIG. 4B, by using a resist mask that is formed with the use of a third photomask of this embodiment.

Figure 4C:
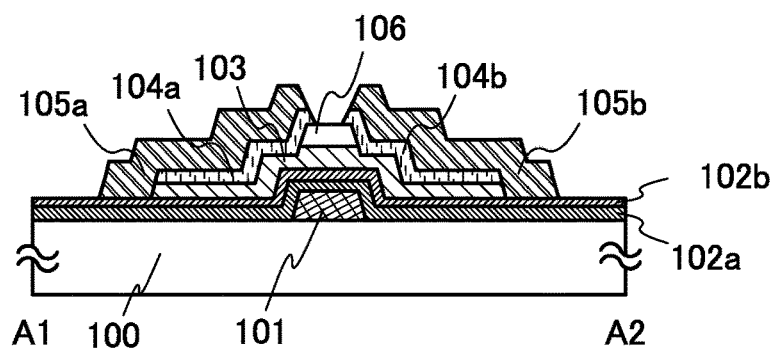
Figure 4D:
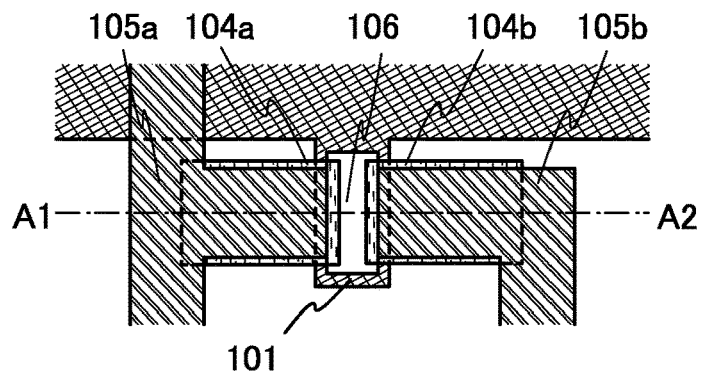

Source and drain electrode layers 105a and 105b are formed using a conductive film in a manner similar to that of Embodiment 1. Here, a three-layer film of a titanium film, an aluminum film, and a titanium film is formed by a sputtering method as the conductive film over the buffer layers 104a and 104b and the channel protective layer 106. Next, the conductive film is partially removed by etching with the use of a resist mask formed with a fourth photomask of this embodiment, so that the source and drain electrode layers 105a and 105b are formed as illustrated in FIG. 4C. FIG. 4D is a plan view and FIG. 4C is a cross-sectional view taken along line A1-A2 of FIG. 4D.

Further, heat treatment of the formed semiconductor layer 103 is performed in a manner similar to that of Embodiment 1.

According to this embodiment, since the buffer layers 104a and 104b and the semiconductor layer 103 are patterned at the same time, the number of photomasks used can be reduced compared to that of Embodiment 1. Thus, the number of steps can be reduced by combining plural steps, whereby yield can be improved and manufacturing time can be shortened.

Embodiment 4

Figure 5A:
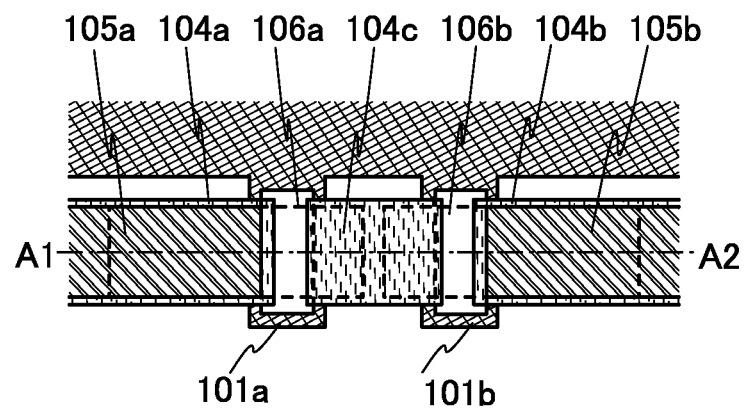
FIGS. 5A and 5B are views illustrating a semiconductor device according to an embodiment of the present invention.
Figure 5B:
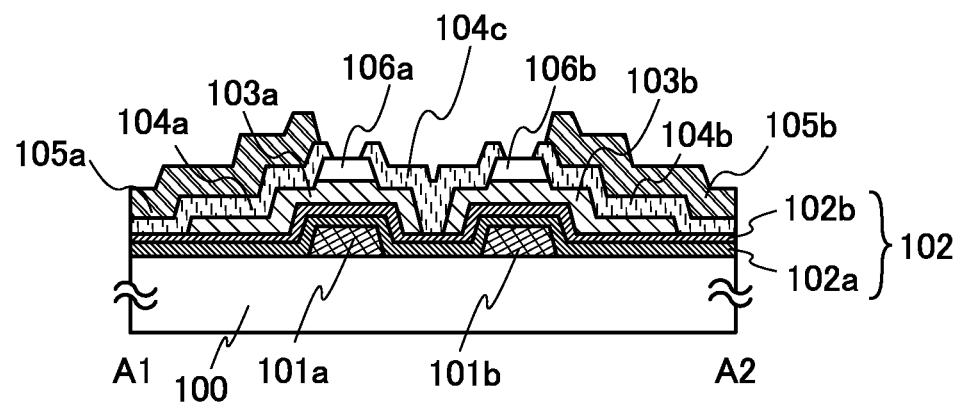
Figure 6A:
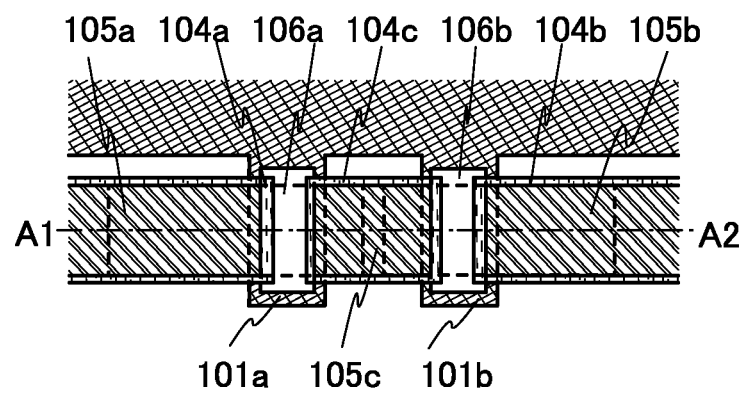
FIGS. 6A and 6B are views illustrating a semiconductor device according to an embodiment of the present invention.
Figure 6B:
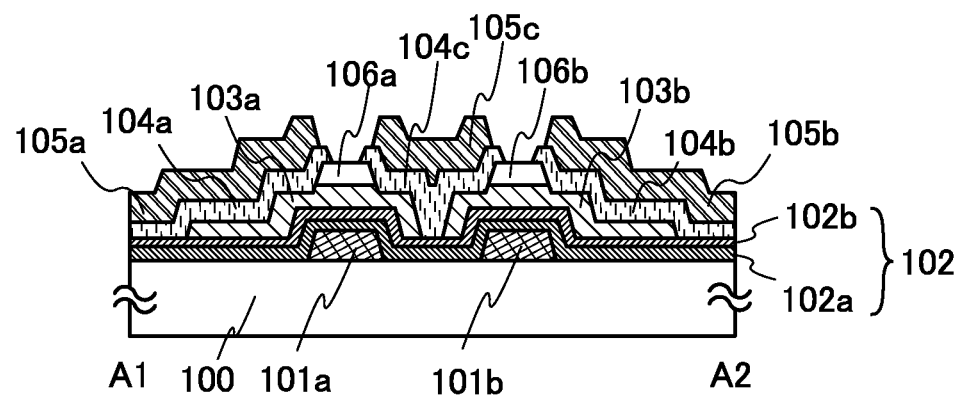
Figure 7A:
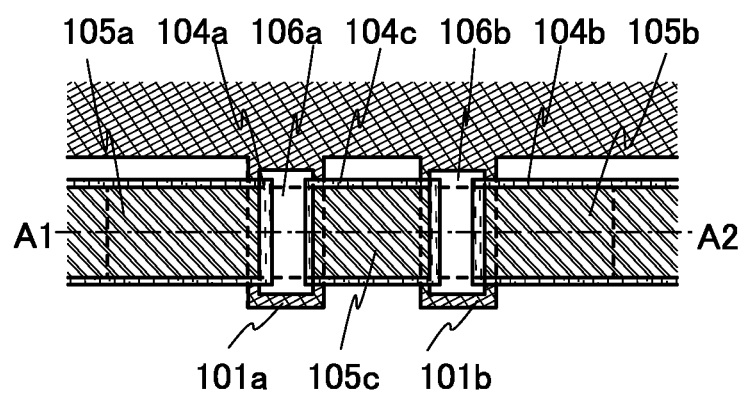
FIGS. 7A and 7B are views illustrating a semiconductor device according to an embodiment of the present invention.
Figure 7B:
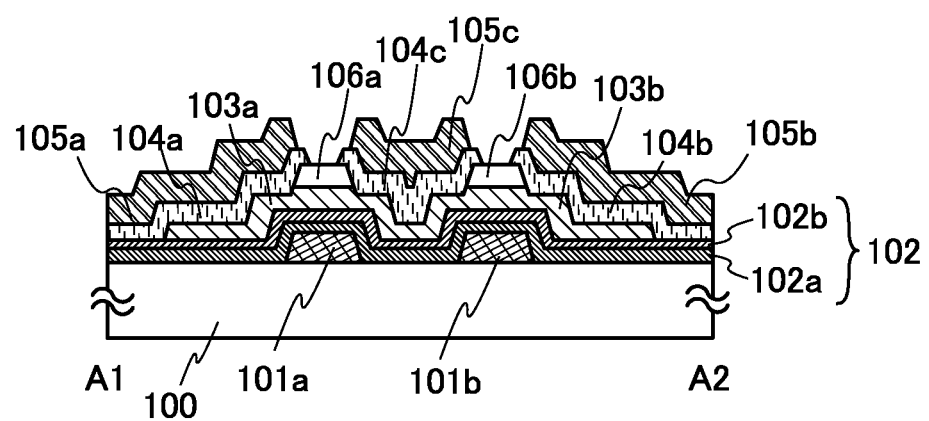

In this embodiment, a thin film transistor including a plurality of electrically-connected gate electrodes and a buffer layer will be described with reference to FIGS. 5A and 5B, FIGS. 6A and 6B, and FIGS. 7A and 7B. FIG. 5A is a plan view, and FIG. 5B is a cross-sectional view taken along line A1-A2 of FIG. 5A. FIG. 6A is a plan view, and FIG. 6B is a cross-sectional view taken along line A1-A2 of FIG. 6A. FIG. 7A is a plan view, and FIG. 7B is a cross-sectional view taken along line A1-A2 of FIG. 7A. In addition, in this embodiment, the same reference numerals are used for portions the same as those in Embodiment 1 and detailed description of the portions is omitted.

Note that the structure in which two channel formation regions are connected is employed in this embodiment; however, the structure is not limited thereto and the structure may be a so-called multi-gate structure (the structure including two or more channel formation regions which are connected in series) such as a triple-gate structure in which three channel formation regions are connected.

As the mode of the thin film transistor of this embodiment in which two channel regions are connected, there are three modes: a mode in which two channel regions are connected by only the buffer layer 104c (FIGS. 5A and 5B), a mode in which two channel regions are connected by the buffer layer 104c and the conductive layer 105c (FIGS. 6A and 6B), and a mode in which two channel regions are connected by the semiconductor layer 103, the buffer layer 104c, and the conductive layer 105c (FIGS. 7A and 7B). By changing the portion of the photomask for an appropriate layer, which is located between a first gate electrode 101a and a second gate electrode 101b, these thin film transistors can be formed by a method similar to that of Embodiment 1.

Such a multi-gate structure is very effective for reducing the off current value.

Embodiment 5

Figure 8:
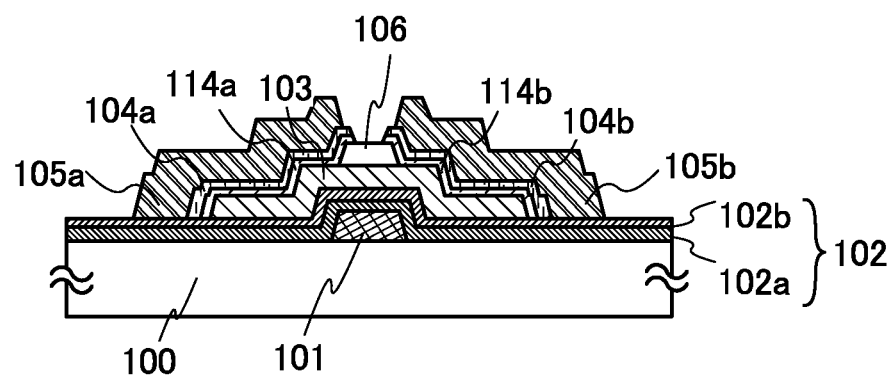
FIG. 8 is a view illustrating a semiconductor device according to an embodiment of the present invention.

This embodiment will describe the structure of a thin film transistor including buffer layers, which is different from the structures of Embodiments 1 to 4 with reference to FIG. 8. Note that since the thin film transistor of this embodiment except the buffer layers can be formed by a method similar to the method described in Embodiment 1, only the buffer layers will be specifically described.

The buffer layers of this embodiment each include a first buffer layer and a second buffer layer. The first buffer layers 104a and 104b are in contact with source and drain electrodes and second buffer layers 114a and 114b are sandwiched between the first buffer layers 104a and 104b and the semiconductor layer 103.

That is to say, the buffer layers of this embodiment are the first buffer layer 104a in contact with one of the source electrode or the drain electrode, the first buffer layer 104b in contact with the other, the second buffer layer 114a sandwiched between the first buffer layer 104a and the semiconductor layer 103, and the second buffer layer 114b sandwiched between the first buffer layer 104b and the semiconductor layer 103.

The first buffer layers 104a and 104b and the second buffer layers 114a and 114b are each formed using an oxide semiconductor having n-type conductivity and containing In, Ga, and Zn.

Alternatively, an oxide semiconductor having n-type conductivity and containing In, Ga, and Zn, which is doped with another metal, may be used. As the dopant, for example, magnesium, aluminum, titanium, scandium, yttrium, zirconium, hafnium, boron, thallium, germanium, tin, lead, and the like can be given. By the doping, the carrier concentration in the buffer layer can be increased.

As a method for forming the buffer layers, for example, a co-sputtering method for sputtering a target obtained by sintering oxide containing In, Ga, and Zn (IGZO) and a target of a compound containing a dopant imparting n-type conductivity at the same time may be employed. By the co-sputtering method, a mixed layer of oxide containing In, Ga, and Zn (IGZO) and a compound containing a dopant can be formed, and the first buffer layers 104a and 104b can be formed separately from the second buffer layers 114a and 114b.

The first buffer layers 104a and 104b and the second buffer layers 114a and 114b have a higher carrier concentration than the semiconductor layer 103 of oxide containing In, Ga, and Zn (IGZO) and thus has excellent conductivity. The composition of the first buffer layers 104a and 104b is selected so that the buffer layers 104a and 104b have a higher carrier concentration than the second buffer layers 114a and 114b. That is to say, the first buffer layers 104a and 104b function as n$^+$ layers whereas the second buffer layers 114a and 114b function as n$^-$ layers.

The carrier concentration of the semiconductor layer 103 is preferably less than $1 \times 10^{17}$ atoms/cm$^3$ (more preferably $1 \times 10^{11}$ atoms/cm$^3$ or more) (the channel concentration range 1), and the carrier concentration of the IGZO film suitable for the buffer layers 104a and 104b functioning as n$^+$ layers is preferably $1 \times 10^{18}$ atoms/cm$^3$ or more (more preferably $1 \times 10^{22}$ atoms/cm$^3$ or less) (the buffer layer concentration range 2).

By making the carrier concentration gradient so that the carrier concentration is increased from the semiconductor layer 103 toward the source and drain electrode layers 105a and 105b, contact resistance between the semiconductor layer 103 and the source and drain electrode layers 105a and 105b can be reduced.

Further, by providing the buffer layers having the gradient in which a carrier concentration is increased from the semiconductor layer 103 side toward the side of the source and drain electrode layers 105a and 105b at the bonding interface between the semiconductor layer 103 and the source and drain electrode layers 105a and 105b, an electric field concentrated at the bonding interface can be alleviated.

The thin film transistor including the stacked buffer layers according to an embodiment of the present invention has a small off current, and thus a semiconductor device including such a thin film transistor can have excellent electric characteristics and high reliability.

This embodiment can be implemented by being combined with any of the other embodiments as appropriate.

Embodiment 6

In this embodiment, a manufacturing example of an inverted-staggered thin film transistor is described, in which at least a gate insulating film and an oxide semiconductor film are formed to be stacked successively without being exposed to the air. In this embodiment, steps up to a step of the successive film formation are described and steps after the successive film formation may be performed in accordance with any one of Embodiments 1 to 5 to manufacture a thin film transistor.

Figure 9:
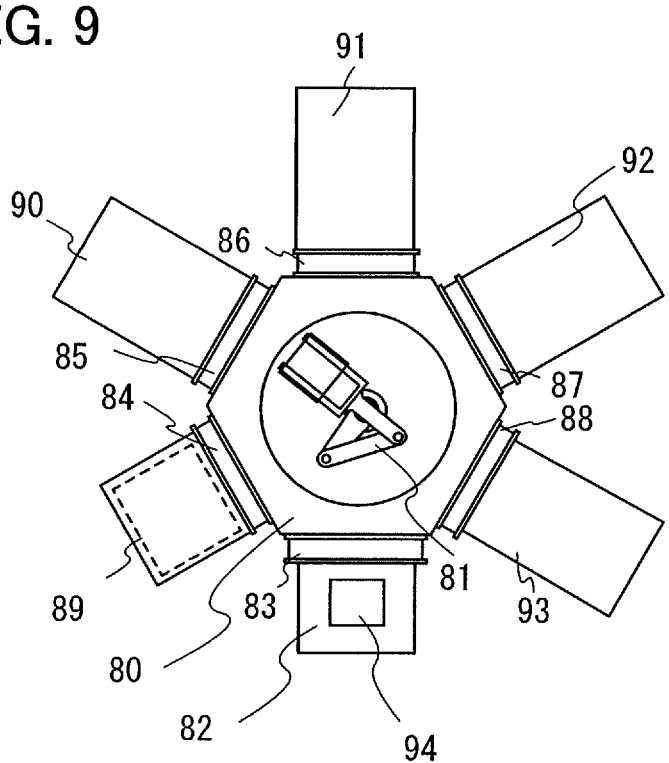
FIG. 9 is a top schematic diagram illustrating a multi-chamber manufacturing apparatus.

When films are successively formed without being exposed to the air, such a multi-chamber manufacturing apparatus illustrated in FIG. 9 is preferably used.

At the center of the manufacturing apparatus, a transfer chamber 80 equipped with a transfer mechanism for transferring a substrate (typically, a transfer robot 81) is provided. A cassette chamber 82 in which a cassette case holding a plurality of substrates carried into and out of the transfer chamber 80 is set is connected to the transfer chamber 80.

In addition, a plurality of treatment chambers are connected to the transfer chamber 80 through gate valves 84 to 88. In this embodiment, an example in which five treatment chambers are connected to the transfer chamber 80 having a hexagonal top shape is illustrated. Note that by changing the top shape of the transfer chamber 80, the number of treatment chambers which can be connected to the transfer chamber can be changed. For example, three treatment chambers can be connected to a transfer chamber having a tetragonal shape, or seven treatment chambers can be connected to a transfer chamber having an octagonal shape.

At least one treatment chamber among the five treatment chambers is a sputtering chamber in which sputtering is performed. The sputtering chamber is provided with, at least inside the chamber, a sputtering target, a mechanism for applying electric power or a gas introduction means for sputtering the target, a substrate holder for holding a substrate at a predetermined position, and the like. Further, the sputtering chamber is provided with a pressure control means for controlling the pressure in the chamber, so that the pressure is reduced in the sputtering chamber.

Examples of a sputtering method include an RF sputtering method in which a high-frequency power source is used for a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal film.

In addition, there is also a multi-source sputtering apparatus in which a plurality of targets of different materials can be set. With the multi-source sputtering apparatus, films of different materials can be deposited to be stacked in the same chamber, or a plurality of kinds of materials can be deposited at the same time by electric discharge in the same chamber.

In addition, there are also a sputtering apparatus provided with a magnet system inside the chamber and used for a magnetron sputtering method, and a sputtering apparatus used for an ECR sputtering method in which plasma generated with the use of microwaves is used without using glow discharge.

In the sputtering chamber of this embodiment, any of various sputtering methods described above is used as appropriate. In addition, as a deposition method, there are also a reactive sputtering method in which a target substance and a sputtering gas component are chemically reacted with each other during deposition to form a thin compound film thereof, and a bias sputtering method in which a voltage is also applied to a substrate during deposition.

In addition, among the five treatment chambers, one of the other treatment chambers than the sputtering chamber is a heating chamber in which a substrate is preheated or the like before sputtering, a cooling chamber in which a substrate is cooled after sputtering, or a chamber in which plasma treatment is performed.

Next, an example of an operation of the manufacturing apparatus is described.

A substrate cassette storing a substrate 94 whose surface on which deposition is performed faces downward is set in the cassette chamber 82, and the cassette chamber 82 is placed in a reduced pressure state by a vacuum evacuation means provided in the cassette chamber 82. Note that in each of the treatment chambers and the transfer chamber 80, the pressure is reduced in advance by a vacuum evacuation means provided in each chamber. Accordingly, during being transferred between the treatment chambers, the substrate is not exposed to the air and can be kept clean.

Note that at least a gate electrode is provided in advance over the substrate 94 surface on which deposition is performed faces downward. For example, a base insulating film such as a silicon nitride film or a silicon nitride oxide film may also be provided by a plasma CVD method between the substrate and the gate electrode. When a substrate made of glass containing alkali metal is used as the substrate 94, the base insulating film has an effect of preventing movable ions such as sodium ions from being discharged from the substrate and entering a semiconductor region above the substrate to change electric characteristics of a TFT.

Here, a substrate over which a silicon nitride film covering the gate electrode is formed by a plasma CVD method to form a first layer of a gate insulating film is used. The silicon nitride film formed by a plasma CVD method is dense, so that generation of pin holes or the like can be suppressed by using this silicon nitride film as the first layer of the gate insulating film. Although this embodiment describes an example in which the gate insulating film has a layered structure, the present invention is not limited thereto, and the gate insulating film may be a single layer or have a layered structure including three or more layers.

Then, the gate valve 83 is opened and the substrate 94 which is the first substrate is picked up from the cassette by the transfer robot 81. After that, the gate valve 84 is opened and the substrate 94 is transferred to a first treatment chamber 89, and then, the gate valve 84 is closed. In the first treatment chamber 89, by heating the substrate 94 by a heater or a lamp, moisture or the like attached to the substrate 94 is removed. In particular, when the gate insulating film contains moisture, electric characteristics of a TFT could possibly be changed; therefore, heating before sputtering deposition is effective. Note that in the case where moisture has been sufficiently removed at the time when the substrate is set in the cassette chamber 82, this heating treatment is not necessary.

In addition, plasma treatment may be performed on the surface of the first layer of the gate insulating film by providing a plasma treatment means in the first treatment chamber 89. Furthermore, heating for removing moisture may be performed in the cassette chamber 82 by providing a heating means in the cassette chamber 82.

Then, the gate valve 84 is opened and the substrate is transferred to the transfer chamber 80 by the transfer robot 81. After that, the gate valve 85 is opened and the substrate is transferred to a second treatment chamber 90, and the gate valve 85 is closed.

Here, the second treatment chamber 90 is a sputtering chamber in which sputtering is performed using an RF magnetron sputtering method. In the second treatment chamber 90, a silicon oxide film ($SiO_x$ film ($x>0$)) is formed as a second layer of the gate insulating film. Alternatively, for the second layer of the gate insulating film, an aluminum oxide film ($Al_2O_3$ film), a magnesium oxide film ($MgO_x$ film ($x>0$)), an aluminum nitride film ($AlN_x$ film ($x>0$), an yttrium oxide film ($YO_x$ film ($x>0$), or the like may be used instead of a silicon oxide film.

A small amount of a halogen element such as fluorine or chlorine may be added to the second layer of the gate insulating film so that movable ions such as sodium ions can be immobilized. As a method for adding a small amount of a halogen element, sputtering is performed by introducing a gas containing a halogen element into the chamber. It is to be noted that in the case where a gas containing a halogen element is introduced, the evacuation means of the chamber is needed to be provided with an abatement system. The peak of the concentration of a halogen element to be contained in the gate insulating film is measured by a secondary ion mass spectrometer (SIMS) and is preferably in the range of from $1\times10^{15}$ cm$^{-3}$ to $1\times10^{20}$ cm$^{-3}$.

When the $SiO_x$ film ($x>0$) is formed, a sputtering method in which artificial quartz is used as a target and a rare gas, typically, argon is used, or a reactive sputtering method in which single crystal silicon is used as a target and chemically reacted with an oxygen gas to obtain a $SiO_x$ film ($x>0$) can be used. Here, artificial quartz is used as a target, and sputtering is performed in an atmosphere containing only oxygen, an atmosphere containing oxygen at 90% or more and Ar at 10% or less so that a $SiO_x$ film contains oxygen as much as possible. Thus, a $SiO_x$ film ($x>0$) containing an excessive amount of oxygen is formed.

After the $SiO_x$ film ($x>0$) is formed, the gate valve 85 is opened, and the substrate is transferred to the transfer chamber 80 by the transfer robot 81 without being exposed to the air. Then, the gate valve 86 is opened, the substrate is transferred to a third treatment chamber 91, and the gate valve 86 is closed.

In this embodiment, the third treatment chamber 91 is a sputtering chamber in which sputtering is performed using a DC magnetron sputtering method. In the third treatment chamber 91, an oxide semiconductor film containing In, Ga, and Zn (IGZO film) is formed as a semiconductor layer. The IGZO film can be formed using an oxide semiconductor target containing In, Ga, and Zn, under a rare gas atmosphere or an oxygen atmosphere. Here, an oxide semiconductor containing In, Ga, and Zn is used as a target and sputtering is performed by a pulsed DC sputtering method under an atmosphere containing only oxygen, an atmosphere containing oxygen at 90% or more and Ar at 10% or less so that the IGZO film contains oxygen as much as possible. Thus, an IGZO film containing an excessive amount of oxygen is formed.

By thus successively forming the SiOx film containing an excessive amount of oxygen and the IGZO film containing an excessive amount of oxygen without exposing them to the air, an interface state between the films can be stabilized because both the films contain an excessive amount of oxygen, and the reliability of a TFT can be improved. If the substrate is exposed to the air before formation of the IGZO film, moisture or the like is attached and the interface state is adversely affected, which may cause phenomena such as variation in threshold voltage, degradation in electric characteristics, and a normally-on TFT. Moisture is a hydrogen compound. When the films are successively formed without being exposed to the air, the hydrogen compound can be prevented from existing at the interface. Therefore, by successive film formation, variation in threshold voltage can be reduced, degradation in electric characteristics can be prevented, or shift of the TFT characteristics to the normally-on side can be reduced, desirably, the shift of the TFT characteristics can be prevented.

In addition, in the second treatment chamber 90 which is a sputtering chamber, both an artificial quartz target and an oxide semiconductor target containing In, Ga, and Zn are placed, and the films are successively formed by using a shutter; therefore, the films can be stacked in the same chamber. A shutter is provided between the target and the substrate; a shutter is opened for a target which is deposited, and a target which is not deposited is shielded by a shutter. Advantages of the process in which the films are stacked in the same chamber are as follows: the number of chambers which are used can be reduced, and particles or the like can be prevented from being attached to the substrate during transfer of the substrate between different chambers.

Next, the substrate is transferred to the transfer chamber 80 with a transferring robot 81 by opening the gate valve 86 and transferred to a fourth treatment chamber 92 by opening a gate valve 87 without being exposed to the air, and then the gate valve 87 is closed.

Here, the fourth treatment chamber 92 is a sputtering chamber in which sputtering is performed using an RF magnetron sputtering method. In the fourth treatment chamber 92, a silicon oxide film ($S_xO_x$ film (x>0)) is formed as an insulating film to be a channel protective layer. Alternatively, for the channel protective layer, an aluminum oxide film ($Al_2O_3$ film), a magnesium oxide film ($MgO_x$ film (x>0)), an aluminum nitride film ($AlN_x$ film (x>0), an yttrium oxide film ($YO_x$ film (x>0), or the like may be used instead of a silicon oxide film.

A small amount of a halogen element such as fluorine or chlorine may be added to the channel protective layer so that movable ions such as sodium ions can be immobilized. As a method for adding a small amount of a halogen element, sputtering is performed by introducing a gas containing a halogen element into the chamber. It is to be noted that in the case where a gas containing a halogen element is introduced, the evacuation means of the chamber is needed to be provided with an abatement system. The peak of the concentration of a halogen element to be contained in the gate insulating film is measured by a secondary ion mass spectrometer (SIMS) and is preferably in the range of from $1 \times 10^{15}$ cm$^{-3}$ to $1 \times 10^{20}$ cm$^{-3}$.

When the $SiO_x$ film (x>0) is formed for the channel protective layer, a sputtering method in which artificial quartz is used as a target and a rare gas, typically, argon is used, or a reactive sputtering method in which single crystal silicon is used as a target and chemically reacted with an oxygen gas to obtain a $SiO_x$ film (x>0) can be used. Here, artificial quartz is used as a target, and sputtering is performed in an atmosphere containing only oxygen, an atmosphere containing oxygen at 90% or more and Ar at 10% or less so that a SiOx film contains oxygen as much as possible. Thus, a $SiO_x$ film (x>0) containing an excessive amount of oxygen is formed.

By thus successively forming the $SiO_x$ film (x>0) containing an excessive amount of oxygen and the IGZO film containing an excessive amount of oxygen without exposing them to the air, an interface state between the films can be stabilized because all the three layers contain an excessive amount of oxygen, and the reliability of a TFT can be improved. If the substrate is exposed to the air before formation of the IGZO film, moisture or the like is attached and the interface state is adversely affected, which may cause phenomena such as variation in threshold voltage, degradation in electric characteristics, and a normally-on TFT. Moisture is a hydrogen compound. When the films are successively formed without being exposed to the air, the hydrogen compound can be prevented from existing at the interface. Therefore, by successive film formation, variation in threshold voltage can be reduced, degradation in electric characteristics can be prevented, or shift of the TFT characteristics of a TFT to the normally-on side can be reduced, desirably, the shift of the TFT characteristics can be prevented.

In addition, in the second treatment chamber 90 which is a sputtering chamber, both a artificial quartz target and an oxide semiconductor target containing In, Ga, and Zn are placed, and the three films are successively formed by using a shutter; therefore, the films can be stacked in the same chamber. Advantages of the process in which the films are stacked in the same chamber are as follows: the number of chambers which are used can be reduced, and particles or the like can be prevented from being attached to the substrate during transfer of the substrate between different chambers.

After the above steps for deposition on a substrate in a cassette case are repeated so that a plurality of substrates are processed, the vacuum in the cassette chamber is released and the substrates and the cassettes are taken out.

Next, to pattern the IGZO film, the channel protective layer is selectively etched and further the IGZO film is selectively etched. To form the pattern, dry etching or wet etching may be used or selective etching may be performed twice. In this stage, the surface of the gate insulating film is exposed in a region where the IGZO film is removed.

Next, the channel protective layer is etched so that only a portion thereof overlapping with the gate electrode, that is, only a portion thereof overlapping with a portion to be a channel formation region of the IGZO film is left. Here, the channel protective layer is etched under the condition that the etching rate is sufficiently different from that of the IGZO film. In the case where there is not a sufficient difference in etching rate between the channel protective layer and the IGZO film in etching the channel protective layer, the surface portion of the IGZO film is partially etched and thus a region thinner than a region overlapped with the channel protective layer is formed in the IGZO film. Note that in the case where the channel protective layer is formed using the same material as the gate insulating film, the gate insulating film is also etched by the etching. Therefore, it is preferable to use a material different from that of the gate insulating film for the channel protective layer to prevent the gate insulating film from being etched. In this embodiment, the gate insulating film has a two-layer structure in which the upper layer is a $SiO_x$ film (x>0) and thus might be removed and the lower layer is a silicon nitride film and functions as an etching stopper.

Next, the substrate is set in the cassette chamber of the multi-chamber manufacturing apparatus illustrated in FIG. 9 again.

Next, after pressure in the cassette chamber is reduced, the substrate is transferred to the transfer chamber 80 and then to the third treatment chamber 91. Here, sputtering is performed by a pulsed DC sputtering method in an atmosphere containing only a rare gas, so that the oxide semiconductor film having n-type conductivity and containing In, Ga, and Zn to be buffer layers is formed. The oxide semiconductor film having n-type conductivity and containing In, Ga, and Zn has a lower oxygen concentration than the IGZO film containing an excessive amount of oxygen. Further, the oxide semiconductor film having n-type conductivity and containing In, Ga, and Zn preferably has a higher carrier concentration than the IGZO film containing an excessive amount of oxygen. As a target, an oxide semiconductor containing In, Ga and Zn which further contains Mg, Al, or Ti may be used. Mg, Al, and Ti are materials which is likely to perform oxidative reaction; thus when any of the materials is contained in the oxide semiconductor film having n-type conductivity and containing In, Ga, and Zn, an effect of blocking oxygen and the like can be obtained, so that the oxygen concentration of the semiconductor layer can be maintained within an optimal range even if heat treatment or the like is performed after film formation. The oxide semiconductor film having n-type conductivity and containing In, Ga, and Zn functions as source and drain regions.

Next, the substrate is transferred to the transfer chamber 80 with a transferring robot 81 by opening the gate valve 87 and transferred to a fifth treatment chamber 93 by opening a gate valve 88 without being exposed to the air, and then the gate valve 88 is closed.

Here, the fifth treatment chamber 93 is a sputtering chamber using a DC magnetron sputtering method. In the fifth treatment chamber 93, a metal multilayer film to be source and drain electrodes is formed. The sputtering chamber of the fifth treatment chamber 93 is provided with both a titanium target and an aluminum target and successive film formation is performed by using a shutter; thus, films are formed in the same chamber. Here, an aluminum film is stacked over a titanium film and further, a titanium film is stacked over the aluminum film.

By thus successively forming an oxide semiconductor film having n-type conductivity and containing In, Ga, and Zn and a metal multilayer film without exposing them to the air, a favorable interface state can be achieved and contact resistance can be reduced between the oxide semiconductor film having n-type conductivity and containing In, Ga, and Zn and the metal multilayer film.

After the above steps for deposition on a substrate in a cassette case are repeated so that a plurality of substrates are processed, the vacuum in the cassette chamber is released and the substrates and the cassettes are taken out.

Next, the metal multilayer film is selectively etched to form the source and drain electrodes. Further, the oxide semiconductor film having n-type conductivity and containing In, Ga, and Zn is selectively etched using the source and drain electrodes as masks, so that source and drain regions are formed. In the etching of the oxide semiconductor film having n-type conductivity and containing In, Ga, and Zn, the channel protective layer functions as an etching stopper.

Through the above steps, the inverted-staggered thin film transistor including the channel protective layer can be formed.

Although an example is described in which the IGZO film containing an excessive amount of oxygen and the oxide semiconductor film having n-type conductivity and containing In, Ga, and Zn are formed in the same chamber through the above steps, the present invention is not particularly limited to this. Alternatively, the IGZO film containing an excessive amount of oxygen and the oxide semiconductor film having n-type conductivity and containing In, Ga, and Zn may be formed in different chambers.

In this embodiment, a multi-chamber manufacturing apparatus is shown as an example, but an in-line manufacturing apparatus in which sputtering chambers are connected in series may be used and successive film formation may be performed without being exposed to the air.

The apparatus illustrated in FIG. 9 has a so-called face-down treatment chamber in which the deposition target surface of the substrate faces downward, but may also have a vertical placement treatment chamber in which a substrate is placed vertically. The vertical placement treatment chamber has an advantage that a footprint is smaller than that of a face-down treatment chamber and can be effectively used in the case where a large-area substrate which could be bent due to its weight is used.

Embodiment 7

In this embodiment, an example will be described below in which at least a part of a driver circuit and a thin film transistor to be disposed in a pixel portion are formed over one substrate.

The thin film transistor to be disposed in the pixel portion is formed according to any of Embodiments 1 to 5. Further, the thin film transistor described in any of Embodiments 1 to 5 is an n-channel TFT, and thus a part of a driver circuit that can include an n-channel TFT among driver circuits is formed over the same substrate as the thin film transistor of the pixel portion.

Figure 10A:
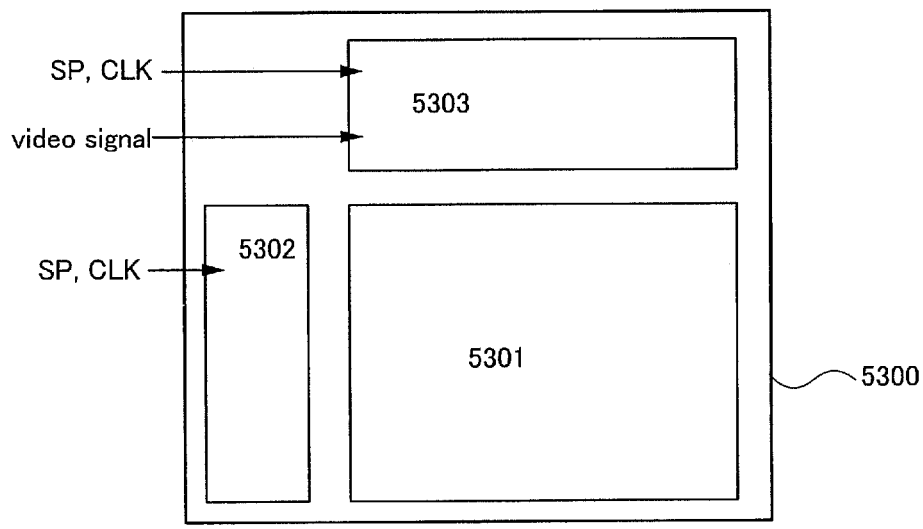
FIGS. 10A and 10B are block diagrams each illustrating a display device.

FIG. 10A illustrates an example of a block diagram of an active matrix liquid crystal display device. The display device illustrated in FIG. 10A includes, over a substrate 5300, a pixel portion 5301 including a plurality of pixels each provided with a display element; a scan line driver circuit 5302 that selects each pixel; and a signal line driver circuit 5303 that controls a video signal input to a selected pixel. The pixel portion 5301 is connected to the signal line driver circuit 5303 by a plurality of signal lines S1 to Sm (not illustrated) that extend in a column direction from the signal line driver circuit 5303, and to the scan line driver circuit 5302 by a plurality of scan lines G1 to Gn (not illustrated) that extend in a row direction from the scan line driver circuit 5302. The pixel portion 5301 includes a plurality of pixels (not illustrated) arranged in matrix so as to correspond to the signal lines S1 to Sm and the scan lines G1 to Gm. Each pixel is connected to a signal line Sj (any one of the signal lines S1 to Sm) and a scan line Gi (any one of the scan lines G1 to Gn).

In addition, the thin film transistor described in any of Embodiments 1 to 5 is an n-channel TFT, and a signal line driver circuit including the n-channel TFT is described with reference to FIG. 11.

Figure 11:
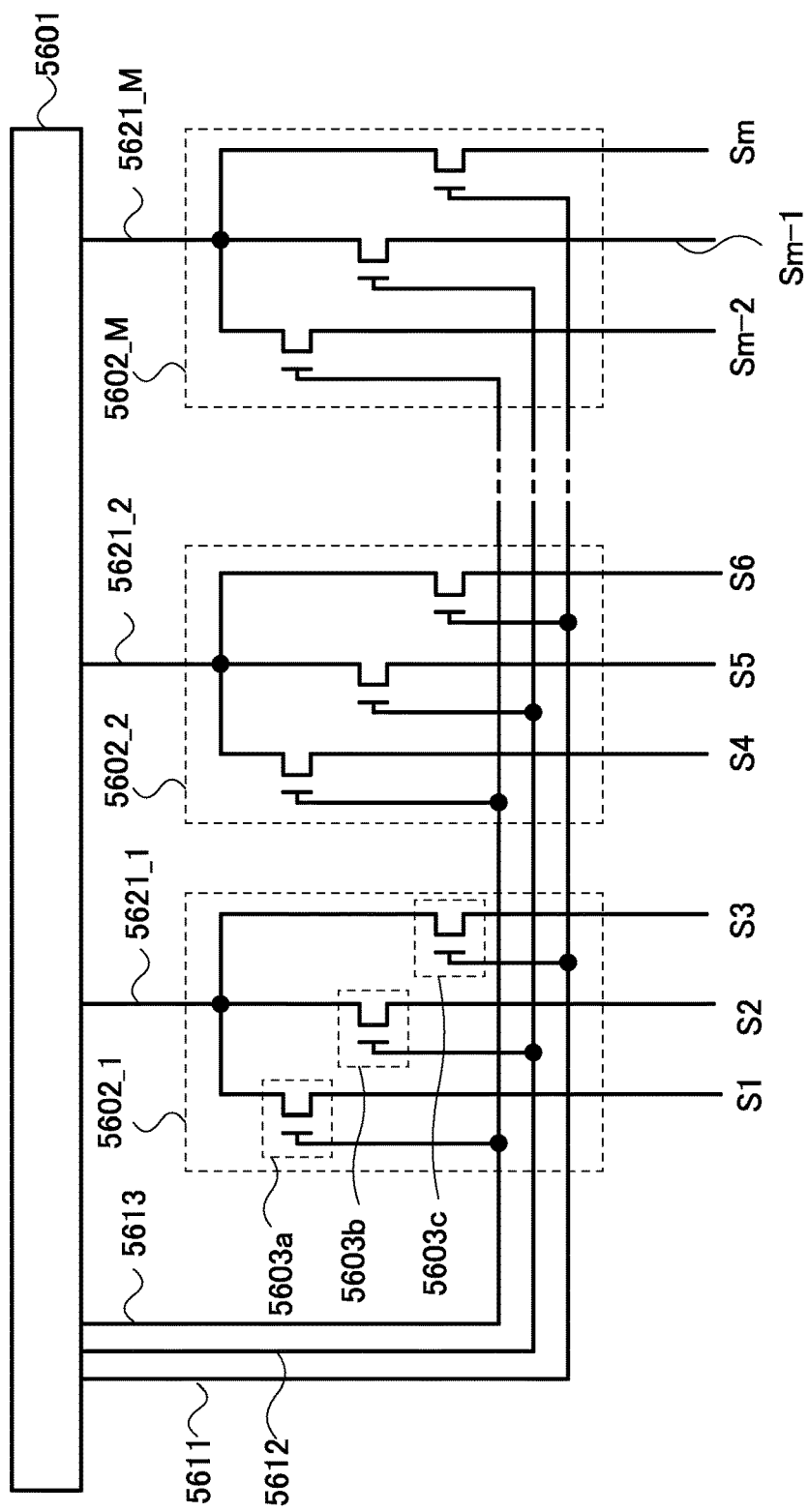
FIG. 11 is a diagram illustrating a structure of a signal line driver circuit.

The signal line driver circuit illustrated in FIG. 11 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. The switch groups 5602_1 to 5602_M are connected to the wirings 5621_1 to 5621_M corresponding to the switch groups 5602_1 to 5602_M, respectively, and are each connected to the first wiring 5611, the second wiring 5612, the third wiring 5613. Each of the wirings 5621_1 to 5621_M is connected to three signal lines via the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−1, a signal line Sj, and a signal line Sj+1 via the first thin film transistor 5603a, the second thin film transistor 5603b, and the third thin film transistor 5603c included in the switch group 5602_J.

Note that a signal is input to each of the first wiring 5611, the second wiring 5612, and the third wiring 5613.

Note that the driver IC 5601 is desirably formed over a single crystalline substrate. The switch groups 5602_1 to 5602_M are desirably formed over the same substrate as the pixel portion illustrated in any of Embodiments 1 to 5. Therefore, the driver IC 5601 and the switch groups 5602_1 to 5602_M are preferably connected via an FPC or the like.

Figure 12:
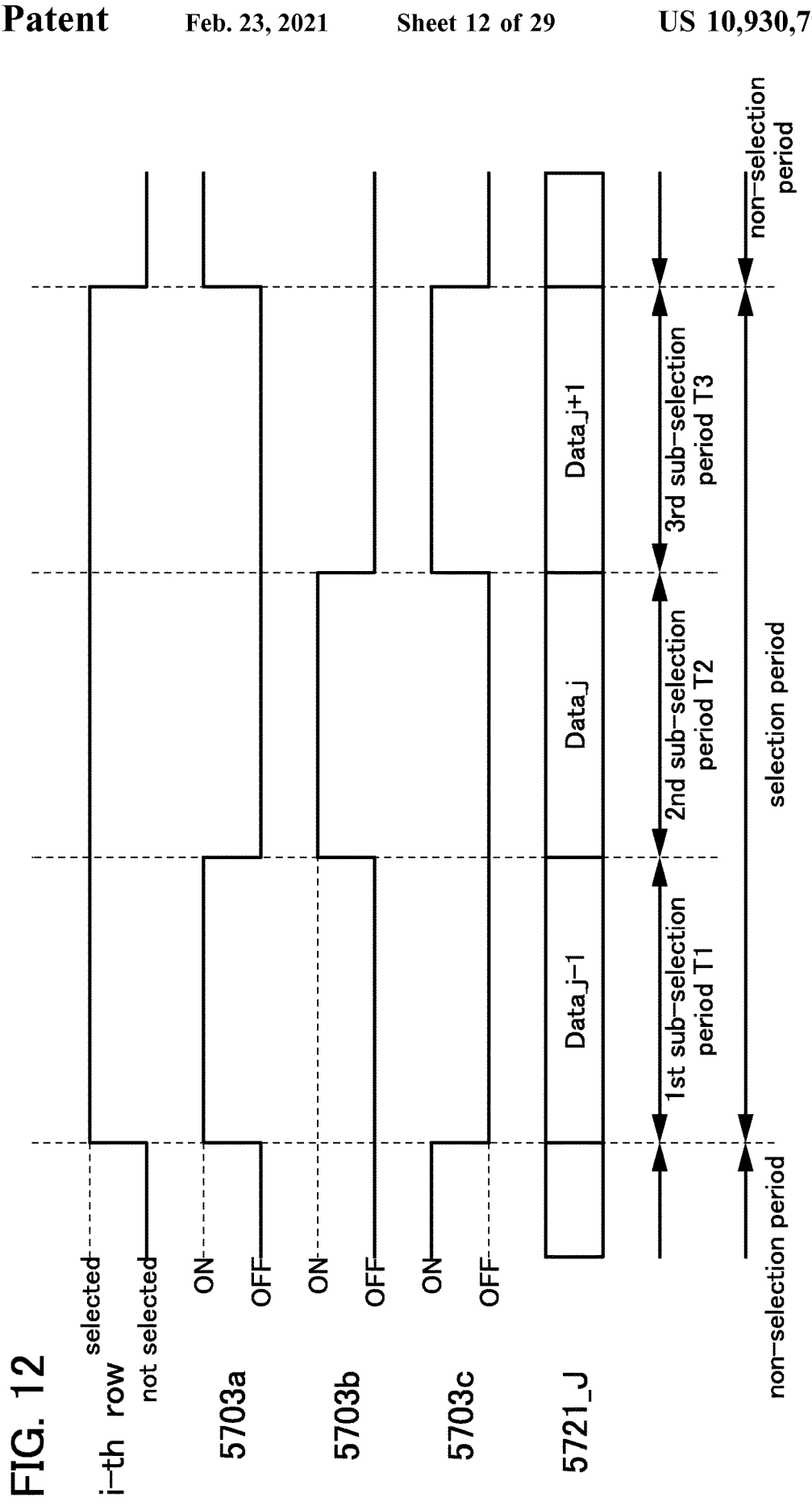
FIG. 12 is a timing chart showing operation of a signal line driver circuit.

Next, operation of the signal line driver circuit illustrated in FIG. 11 is described with reference to a timing chart in FIG. 12. Note that the timing chart in FIG. 12 shows the case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 11 operates as in FIG. 12 even when a scan line of another row is selected.

Note that the timing chart in FIG. 12 shows the case where the wiring 5621_J of the J-th column is connected to the signal line Sj−1, the signal line Sj, and the signal line Sj+1 via the first thin film transistor 5603a, the second thin film transistor 5603b, and the third thin film transistor 5603c.

The timing chart in FIG. 12 shows timing at which the scan line Gi of the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

Note that in the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. In addition, in the first sub-selection period T1, the second sub-selection period T2, and the third sub-selection period T3, the video signals input to the wiring 5621_J are denoted by Data_j−1, Data_j, and Data_j+1.

As illustrated in FIG. 12, in the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 11, by dividing one gate selection period into three, video signals can be input to three signal lines from one wiring 5621 in one gate selection period. Therefore, in the signal line driver circuit in FIG. 11, the number of connections of the substrate provided with the driver IC 5601 and the substrate provided with the pixel portion can be approximately ⅓ of the number of signal lines. The number of connections is reduced to approximately ⅓ of the number of the signal lines, so that reliability, yield, and the like of the signal line driver circuit in FIG. 11 can be improved.

Note that there are no particular limitations on the arrangement, the number, a driving method, and the like of the thin film transistors, as long as one gate selection period can be divided into a plurality of sub-selection periods and video signals can be input to a plurality of signal lines from one wiring in the respective sub-selection periods as illustrated in FIG. 11.

For example, when video signals are input to three or more signal lines from one wiring in each of three or more sub-selection periods, it is only necessary to add a thin film transistor and a wiring for controlling the thin film transistor. It is to be noted that when one selection period is divided into four or more sub-selection periods, one sub-selection period is shorter. Therefore, one selection period is desirably divided into two or three sub-selection periods.

Figure 13:
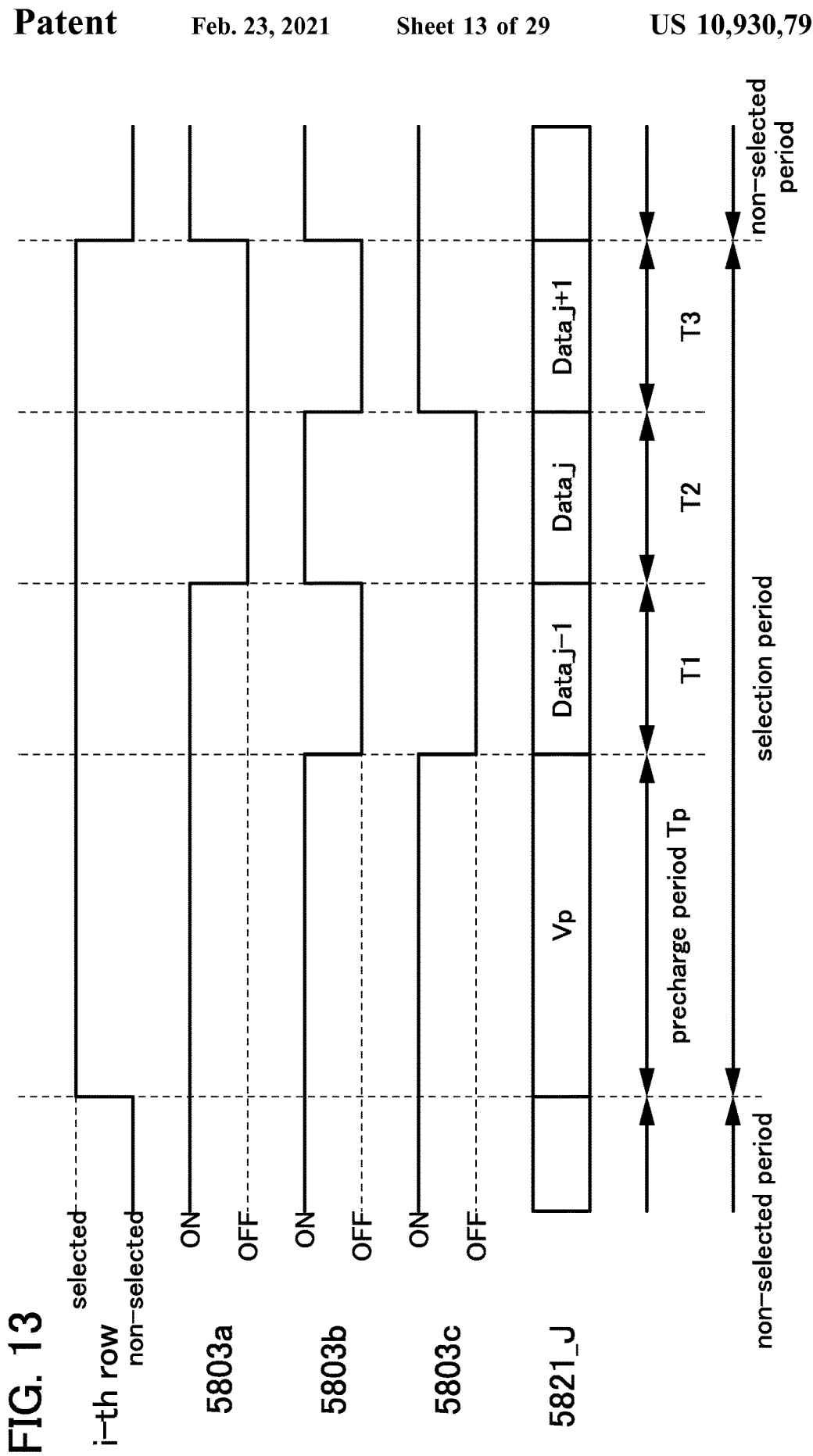
FIG. 13 is a timing chart showing operation of a signal line driver circuit.

As another example, one selection period may be divided into a precharge period Tp, the first sub-selection period T1, the second sub-selection period T2, and the third sub-selection period T3 as illustrated in a timing chart in FIG. 13. The timing chart in FIG. 13 shows timing at which the scan line Gi of the i-th row is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J of the J-th column. As illustrated in FIG. 13, the first thin film transistor 5603a, the second thin film transistor 5603b, and the third thin film transistor 5603c are tuned on in the precharge period Tp. At this time, a precharge voltage Vp input to the wiring 5621_J is input to each of the signal line Sj−1, the signal line Sj, and the signal line Sj+1 via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 11 to which the timing chart in FIG. 13 is applied, the video signal can be written to the pixel at high speed because the signal line can be precharged by providing a precharge selection period before a sub-selection period. Note that portions in FIG. 13 which are similar to those of FIG. 12 are denoted by common reference numerals and detailed description of the portions which are the same and portions which have similar functions is omitted.

Further, a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Further, since the transistors in the pixels of one line have to be turned on at the same time, a buffer through which a large current can flow can be used.

One mode of a shift register which is used for a part of a scan line driver circuit is described with reference to FIG. 14 and FIG. 15.

Figure 14:
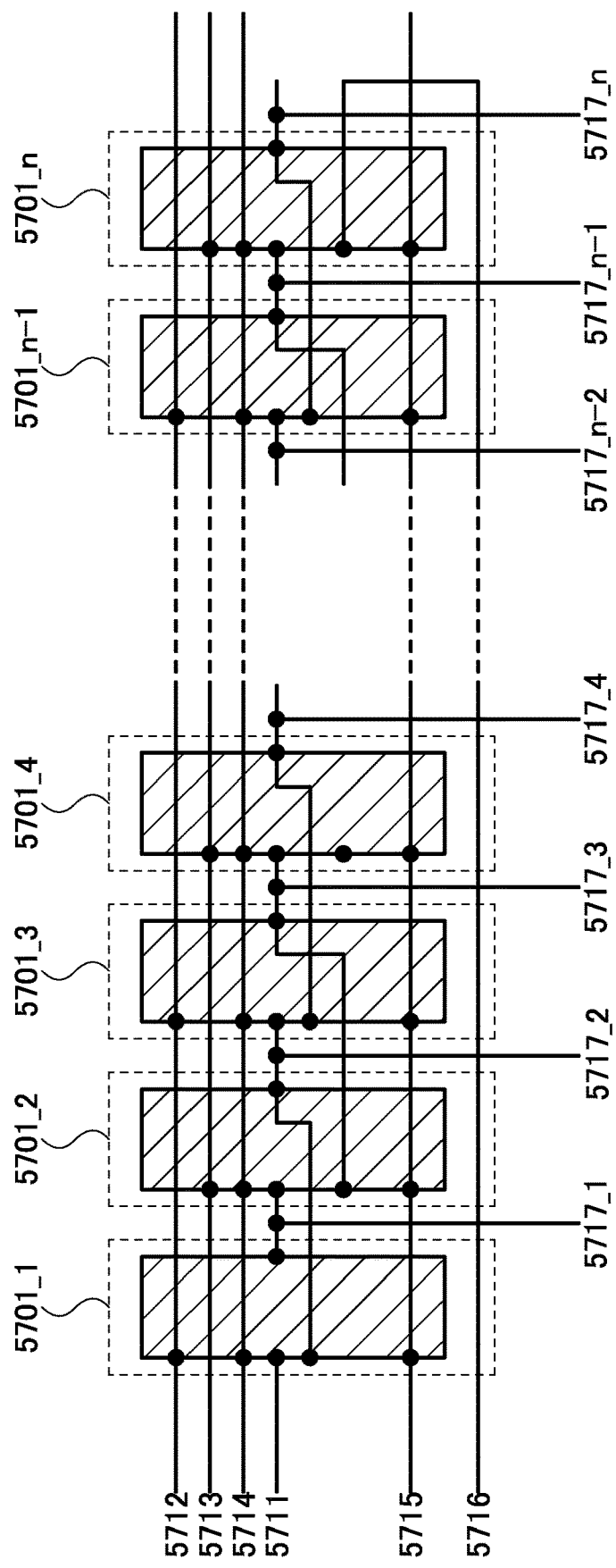
FIG. 14 is a diagram illustrating a structure of a shift register.

FIG. 14 illustrates a circuit configuration of a shift register. The shift register illustrated in FIG. 14 includes a plurality of flip-flops 5701_i (any one of flip-flops 5701_1 to 5701_n). The shift register is operated with input of a first clock signal, a second clock signal, a start pulse signal, and a reset signal.

Connection relations of the shift register in FIG. 14 are described. In the i-th stage flip-flop 5701_i (any one of the flip-flops 5701-1 to 5701_n) in the shift register of FIG. 14, a first wiring 5501 illustrated in FIG. 15 is connected to a seventh wiring 5717_i−1; a second wiring 5502 illustrated in FIG. 15 is connected to a seventh wiring 5717_i+1; a third wiring 5503 illustrated in FIG. 15 is connected to a seventh wiring 5717_i; and a sixth wiring 5506 illustrated in FIG. 15 is connected to a fifth wiring 5715.

Figure 15:
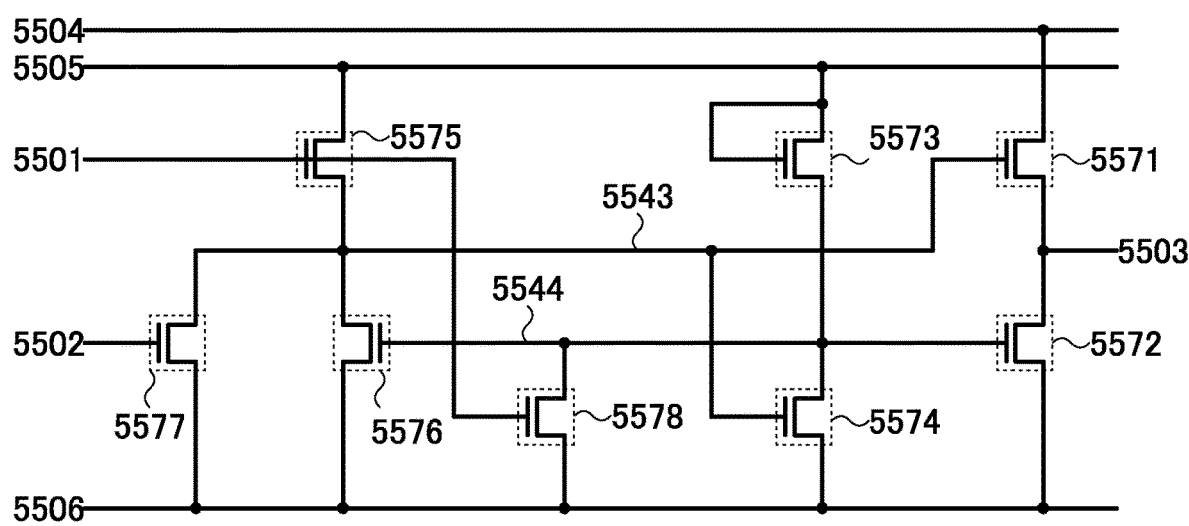
FIG. 15 is a diagram illustrating a connecting structure of flip-flops illustrated in FIG. 14.

Further, a fourth wiring 5504 illustrated in FIG. 15 is connected to a second wiring 5712 in flip-flops of odd-numbered stages, and is connected to a third wiring 5713 in flip-flops of even-numbered stages. A fifth wiring 5505 illustrated in FIG. 15 is connected to a fourth wiring 5714.

It is to be noted that the first wiring 5501 in FIG. 15 of the first stage flip-flop 5701_1 is connected to a first wiring 5711. Moreover, the second wiring 5502 in FIG. 15 of the n-th stage flip-flop 5701_n is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, FIG. 15 illustrates details of the flip-flop illustrated in FIG. 14. The flip-flop illustrated in FIG. 15 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Note that each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

Next, connection structures of the flip-flop illustrated in FIG. 14 are described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505. A second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In addition, the signal line driver circuit and the scan line driver circuit can be formed using only the n-channel TFTs described in any of Embodiments 1 to 5. The n-channel TFT described in any of Embodiments 1 to 5 has a high mobility, and thus a driving frequency of a driver circuit can be increased. Further, in the case of the n-channel TFT described in any of Embodiments 1 to 5, since parasitic capacitance is reduced by a buffer layer, frequency characteristics (also referred to as f characteristics) is excellent. For example, a scan line driver circuit using the n-channel TFT described in any of Embodiments 1 to 5 can be operated at high speed, and thus a frame frequency can be increased and insertion of black images can be realized.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving even-numbered scan lines is provided on one side and a scan line driver circuit for driving odd-numbered scan lines is provided on the opposite side; thus, increase in frame frequency can be realized.

Figure 10B:
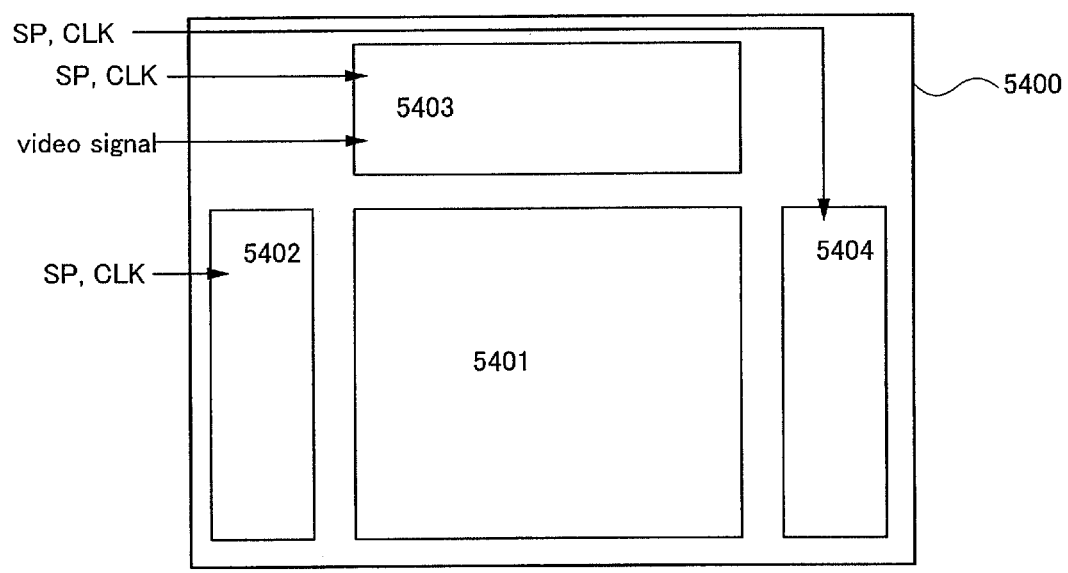

Further, when an active matrix light-emitting display device is manufactured, a plurality of thin film transistors are arranged in at least one pixel, and thus a plurality of scan line driver circuits are preferably arranged. FIG. 10B is a block diagram illustrating an example of an active matrix light-emitting display device.

The display device illustrated in FIG. 10B includes, over a substrate 5400, a pixel portion 5401 having a plurality of pixels each provided with a display element, a first scan line driver circuit 5402 and a second scan line driver circuit 5404 that selects a pixel, and a signal line driver circuit 5403 that controls input of a video signal to the selected pixel.

When the video signal input to a pixel of the display device illustrated in FIG. 10B is a digital signal, the pixel emits or does not emit light by switching of on/off of a transistor. Thus, grayscale can be displayed using an area ratio grayscale method or a time ratio grayscale method. An area ratio grayscale method refers to a driving method by which one pixel is divided into a plurality of subpixels and the subpixels are driven independently based on video signals so that grayscale is displayed. Further, a time ratio grayscale method refers to a driving method by which a period during which a pixel is in a light-emitting state is controlled so that grayscale is displayed.

Since the response speed of light-emitting elements is higher than that of liquid crystal elements or the like, the light-emitting elements are more suitable for a time ratio grayscale method than liquid-crystal display elements. Specifically, in the case of performing display with a time gray scale method, one frame period is divided into a plurality of subframe periods. Then, in accordance with video signals, the light-emitting element in the pixel is set in a light-emitting state or a non-light-emitting state in each subframe period. By dividing one frame into a plurality of subframes, the total length of time, in which pixels actually emit light in one frame period, can be controlled with video signals so that gray scales can be displayed.

In the example of the display device illustrated in FIG. 10B, in the case where two TFTs of a switching TFT and a current control TFT are arranged in one pixel, the first scan line driver circuit 5402 generates a signal which is input to a first scan line serving as a gate wiring of the switching TFT, and the second scan line driver circuit 5404 generates a signal which is input to a second scan line serving as a gate wiring of the current control TFT; however, one scan line driver circuit may generate both the signal which is input to the first scan line and the signal which is input to the second scan line. In addition, for example, there is a possibility that a plurality of the first scan lines used for controlling the operation of the switching element are provided in each pixel, depending on the number of transistors included in the switching element. In that case, one scan line driver circuit may generate all signals that are input to the plurality of first scan lines, or a plurality of scan line driver circuits may generate signals that are input to the plurality of first scan lines.

In addition, also in the light-emitting device, a part of the driver circuits that can include n-channel TFTs among driver circuits can be formed over the same substrate as the thin film transistors of the pixel portion. Alternatively, the signal line driver circuit and the scan line driver circuit can be formed using only the n-channel TFTs described in any of Embodiments 1 to 5.

Moreover, the above-described driver circuit can be used for electronic paper that drives electronic ink using an element electrically connected to a switching element, without being limited to applications to a liquid crystal display device or a light-emitting device. Electronic paper is also referred to as an electrophoretic display device (electrophoretic display) and has advantages in that it has the same level of readability as plain paper, it has lower power consumption than other display devices, and it can be made thin and lightweight.

Electrophoretic displays can have various modes. An electrophoretic display contains a plurality of microcapsules dispersed in a solvent or a solute, each of which contains first particles which are positive-charged and second particles which are negative-charged. By applying an electric field to the microcapsules, the particles in the microcapsules are moved in opposite directions to each other and only the color of the particles concentrated on one side is exhibited. Note that the first particles and the second particles each contain a pigment and do not move without an electric field. Moreover, the colors of the first particles and the second particles are different from each other (the colors include achromatic color).

In this way, an electrophoretic display is a display that utilizes a so-called dielectrophoretic effect by which a substance that has a high dielectric constant moves to a high-electric field region. An electrophoretic display does not need to use a polarizing plate and a counter substrate, which are required in a liquid crystal display device, and both the thickness and weight of the electrophoretic display device can be half of those of a liquid crystal display device.

A solution in which the aforementioned microcapsules are dispersed throughout a solvent is referred to as electronic ink. This electronic ink can be printed on a surface of glass, plastic, cloth, paper, or the like. Furthermore, with the use of a color filter or particles each containing a pigment, color display is possible, as well.

In addition, if a plurality of the aforementioned microcapsules are arranged as appropriate over an active matrix substrate so as to be interposed between two electrodes, an active matrix display device can be completed, and display can be performed by application of an electric field to the microcapsules. For example, the active matrix substrate obtained in Embodiment 2 can be used.

Note that the first particles and the second particles in the microcapsules may each be formed using a single material selected from a conductive material, an insulating material, a semiconductor material, a magnetic material, a liquid crystal material, a ferroelectric material, an electroluminescent material, an electrochromic material, or a magnetophoretic material or formed of a composite material of any of these.

Embodiment 8

A thin film transistor according to an embodiment of the present invention is manufactured, and a semiconductor device having a display function (also referred to as a display device) can be manufactured using the thin film transistor for a pixel portion and further for a driver circuit. Further, part or whole of a driver circuit can be formed over the same substrate as a pixel portion, using a thin film transistor according to an embodiment of the present invention, whereby a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by a current or a voltage, and specifically include an inorganic electroluminescent (EL) element, an organic EL element, and the like. Further, a display medium whose contrast is changed by an electric effect, such as an electronic ink, can be used.

In addition, the display device includes a panel in which the display element is sealed, and a module in which an IC including a controller or the like is mounted on the panel. An embodiment of the present invention relates to one mode of an element substrate before the display element is completed in a manufacturing process of the display device, and the element substrate is provided with means for supplying a current to the display element in each of a plurality of pixels. Specifically, the element substrate may be in a state provided with only a pixel electrode of the display element, a state after a conductive film to be a pixel electrode is formed and before the conductive film is etched to form the pixel electrode, or any of other states.

Note that a display device in this specification means an image display device, a display device, or a light source (including a lighting device). Further, the display device includes any of the following modules in its category: a module to which a connector such as a flexible printed circuit (FPC), tape automated bonding (TAB) tape, or a tape carrier package (TCP) is attached; a module having TAB tape or a TCP which is provided with a printed wiring board at the end thereof; and a module having an integrated circuit (IC) which is directly mounted on a display element by a chip on glass (COG) method.

In this embodiment, a liquid crystal display device will be described as an example of a semiconductor device according to an embodiment of the present invention.

Figure 16A:
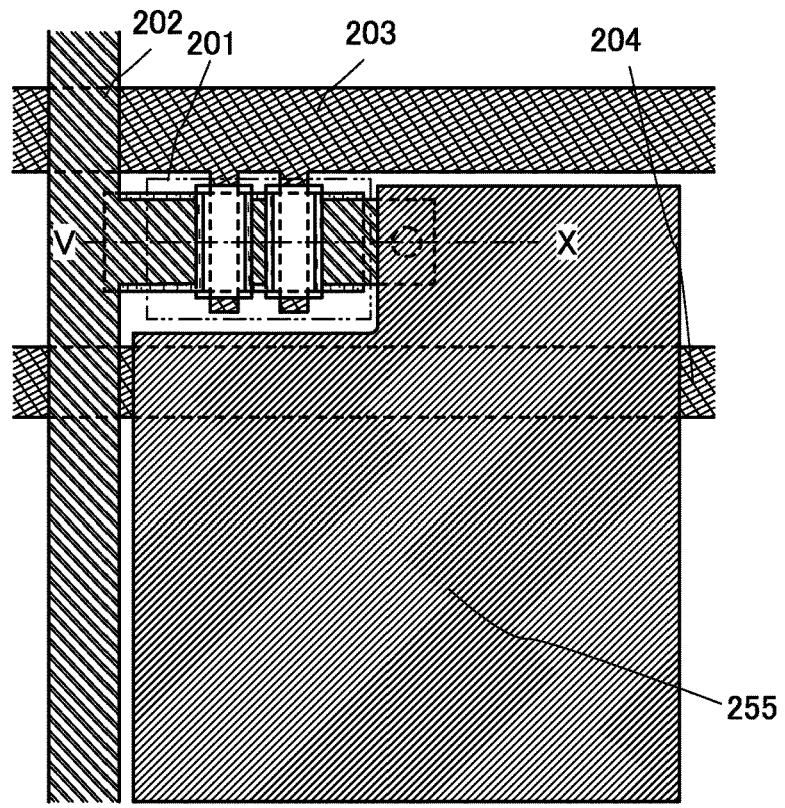
FIGS. 16A and 16B are views illustrating a liquid crystal display device to which an embodiment of the present invention is applied.
Figure 16B:
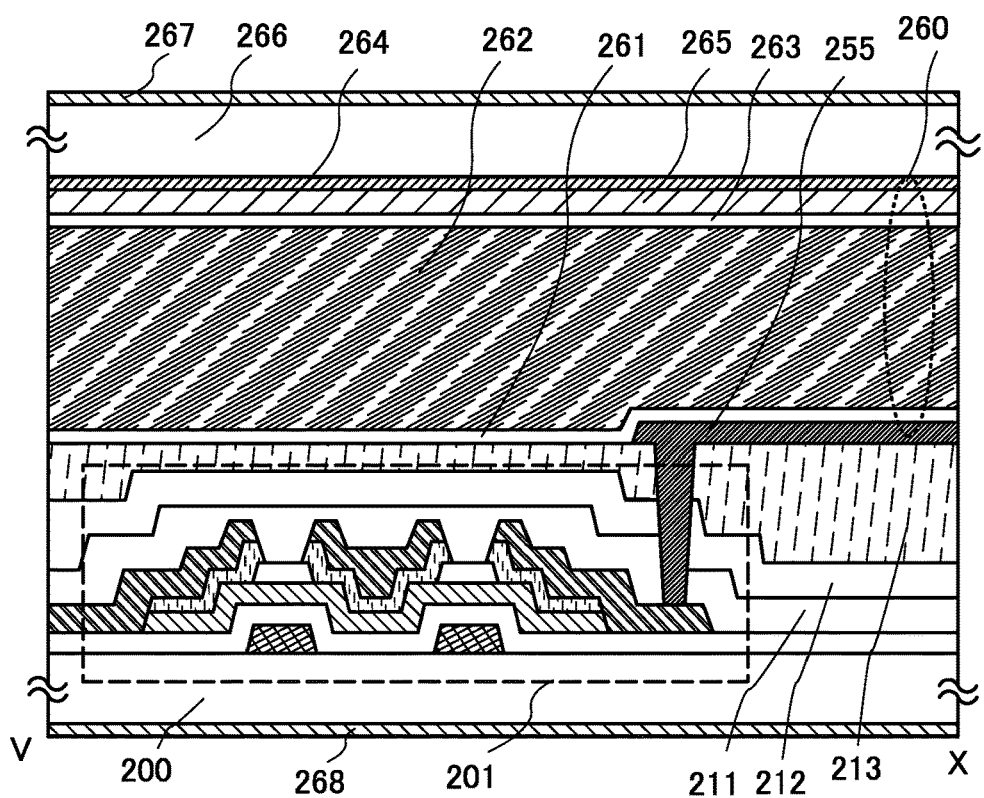

FIGS. 16A and 16B illustrate an active-matrix liquid crystal display device to which an embodiment of the present invention is applied. FIG. 16A is a plan view of the liquid crystal display device. FIG. 16B is a cross-sectional view taken along line V-X of FIG. 16A. A thin film transistor 201 used in the semiconductor device can be manufactured similarly to the thin film transistor described in Embodiment 4 and is a highly reliable thin film transistor including an IGZO semiconductor layer and a buffer layer formed using an oxide semiconductor layer having n-type conductivity and containing In, Ga, and Zn. Any of the thin film transistors described in Embodiments 1, 3, and 5 can also be used as the thin film transistor 201 of this embodiment.

The liquid crystal display device of this embodiment in FIG. 16A includes a source wiring layer 202, an inverted-staggered thin film transistor 201 with a multi-gate structure, a gate wiring layer 203, and a capacitor wiring layer 204.

Further, in FIG. 16B, in the liquid crystal display device of this embodiment, a substrate 200 provided with the thin film transistor 201 with a multi-gate structure, an insulating layer 211, an insulating layer 212, an insulating layer 213, an electrode layer 255 used for a display element, an insulating layer 261 serving as an alignment film, and a polarizing plate 268 and a substrate 266 provided with an insulating layer 263 serving as an alignment film, an electrode layer 265 used for a display element, a coloring layer 264 serving as a color filter, and a polarizing plate 267 face to each other with a liquid crystal layer 262 interposed therebetween; thus, a liquid crystal display element 260 is formed.

Although FIGS. 16A and 16B illustrate an example of a transmissive liquid crystal display device, an embodiment of the present invention can also be applied to a reflective liquid crystal display device and a transflective liquid crystal display device.

While FIGS. 16A and 16B illustrate an example of the liquid crystal display device in which the polarizing plate 267 is provided in a position outer than the substrate 266 (on the viewer side) and the coloring layer 264 and the electrode layer 265 used for a display element are provided in a position inner than the substrate 266 in that order, the polarizing plate 267 may be provided in a position inner than the substrate 266. The layered structure of the polarizing plate and the coloring layer is not limited to that shown in FIG. 16B and may be set as appropriate depending on materials of the polarizing plate and the coloring layer or conditions of manufacturing steps. Further, a light-blocking film serving as a black matrix may be provided.

The electrode layers 255 and 265 each serving as a pixel electrode layer can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can be used for the electrode layers 255 and 265. The pixel electrode formed using the conductive composition preferably has a sheet resistance of 10000 ohms per square or less and a transmittance of 70% or more at a wavelength of 550 nm. Further, the resistance of the conductive high molecule contained in the conductive composition is preferably 0.1 $\Omega \cdot cm$ or less.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Through the above process, a highly reliable liquid crystal display device as a semiconductor device can be manufactured.

This embodiment can be implemented by being combined with any of the structures described in other embodiments, as appropriate.

Embodiment 9

In this embodiment, an example of electronic paper will be described as a semiconductor device according to an embodiment of the present invention.

Figure 17:
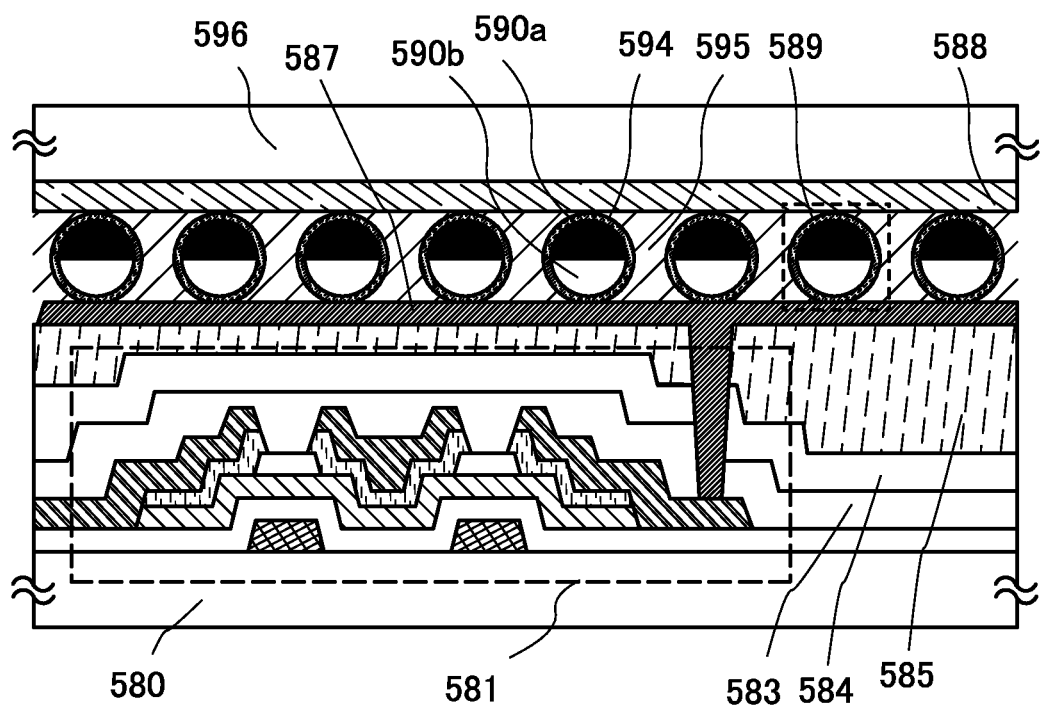
FIG. 17 is a view illustrating electronic paper to which an embodiment of the present invention is applied.

FIG. 17 illustrates active matrix electronic paper as an example of a semiconductor device to which an embodiment of the present invention is applied. A thin film transistor 581 used for the semiconductor device can be manufactured similarly to the thin film transistor described in Embodiment 4 and is a highly reliable thin film transistor including an IGZO semiconductor layer and a buffer layer formed using an oxide semiconductor layer having n-type conductivity and containing In, Ga, and Zn. Alternatively, any of the thin film transistors described in Embodiments 1, 3, and 4 may be used as the thin film transistor 581 of this embodiment.

The electronic paper in FIG. 17 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 is an inverted-staggered thin film transistor with a multi-gate structure, and a source electrode and a drain electrode thereof is in contact with a first electrode layer 587 at an opening formed in an insulating layer 585, whereby the thin film transistor 581 is electrically connected to the first electrode layer 587. Between the first electrode layer 587 and a second electrode layer 588, spherical particles 589 each having a black region 590a, a white region 590b, and a cavity 594 around the regions, which is filled with liquid, are provided. A space around the spherical particles 589 is filled with a filler 595 such as a resin (see FIG. 17).

In FIG. 17, an electrode layer containing a light-transmitting conductive high molecule is used as the first electrode layer. An inorganic insulating film is provided over the first electrode layer 587. The inorganic insulating film serves as a barrier film which prevents ionic impurities from diffusing from the first electrode layer 587.

Further, instead of the twisting ball, an electrophoretic element may be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles move to opposite sides from each other, so that white or black can be displayed. A display element using this principle is an electrophoretic display element and is called electronic paper in general. The electrophoretic display element has higher reflectance than a liquid crystal display element and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to as a display device simply or a semiconductor device provided with a display device) is distanced from an electric wave source.

Through the above process, highly reliable electronic paper as a semiconductor device can be manufactured.

This embodiment can be implemented by being combined with any of the structures described in other embodiments, as appropriate.

Embodiment 10

In this embodiment, an example of a light-emitting display device will be described as a semiconductor device according an embodiment of the present invention. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, and a current flows. The carriers (electrons and holes) are recombined and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 18A:
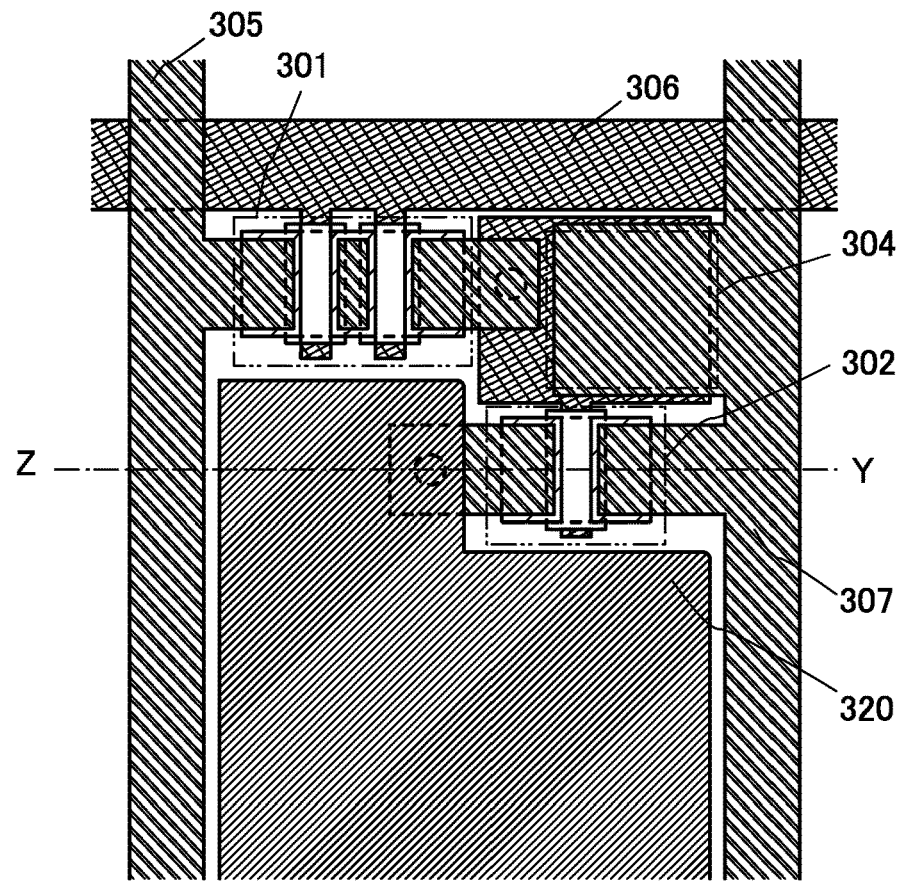
FIGS. 18A and 18B are views illustrating a light-emitting display device to which an embodiment of the present invention is applied.
Figure 18B:
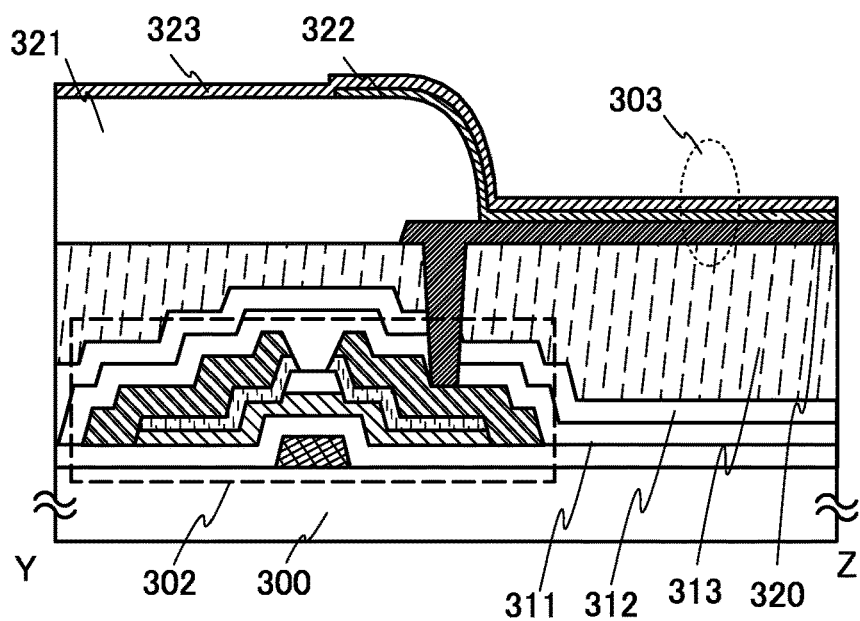

FIGS. 18A and 18B illustrate an active-matrix light-emitting display device as an example of a semiconductor device to which an embodiment of the present invention is applied. FIG. 18A is a plan view of the light-emitting display device, and FIG. 18B is a cross-sectional view taken along line Y-Z of FIG. 18A. Note that FIG. 19 illustrates an equivalent circuit of the light-emitting display device illustrated in FIGS. 18A and 18B.

Thin film transistors 301 and 302 used for a semiconductor device can be manufactured similarly to any of the thin film transistors described in Embodiments 1 and 2 and are highly reliable thin film transistors each including an IGZO semiconductor layer and a buffer layer formed using an oxide semiconductor layer having n-type conductivity and containing In, Ga, and Zn. Alternatively, any of the thin film transistors described in Embodiments 3 to 5 may be used as the thin film transistors 301 and 302 of this embodiment.

Figure 19:
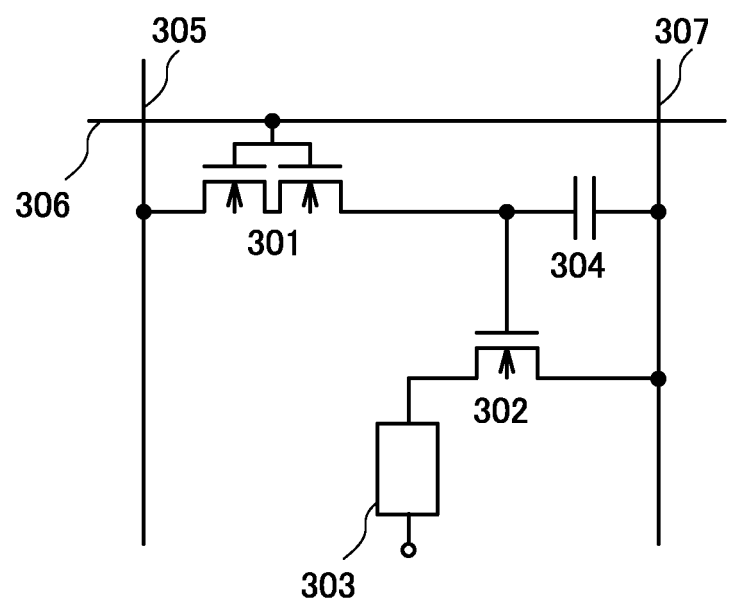
FIG. 19 is a diagram illustrating a light-emitting display device to which an embodiment of the present invention is applied.

The light-emitting display device of this embodiment illustrated in FIG. 18A and FIG. 19 includes the thin film transistors 301 and 302 with a multi-gate structure, a light-emitting element 303, a capacitor element 304, a source wiring layer 305, a gate wiring layer 306, and a power supply line 307. The thin film transistors 301 and 302 are n-channel thin film transistors.

In FIG. 18B, the light-emitting display device of this embodiment includes the thin film transistor 302; an insulating layer 311; an insulating layer 312; an insulating layer 313; a partition wall 321; and a first electrode layer 320, an electroluminescent layer 322, and a second electrode layer 323 which are used for the light-emitting element 303.

The insulating layer 313 is preferably formed using an organic resin such as acrylic, polyimide, or polyamide or using siloxane.

Since the thin film transistor 302 in the pixel is n-type in this embodiment, a cathode is desirably used as the first electrode layer 320 which is a pixel electrode layer. Specifically, for the cathode, a material with a low work function such as Ca, Al, CaF, MgAg, or AlLi can be used.

The partition wall 321 is formed using an organic resin film, an inorganic insulating film, or organic polysiloxane. It is particularly preferable that the partition wall 321 be formed using a photosensitive material and an opening be formed over the first electrode layer 320 so that a sidewall of the opening is formed as an inclined surface with continuous curvature.

The electroluminescent layer 322 may be formed using a single layer or a plurality of layers stacked.

The second electrode layer 323 is formed as an anode to cover the electroluminescent layer 322. The second electrode layer 323 can be formed using a light-transmitting conductive film using any of the light-transmitting conductive materials listed in Embodiment 7 for the pixel electrode layer. The second electrode layer 323 may be formed using a titanium nitride film or a titanium film instead of the above-described light-transmitting conductive film. The light-emitting element 303 is formed by overlapping of the first electrode layer 320, the electroluminescent layer 322, and the second electrode layer 323. After that, a protective film may be formed over the second electrode layer 323 and the partition wall 321 in order to prevent entry of the air (oxygen, hydrogen, moisture, carbon dioxide, or the like) into the light-emitting element 303. As the protective film, a silicon nitride film, a silicon nitride oxide film, a DLC film, or the like can be formed.

Further, in a practical case, it is preferable that a display device completed up to the state illustrated in FIG. 18B be packaged (sealed) with a protective film (such as a laminate film or an ultraviolet curable resin film) or a cover material with high air-tightness and little degasification so that the display device is not exposed to the outside air.

Next, structures of the light-emitting element will be described with reference to FIGS. 20A to 20C. A cross-sectional structure of a pixel will be described by taking an n-channel driving TFT as an example. Driving TFTs 7001, 7011, and 7021 used for the semiconductor devices illustrated in FIGS. 20A to 20C can be manufactured similarly to the thin film transistor described in Embodiment 1 and are highly reliable thin film transistors each having an IGZO semiconductor layer and a buffer layer formed using an oxide semiconductor layer having n-type conductivity and containing In, Ga, and Zn. Alternatively, any of the thin film transistors described in Embodiments 2 to 4 can be used as the driving TFTs 7001, 7011, and 7021.

In order to extract light emitted from the light-emitting element, at least one of the anode and the cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure according to an embodiment of the present invention can be applied to a light-emitting element having any of these emission structures.

A light-emitting element having a top emission structure will be described with reference to FIG. 20A.

Figure 20A:
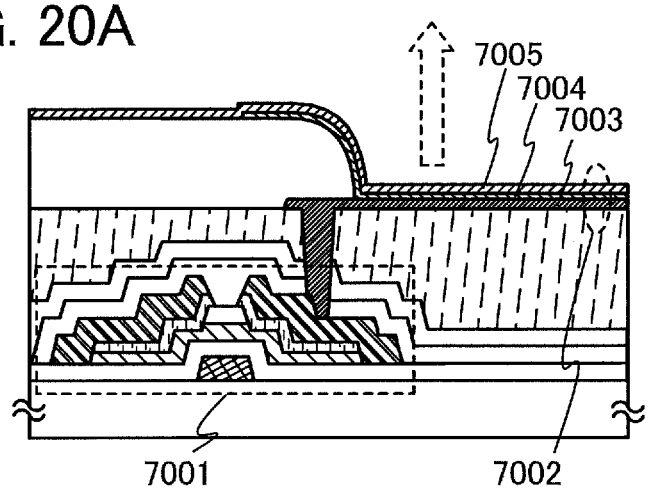
FIGS. 20A to 20C are views each illustrating a light-emitting display device to which an embodiment of the present invention is applied.

FIG. 20A is a cross-sectional view of a pixel in the case where the driving TFT 7001 is of an n-type and light is emitted from a light-emitting element 7002 to an anode 7005 side. In FIG. 20A, a cathode 7003 of the light-emitting element 7002 is electrically connected to the driving TFT 7001, and a light-emitting layer 7004 and the anode 7005 are stacked in this order over the cathode 7003. The cathode 7003 can be formed using any of a variety of conductive materials as long as it has a low work function and reflect light. For example, Ca, Al, CaF, MgAg, AlLi, or the like is desirably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. Note that it is not necessary to form all of these layers. The anode 7005 is formed using a light-transmitting conductive film such as a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the case of the pixel illustrated in FIG. 20A, light is emitted from the light-emitting element 7002 to the anode 7005 side as indicated by an arrow.

Next, a light-emitting element having a bottom emission structure will be described with reference to FIG. 20B. FIG. 20B is a cross-sectional view of a pixel in the case where the driving TFT 7011 is of an n-type and light is emitted from a light-emitting element 7012 to a cathode 7013 side. In FIG. 20B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. Note that a light-blocking film 7016 for reflecting or blocking light may be formed to cover the anode 7015 when the anode 7015 has a light-transmitting property. For the cathode 7013, various materials can be used as in the case of FIG. 20A as long as they are conductive materials having a low work function. It is to be noted that the cathode 7013 is formed to have a thickness that can transmit light (preferably, approximately 5 nm to 30 nm). For example, an aluminum film with a thickness of 20 nm can be used as the cathode 7013. In a similar manner to the case of FIG. 20A, the light-emitting layer 7014 may be formed using either a single layer or a plurality of layers stacked. The anode 7015 is not required to transmit light, but can be formed using a light-transmitting conductive material as in the case of FIG. 20A. As the light-blocking film 7016, a metal or the like that reflects light can be used for example; however, it is not limited to a metal film. For example, a resin or the like to which black pigments are added may alternatively be used.

The light-emitting element 7012 corresponds to a region where the cathode 7013 and the anode 7015 sandwich the light-emitting layer 7014. In the case of the pixel illustrated in FIG. 20B, light is emitted from the light-emitting element 7012 to the cathode 7013 side as indicated by an arrow.

Next, a light-emitting element having a dual emission structure will be described with reference to FIG. 20C. In FIG. 20C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 20A, the cathode 7023 can be formed using any of a variety of conductive materials as long as it has a low work function. It is to be noted that the cathode 7023 is formed to have a thickness that can transmit light. For example, a film of Al having a thickness of 20 nm can be used as the cathode 7023. As in FIG. 20A, the light-emitting layer 7024 may be formed using either a single layer or a plurality of layers stacked. The anode 7025 can be formed using a light-transmitting conductive material as in the case of FIG. 20A.

The light-emitting element 7022 corresponds to a region where the cathode 7023, the light-emitting layer 7024, and the anode 7025 overlap with one another. In the case of the pixel illustrated in FIG. 20C, light is emitted from the light-emitting element 7022 to both the anode 7025 side and the cathode 7023 side as indicated by arrows.

Note that, although an organic EL element is described here as a light-emitting element, an inorganic EL element can alternatively be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 20B:
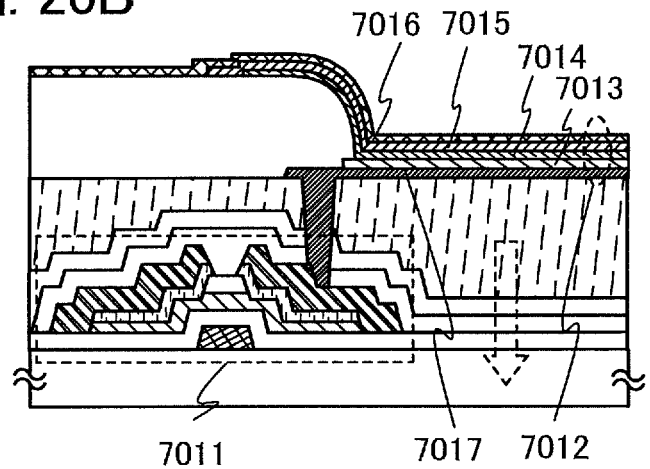
Figure 20C:
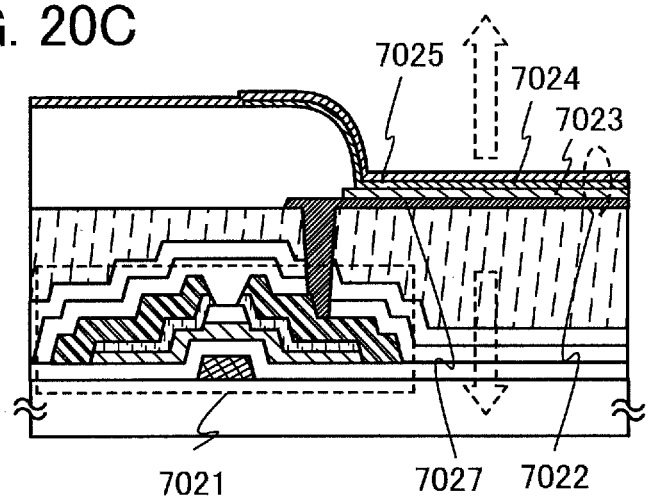

A semiconductor device described in this embodiment is not limited to the structures illustrated in FIGS. 20A to 20C and can be modified in various ways based on the spirit of techniques according to the present invention.

Through the above process, a highly reliable light-emitting display device as a semiconductor device can be manufactured.

This embodiment can be implemented by being combined with any of the structures described in other embodiments, as appropriate.

Embodiment 11

Next, a structure of a display panel, which is an embodiment of the semiconductor device of the present invention, will be described below. In this embodiment, a liquid crystal display panel (also referred to as a liquid crystal panel), which is an embodiment of a liquid crystal display device having a liquid crystal element as a display element, and a light-emitting display panel (also referred to as a light-emitting panel), which is an embodiment of a semiconductor device having a light-emitting element as a display element, will be described.

Figure 21A:
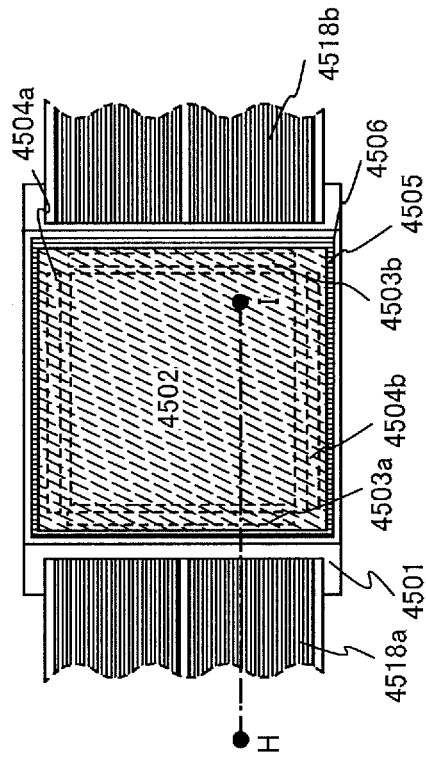
FIGS. 21A and 21B are views illustrating a light-emitting display device to which an embodiment of the present invention is applied.
Figure 21B:
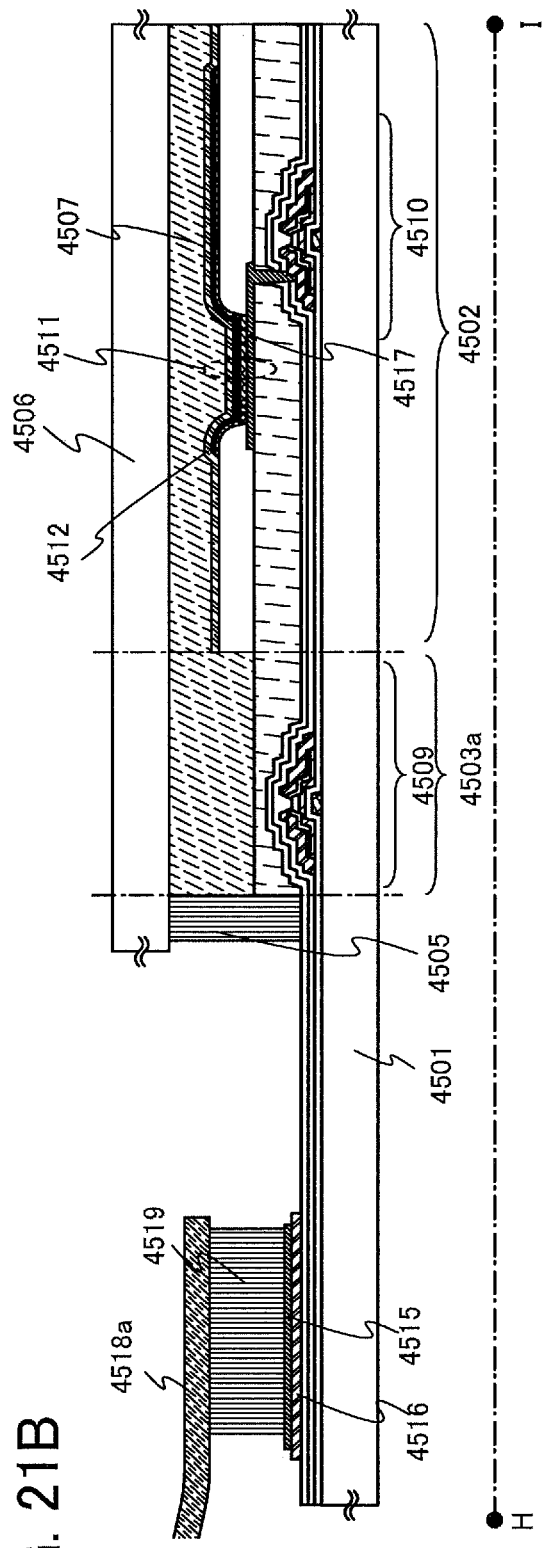

Next, the appearance and a cross section of a light-emitting display panel, which is an embodiment of the semiconductor device of the present invention, will be described with reference to FIGS. 21A and 21B. FIG. 21A is a top view of a panel in which a highly reliable thin film transistor including an IGZO semiconductor layer and a buffer layer formed using an oxide semiconductor layer having n-type conductivity and containing In, Ga, and Zn and a light-emitting element are sealed between a first substrate and a second substrate with a sealant. FIG. 21B is a cross-sectional view taken along line H-I of FIG. 21A.

A sealant 4505 is provided so as to surround a pixel portion 4502, signal line driver circuits 4503*a* and 4503*b*, and scan line driver circuits 4504*a* and 4504*b* which are provided over a first substrate 4501. In addition, a second substrate 4506 is provided over the pixel portion 4502, the signal line driver circuits 4503*a* and 4503*b*, and the scan line driver circuits 4504*a* and 4504*b*. Accordingly, the pixel portion 4502, the signal line driver circuits 4503*a* and 4503*b*, and the scan line driver circuits 4504*a* and 4504*b* are sealed together with a filler 4507, by the first substrate 4501, the sealant 4505, and the second substrate 4506.

The pixel portion 4502, the signal line driver circuits 4503*a* and 4503*b*, and the scan line driver circuits 4504*a* and 4504*b* formed over the first substrate 4501 each include a plurality of thin film transistors, and a thin film transistor 4510 included in the pixel portion 4502 and a thin film transistor 4509 included in the signal line driver circuit 4503*a* are illustrated as an example in FIG. 21B.

Each of the thin film transistors 4509 and 4510 corresponds to a thin film transistor including an IGZO semiconductor layer and a buffer layer formed using an oxide semiconductor layer having n-type conductivity and containing In, Ga, and Zn, and any of the thin film transistors described in Embodiments 1 to 5 can be used as the thin film transistors 4509 and 4510. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the structure of the light-emitting element 4511 is not limited to that described in this embodiment. The structure of the light-emitting element 4511 can be changed as appropriate depending on the direction in which light is extracted from the light-emitting element 4511, or the like.

In addition, a variety of signals and a potential are supplied to the signal line driver circuits 4503*a* and 4503*b*, the scan line driver circuits 4504*a* and 4504*b*, or the pixel portion 4502 from FPCs 4518*a* and 4518*b*.

In this embodiment, a wiring 4516 is formed using the same material as that of the source electrode layer or the drain electrode layer. The wiring 4516 is connected to the pixel portion 4502, the signal line driver circuits 4503*a* and 4503*b*, or the scan line driver circuits 4504*a* and 4504*b* through a contact hole (not illustrated) provided in an insulating film that covers the thin film transistors 4509 and 4510. In addition, a connection terminal 4515 is formed over the wiring 4516 that is provided over an edge portion of the first substrate 4501, by using the same material as that of the first electrode layer 4517.

The connection terminal 4515 is electrically connected to a terminal included in the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, instead of an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler 4507.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Driver circuits formed using a single crystal semiconductor film or polycrystalline semiconductor film over a substrate separately prepared may be mounted as the signal line driver circuits 4503a and 4503b and the scan line driver circuits 4504a and 4504b. Alternatively, only the signal line driver circuits or part thereof, or the scan line driver circuits or part thereof may be separately formed and mounted. This embodiment is not limited to the structure illustrated in FIGS. 21A and 21B.

Next, the appearance and a cross section of a liquid crystal display panel, which is an embodiment of the semiconductor device of the present invention, will be described with reference to FIGS. 22A1, 22A2, and 22B. FIGS. 22A1 and 22A2 are each a top view of a panel in which highly reliable thin film transistors 4010 and 4011 each having an IGZO semiconductor layer and a buffer layer formed using an oxide semiconductor layer having n-type conductivity and containing In, Ga, and Zn, and a liquid crystal element 4013 are sealed between a first substrate 4001 and a second substrate 4006 with a sealant 4005. FIG. 22B is a cross-sectional view taken along line M-N of FIGS. 22A1 and 22A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with liquid crystal 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 22A1 illustrates an example of mounting the signal line driver circuit 4003 by a COG method, and FIG. 22A2 illustrates an example of mounting the signal line driver circuit 4003 by a TAB method.

The pixel portion 4002 and the scan line driver circuit 4004 provided over the first substrate 4001 include a plurality of thin film transistors. FIG. 22B illustrates the thin film transistor 4010 included in the pixel portion 4002 and the thin film transistor 4011 included in the scan line driver circuit 4004.

Each of the thin film transistors 4010 and 4011 corresponds to a thin film transistor including an IGZO semiconductor layer and a buffer layer formed using an oxide semiconductor layer having n-type conductivity and containing In, Ga, and Zn, and any of the thin film transistors described in Embodiments 1 to 5 can be used as the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and sandwich the liquid crystal layer 4008 with the insulating layers 4032 and 4033 interposed between the pixel electrode layer 4030 and the counter electrode layer 4031.

Note that the first substrate 4001 and the second substrate 4006 can be formed by using glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films may be used.

Reference numeral 4035 denotes a columnar spacer obtained by selectively etching an insulating film and is provided to control the distance between the pixel electrode layer 4030 and the counter electrode layer 4031 (a cell gap). Further, a spherical spacer may alternatively be used.

Further, a variety of signals and a potential are supplied to the signal line driver circuit 4003 which is formed separately, the scan line driver circuit 4004, or the pixel portion 4002 from an FPC 4018.

In this embodiment, a connection terminal 4015 is formed using the same conductive film as that of the pixel electrode layer 4030 included in the liquid crystal element 4013, and a wiring 4016 is formed using the same conductive film as that of gate electrode layers of the thin film transistors 4010 and 4011.

The connection terminal 4015 is electrically connected to a terminal included in the FPC 4018 through an anisotropic conductive film 4019.

Further, FIGS. 22A and 22B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 23:
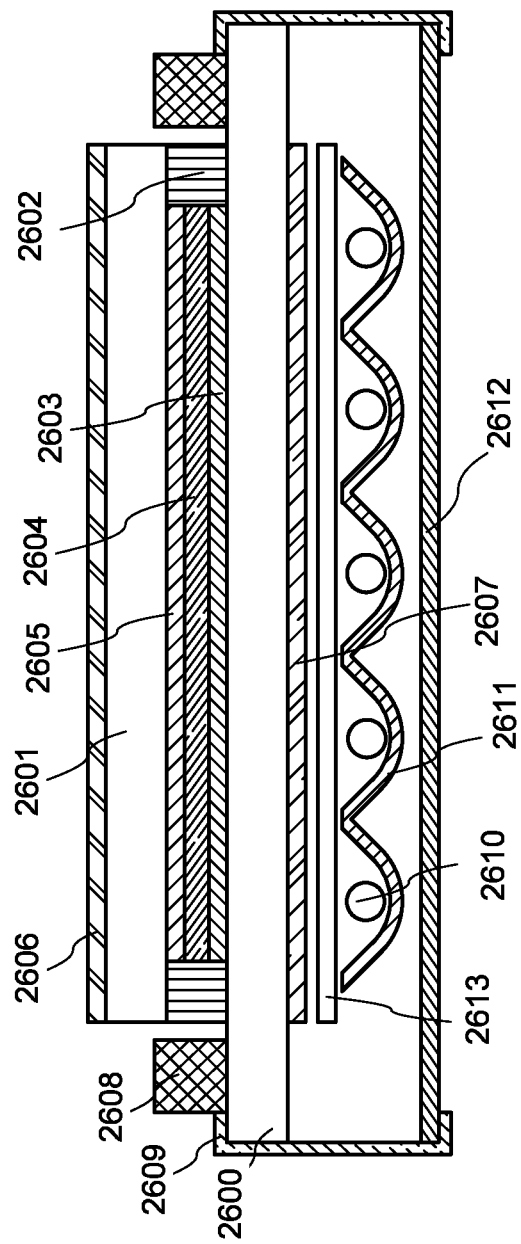
FIG. 23 is a view illustrating a liquid crystal display device to which an embodiment of the present invention is applied.

FIG. 23 illustrates an example in which a liquid crystal display module is formed as a semiconductor device by using a TFT substrate 2600 manufactured according to an embodiment of the present invention.

FIG. 23 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (anti-ferroelectric liquid crystal) mode, or the like can be used.

Through the above process, a highly reliable display panel as a semiconductor device can be manufactured.

This embodiment can be implemented by being combined with any of the structures described in other embodiments, as appropriate.

Embodiment 12

A semiconductor device according to an embodiment of the present invention can be applied to a variety of electronic appliances (including an amusement machine). Examples of electronic appliances are a television set (also referred to as a television or a television receiver), a monitor of a computer or the like, electronic paper, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like. In particular, a liquid crystal display device, a light-emitting device, an electrophoretic display device, or the like to which a thin film transistor according to an embodiment of the present invention is applied as described in Embodiments 8 to 11 can be used for a display portion of an electronic appliance. Specific examples will be described below.

A semiconductor device according to an embodiment of the present invention can be applied to electronic paper as described in Embodiment 9. Electronic paper can be used for electronic appliances of a variety of fields as long as they can display data. For example, electronic paper can be applied to an electronic book (e-book), a poster, a transportation advertisement in a vehicle such as a train, displays of various cards such as a credit card, and the like. Examples of the electronic appliances are illustrated in FIGS. 24A, 24B, and FIG. 25.

Figure 24A:
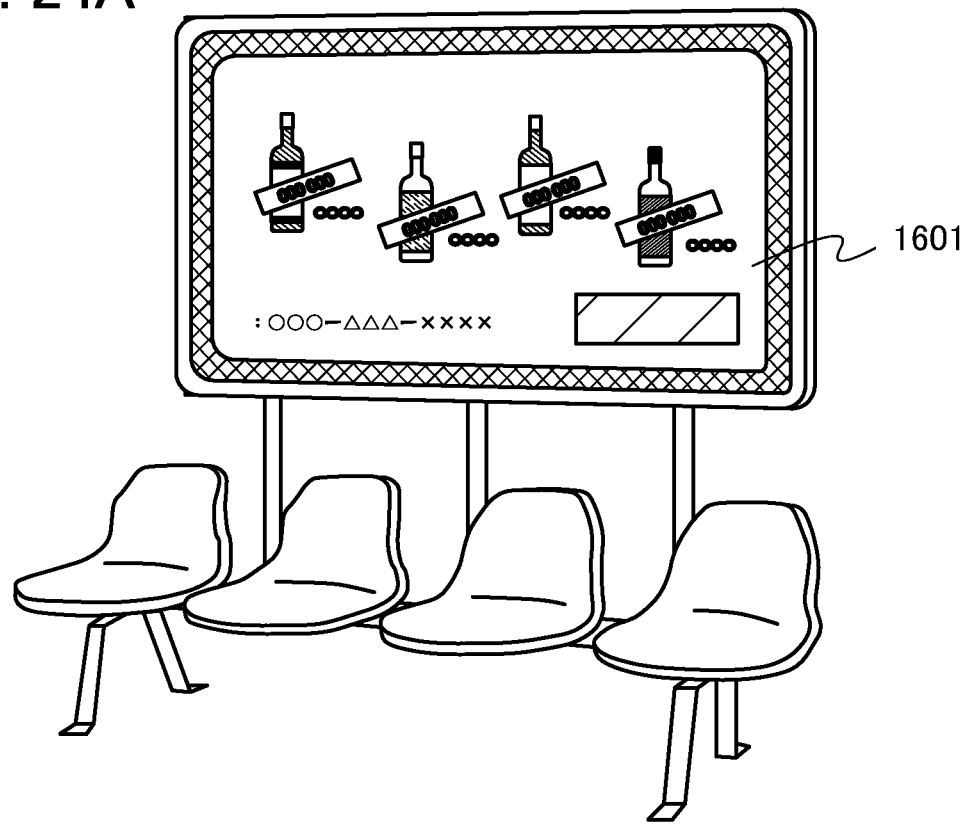
FIGS. 24A and 24B are diagrams each illustrating an electronic appliance to which an embodiment of the present invention is applied.

FIG. 24A illustrates a poster 1601 formed using electronic paper. In the case where an advertising medium is printed paper, the advertisement is replaced by manpower; however, by using electronic paper to which a semiconductor device according to an embodiment of the present invention is applied, the advertising display can be changed in a short time. Further, since a thin film transistor having excellent electric characteristics is used, an image can be stably displayed without being distorted. Note that the poster may transmit and receive data wirelessly.

Figure 24B:
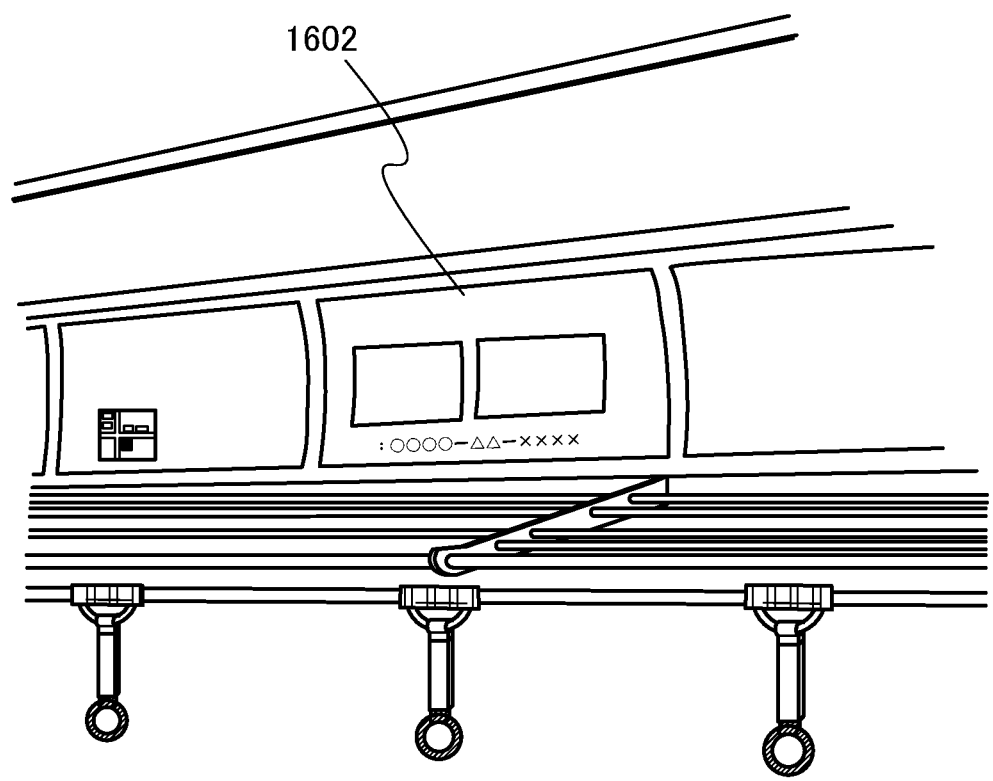

FIG. 24B illustrates an advertisement 1602 in a vehicle such as a train. In the case where an advertising medium is printed paper, the advertisement is replaced by manpower; however, by using electronic paper to which a semiconductor device according to an embodiment of the present invention is applied, the advertising display can be changed in a short time without a lot of manpower. Further, since a thin film transistor having excellent electric characteristics is used, an image can be stably displayed without being distorted. Note that the advertisement in a vehicle may transmit and receive data wirelessly.

Figure 25:
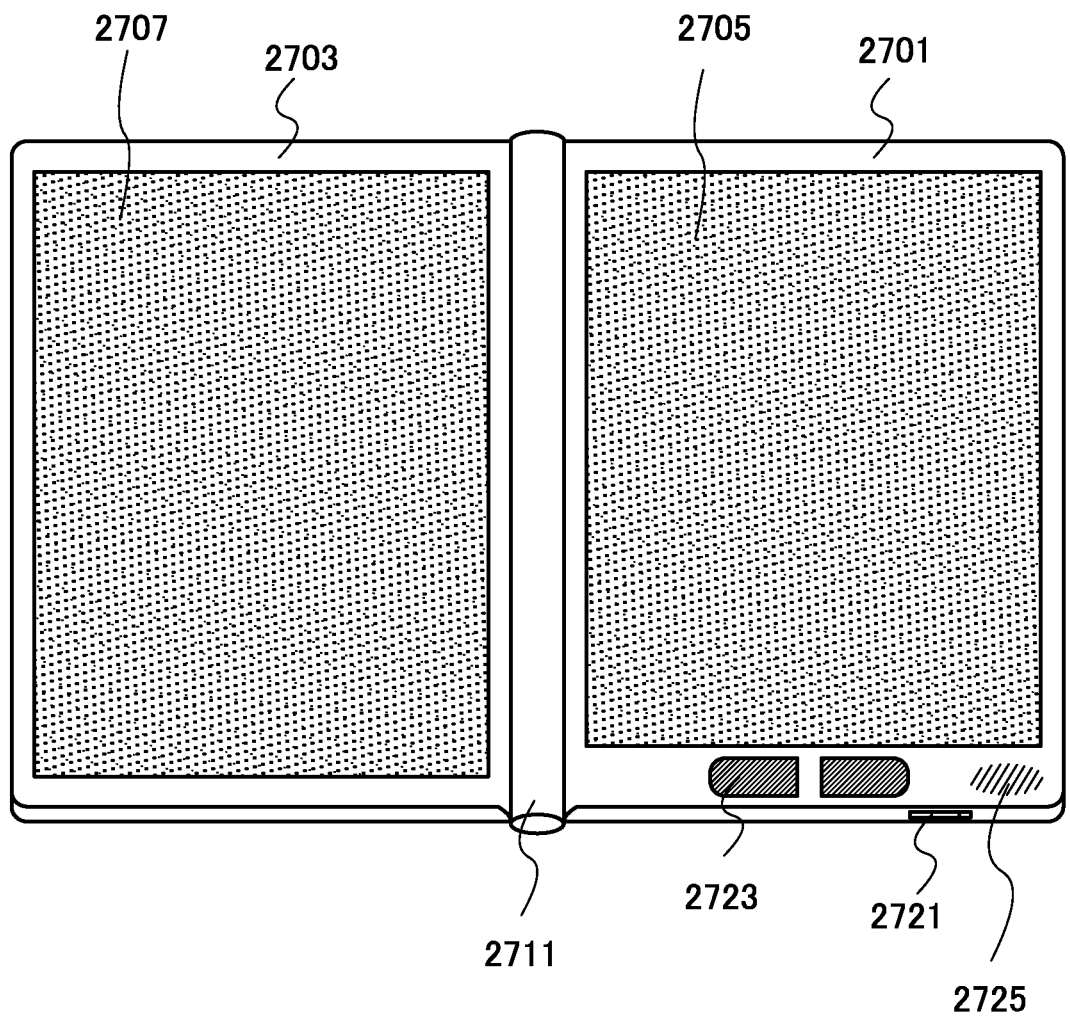
FIG. 25 is a diagram illustrating an electronic appliance to which an embodiment of the present invention is applied.

FIG. 25 illustrates an example of an electronic book 2700. For example, the electronic book 2700 includes two housings, a housing 2701 and a housing 2703. The housing 2701 and the housing 2703 are combined with a hinge 2711 so that the electronic book 2700 can be opened and closed with the hinge 2711 as an axis. With such a structure, the electronic book 2700 can be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 25) can display text and a display portion on the left side (the display portion 2707 in FIG. 25) can display graphics.

FIG. 25 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the surface of the housing, on which the display portion is provided. Further, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the electronic book 2700 may have a function of an electronic dictionary.

The electronic book 2700 may transmit and receive data wirelessly. The structure may be employed in which a desired book data or the like is purchased and downloaded from an electronic book server wirelessly.

Figure 26A:
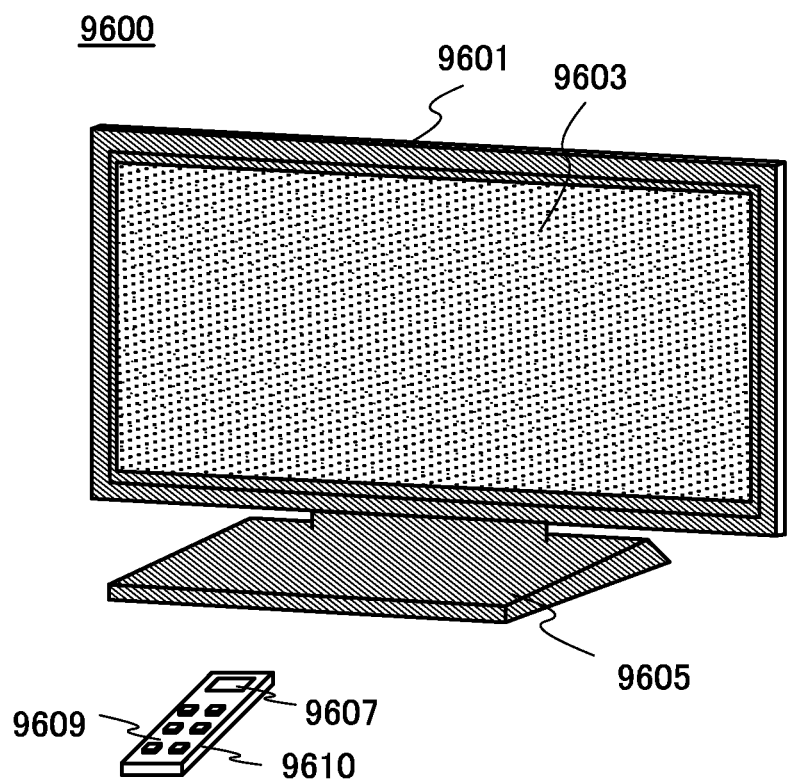
FIGS. 26A and 26B are diagrams each illustrating an electronic appliance to which an embodiment of the present invention is applied.

FIG. 26A illustrates an example of a television set 9600. In the television set 9600, a display portion 9603 is incorporated in a housing 9601. The display portion 9603 can display an image. Further, the housing 9601 is supported by a stand 9605 here. Any of the display devices described in Embodiments 8 to 11 can be applied to the display portion 9603.

The television set 9600 can be operated by an operation switch of the housing 9601 or a separate remote controller 9610. Channels and volume can be controlled by an operation key 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 26B:
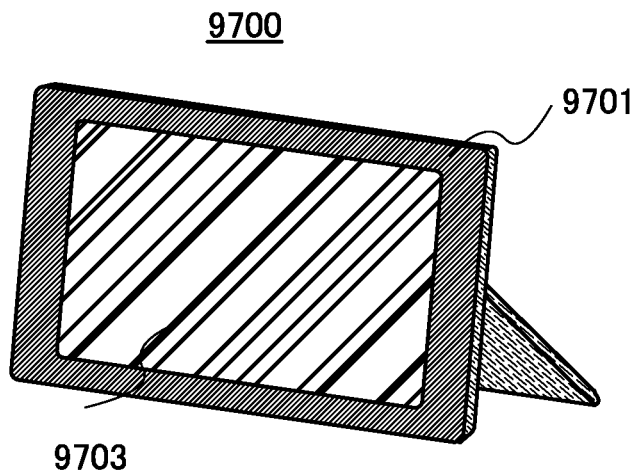

FIG. 26B illustrates an example of a digital photo frame 9700. For example, in the digital photo frame 9700, a display portion 9703 is incorporated in a housing 9701. The display portion 9703 can display various images. For example, the display portion 9703 can display data of an image shot by a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the surface on which the display portion is provided, it is preferable to provide them on the side surface or the back surface for the design of the digital photo frame 9700. For example, a memory storing data of an image shot by a digital camera is inserted in the recording medium insertion portion of the digital photo frame, whereby the image data can be transferred and displayed on the display portion 9703.

The digital photo frame 9700 may transmit and receive data wirelessly. The structure may be employed in which desired image data is transferred wirelessly to be displayed.

Figure 27:
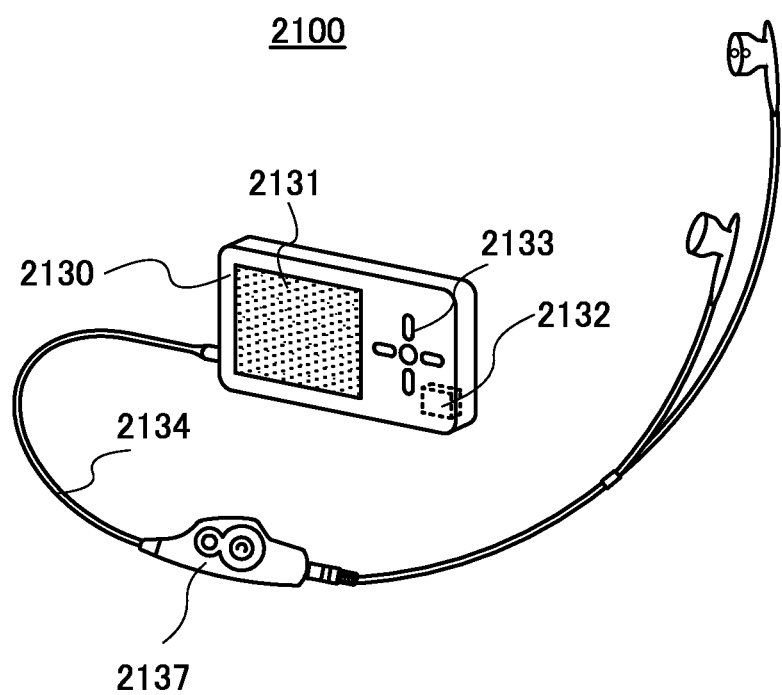
FIG. 27 is a diagram illustrating an electronic appliance to which an embodiment of the present invention is applied.

FIG. 27 illustrates an example of a digital player 2100 that is a portable audio device. The digital player 2100 includes a housing 2130, a display portion 2131, a memory portion 2132, an operation portion 2133, earphones 2134, a control portion 2137, and the like. Note that headphones or wireless earphones may be used instead of the earphones 2134. Any of the display devices described in Embodiments 8 to 11 can be applied to the display portion 2131.

Further, images and sounds (music) can be recorded and reproduced with the use of the memory portion 2132 by operating the operation portion 2133. Note that power consumption of the display portion 2131 can be suppressed through display of white text on black background. Note that a memory provided in the memory portion 2132 may be removable.

Figure 28:
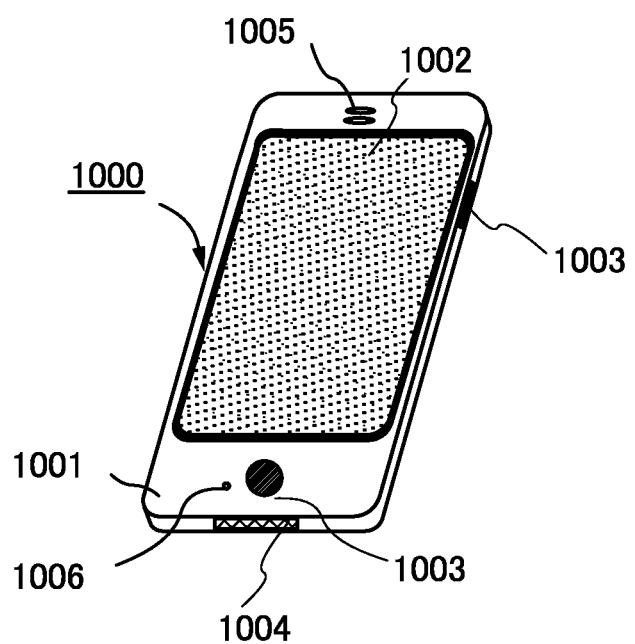
FIG. 28 is a diagram illustrating an electronic appliance to which an embodiment of the present invention is applied.
Figure 29:
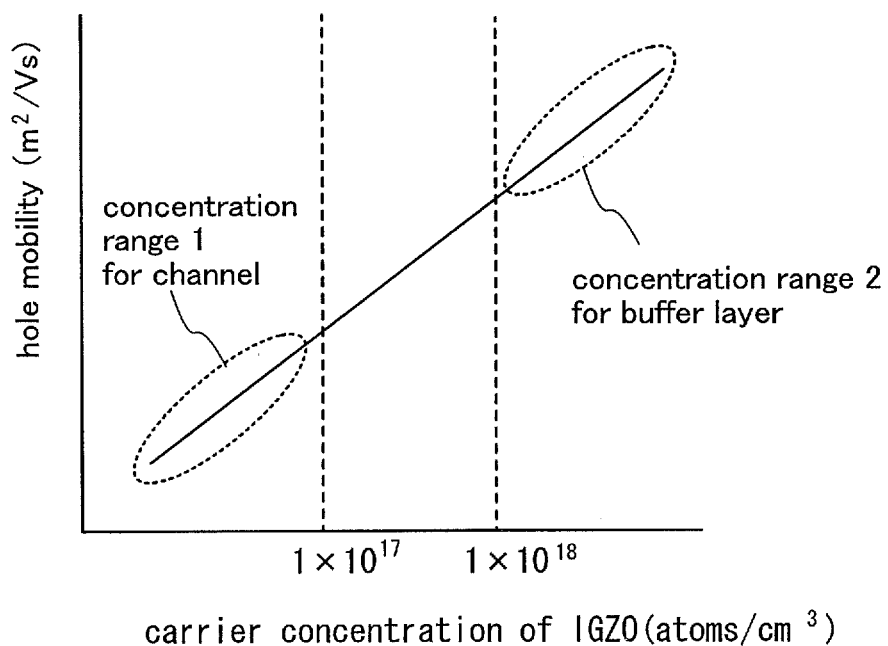
FIG. 29 is a graph showing a relation between a carrier concentration and hole mobility.

FIG. 28 illustrates an example of a mobile phone handset 1000. The mobile phone handset 1000 is provided with a display portion 1002 incorporated in a housing 1001, an operation button 1003, an external connection port 1004, a speaker 1005, a microphone 1006, and the like. Any of the display devices described in Embodiments 8 to 11 can be applied to the display portion 1002.

When the display portion 1002 of the mobile phone 1000 illustrated in FIG. 28 is touched with a finger or the like, data can be input into the mobile phone 1000. Further, operations such as making calls and composing mails can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be inputted. In that case, it is preferable to display a keyboard or number buttons on almost all area of the screen of the display portion 1002.

When a detection device including a sensor for detecting inclination, such as a gyroscope or an acceleration sensor, is provided inside the mobile phone 1000, display in the screen of the display portion 1002 can be automatically switched by determining the direction of the mobile phone 1000 (whether the mobile phone 1000 is set horizontally or vertically for a landscape mode or a portrait mode).

The screen modes are switched by touching the display portion 1002 or operating the operation button 1003 of the housing 1001. Alternatively, the screen modes may be switched depending on the kind of the image displayed on the display portion 1002. For example, when a signal of an image displayed on the display portion is the one of moving image data, the screen mode is switched to the display mode. When the signal is the one of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of the palm print, the fingerprint, or the like is taken by touching the display portion 1002 with the palm or the finger, whereby personal authentication can be performed. Further, by providing a backlight or sensing light source emitting a near-infrared light for the display portion, an image of a finger vein, a palm vein, or the like can be taken.

This embodiment can be combined with any of the structures described in the other embodiments as appropriate.

This application is based on Japanese Patent Application serial no. 2008-197137 filed with Japan Patent Office on Jul. 31, 2008, the entire contents of which are hereby incorporated by reference.

What is claimed is:

1. A semiconductor device comprising a transistor, the transistor comprising:
   a gate electrode over a substrate;
   a first insulating film over the gate electrode;
   a second insulating film over the first insulating film;
   a first oxide semiconductor layer over the second insulating film, the first oxide semiconductor layer comprising a channel formation region of the transistor overlapping with the gate electrode;
   a channel protective layer over the channel formation region;
   a first layer over the first oxide semiconductor layer, the first layer containing indium or zinc;
   a second layer over the first layer and the channel protective layer, the second layer containing titanium; and
   a conductive layer over the second layer and the channel protective layer, the conductive layer electrically connected to the first oxide semiconductor layer,
   wherein a first top edge of the second layer is projected from a first bottom edge of the conductive layer, and
   wherein a second top edge opposite to the first top edge of the second layer is projected from a second bottom edge opposite to the first bottom edge of the conductive layer.

2. The semiconductor device according to claim 1,
wherein the channel protective layer includes a halogen element, and
wherein the halogen element is one of fluorine and chlorine.

3. The semiconductor device according to claim 2, wherein a concentration of the halogen element is greater than or equal to $1\times10^{15}$ cm$^{-3}$ and less than or equal to $1\times10^{20}$ cm$^{-3}$.

4. The semiconductor device according to claim 1,
wherein the first insulating film is a silicon nitride film, and
wherein the second insulating film is a silicon oxide film.

5. The semiconductor device according to claim 1, wherein the semiconductor device is selected from the group consisting of an electronic book, a television set, a digital photo frame, and a mobile phone.

6. A semiconductor device comprising a transistor, the transistor comprising:
a gate electrode over a substrate;
a first insulating film over the gate electrode;
a second insulating film over the first insulating film;
a first oxide semiconductor layer over the second insulating film, the first oxide semiconductor layer comprising a channel formation region of the transistor overlapping with the gate electrode;
a channel protective layer over the channel formation region;
a first layer over the first oxide semiconductor layer, the first layer containing indium or zinc and having a first carrier concentration;
a second layer over the first layer and the channel protective layer, the second layer containing titanium and having a second carrier concentration; and
a conductive layer over the second layer and the channel protective layer, the conductive layer electrically connected to the first oxide semiconductor layer,
wherein a first top edge of the second layer is projected from a first bottom edge of the conductive layer,
wherein a second top edge opposite to the first top edge of the second layer is projected from a second bottom edge opposite to the first bottom edge of the conductive layer, and
wherein the second carrier concentration is higher than the first carrier concentration.

7. The semiconductor device according to claim 6,
wherein the channel protective layer includes a halogen element, and
wherein the halogen element is one of fluorine and chlorine.

8. The semiconductor device according to claim 7, wherein a concentration of the halogen element is greater than or equal to $1\times10^{15}$ cm$^{-3}$ and less than or equal to $1\times10^{20}$ cm$^{-3}$.

9. The semiconductor device according to claim 6,
wherein the first insulating film is a silicon nitride film, and
wherein the second insulating film is a silicon oxide film.

10. The semiconductor device according to claim 6, wherein the semiconductor device is selected from the group consisting of an electronic book, a television set, a digital photo frame, and a mobile phone.

11. A semiconductor device comprising a transistor, the transistor comprising:
a gate electrode over a substrate;
a first insulating film over the gate electrode;
a second insulating film over the first insulating film;
a first oxide semiconductor layer over the second insulating film, the first oxide semiconductor layer comprising a channel formation region of the transistor overlapping with the gate electrode;
a channel protective layer over the channel formation region;
a first layer containing titanium over the channel protective layer; and
a conductive layer over the first layer and the channel protective layer, the conductive layer electrically connected to the first oxide semiconductor layer,
wherein a first top edge of the first layer is projected from a first bottom edge of the conductive layer, and
wherein a second top edge opposite to the first top edge of the first layer is projected from a second bottom edge opposite to the first bottom edge of the conductive layer.

12. The semiconductor device according to claim 11,
wherein the channel protective layer includes a halogen element, and
wherein the halogen element is one of fluorine and chlorine.

13. The semiconductor device according to claim 12, wherein a concentration of the halogen element is greater than or equal to $1\times10^{15}$ cm$^{-3}$ and less than or equal to $1\times10^{20}$ cm$^{-3}$.

14. The semiconductor device according to claim 11,
wherein the first insulating film is a silicon nitride film, and
wherein the second insulating film is a silicon oxide film.

15. The semiconductor device according to claim 11, wherein the semiconductor device is selected from the group consisting of an electronic book, a television set, a digital photo frame, and a mobile phone.

* * * * *